United States Patent [19]

Smith et al.

[11] Patent Number: 4,675,575
[45] Date of Patent: Jun. 23, 1987

[54] LIGHT-EMITTING DIODE ASSEMBLIES AND SYSTEMS THEREFORE

[75] Inventors: Elmer L. Smith, Scottsdale; Gerold E. McLarty, Phoenix; Geraldine L. Smith, Scottsdale, all of Ariz.

[73] Assignee: E & G Enterprises, Scottsdale, Ariz.

[21] Appl. No.: 630,422

[22] Filed: Jul. 13, 1984

[51] Int. Cl.$^4$ ............................................. H05B 37/00
[52] U.S. Cl. ................................ 315/185 S; 250/552; 250/553; 313/110; 313/498
[58] Field of Search ................ 313/498, 110; 250/552, 250/553; 315/185 S

[56] References Cited

U.S. PATENT DOCUMENTS

| | | | |
|---|---|---|---|
| 1,974,472 | 9/1934 | Seghers | 315/185 S |
| 3,188,512 | 6/1965 | Moore | 313/110 |
| 3,462,632 | 8/1969 | Russi | 313/110 |
| 3,596,136 | 7/1971 | Fischer | 250/552 |
| 3,780,357 | 12/1973 | Haltz | 313/498 |
| 3,834,883 | 9/1974 | Klein | 313/499 |

FOREIGN PATENT DOCUMENTS 55-127084  1/1980  Japan ............................. 315/185 R

*Primary Examiner*—Harold Dixon
*Attorney, Agent, or Firm*—Charles P. Padgett, Jr.

[57] ABSTRACT

A light string system is provided having a plurality of mono-color or bi-color light-emitting diodes electrically connected thereto. Each light-emitting diode has a generally elongated, hollow envelope mounted thereover, and the envelope is substantially filled with light-conducting optical spheres or even fragments. The envelope may be additionally filled with light-conducting epoxy, light-conducting liquid or light-conducting gas and sealed for improved light transmission and dispersion characteristics. The light-emitting diodes may include an improved base with light-emitting diode leads disposed approximately perpendicular to the axis of the envelope for bulb stability and for enabling the bulb to stand upright on the branches. Both the envelope and the optical spheres include light-conducting glass or plastic material. The spheres may be either hollow or spherical and may be of a uniform or a mixed size. Additionally, the balls may be large for stacking in single file within the envelope or centrifuged to the sides of the envelope with the center devoid of spheres. The light-emitting diodes may be adapted for use as Christmas tree strings and various AC and DC control circuits are provided for driving the light-emitting diodes, for blinking effects, for alternating between two colors, for alternating between three colors, for improving the length of the string and uniformity of intensity of illumination and the like. In a preferred embodiment of the Christmas tree string of lights, a master trunk line and a plurality of limb lines are provided. The limb lines plug into or connect to predetermined locations along the master trunk line for ease of assembly, replacement and the like. This string uses a series—parallel configuration wherein the upper and lower portion of the master trunk line and the individual light-emitting diodes within each limb line are connected in series while the limb line sets are connected in parallel with each other for enabling more lights to be illuminated with less power, for increasing the uniformity of illumination along the length of the string, and for minimizing light outage due to bulb burnout.

188 Claims, 49 Drawing Figures

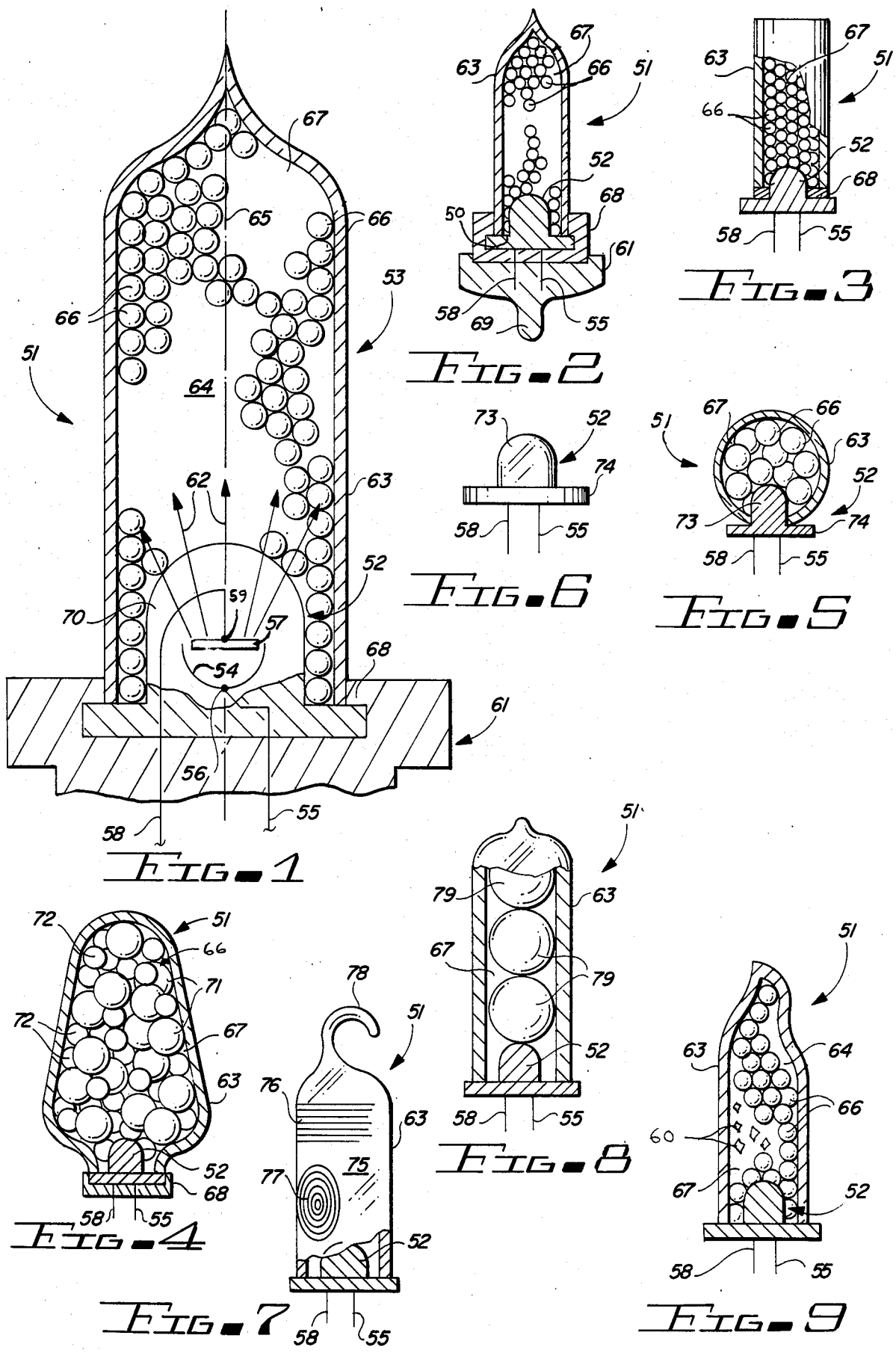

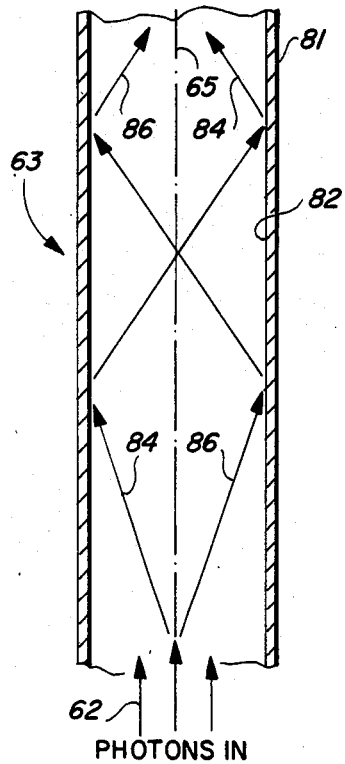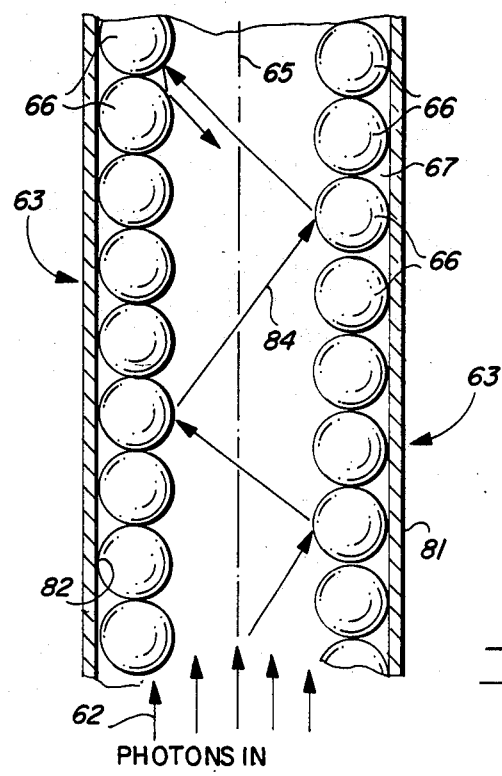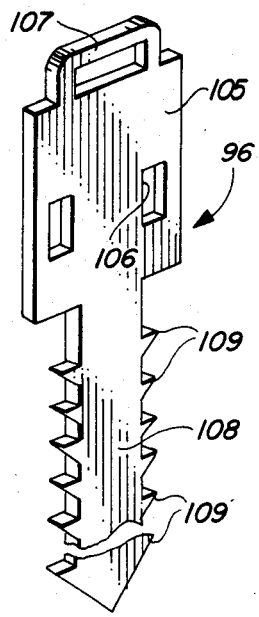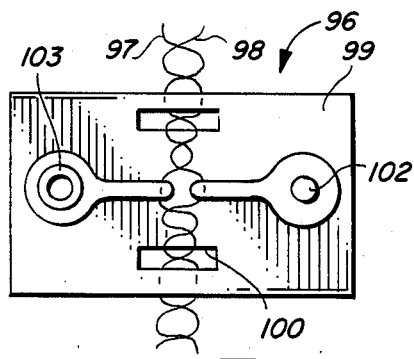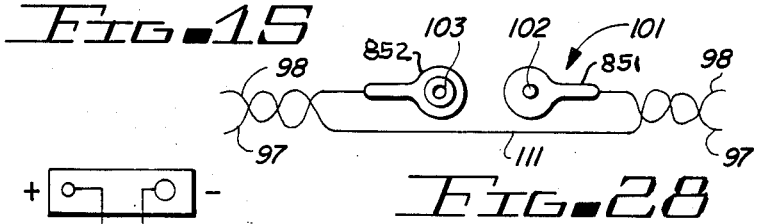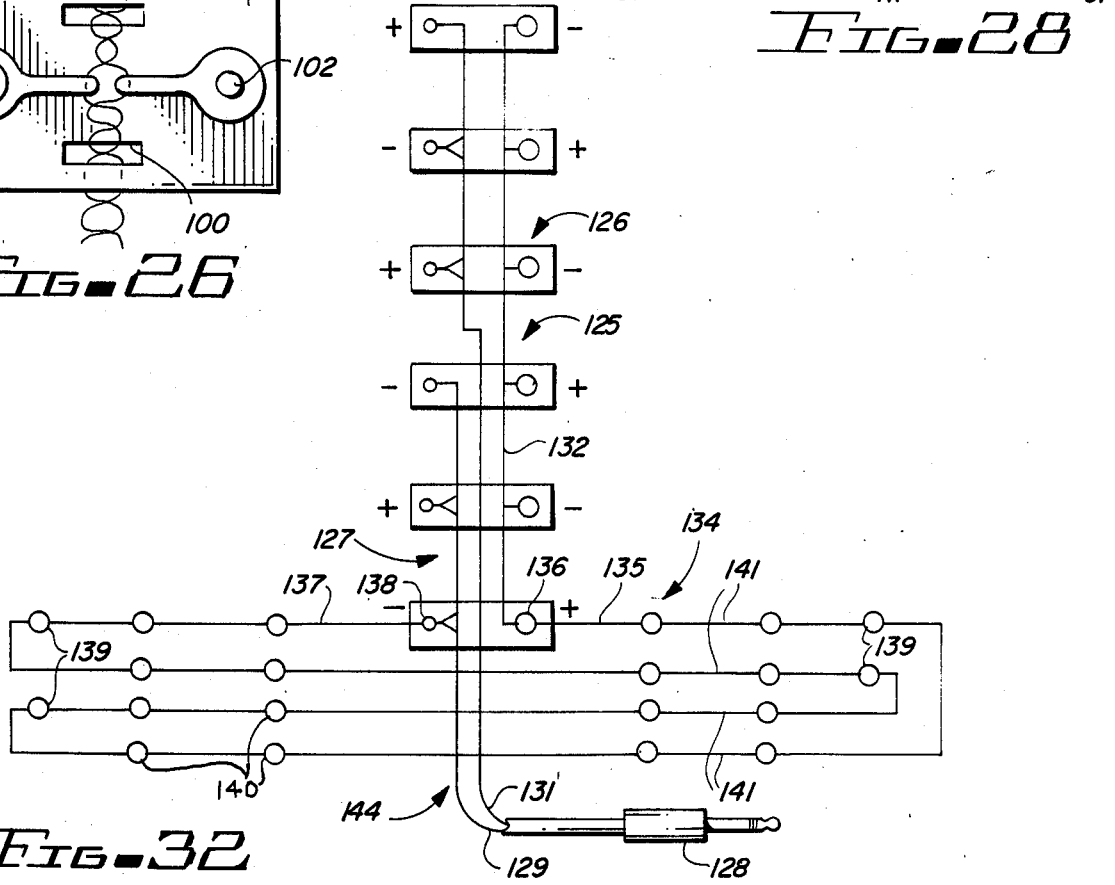

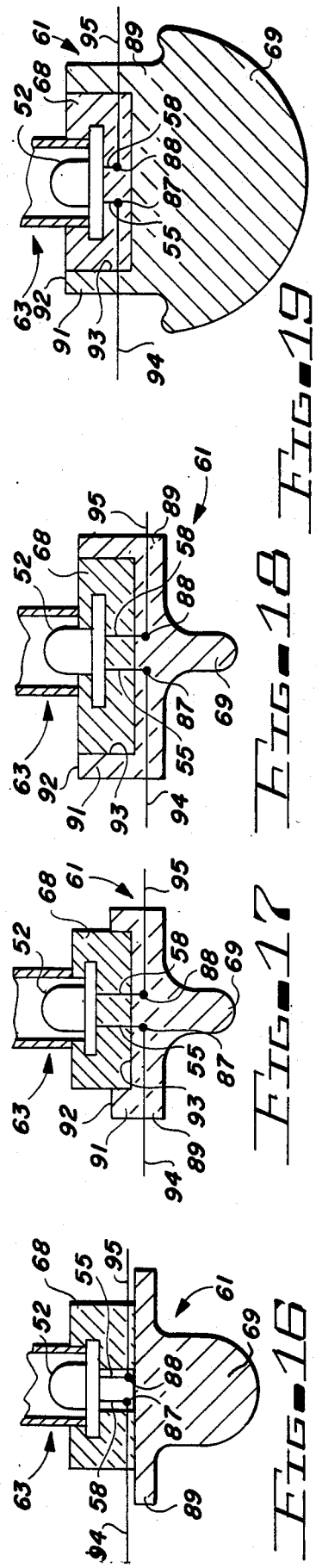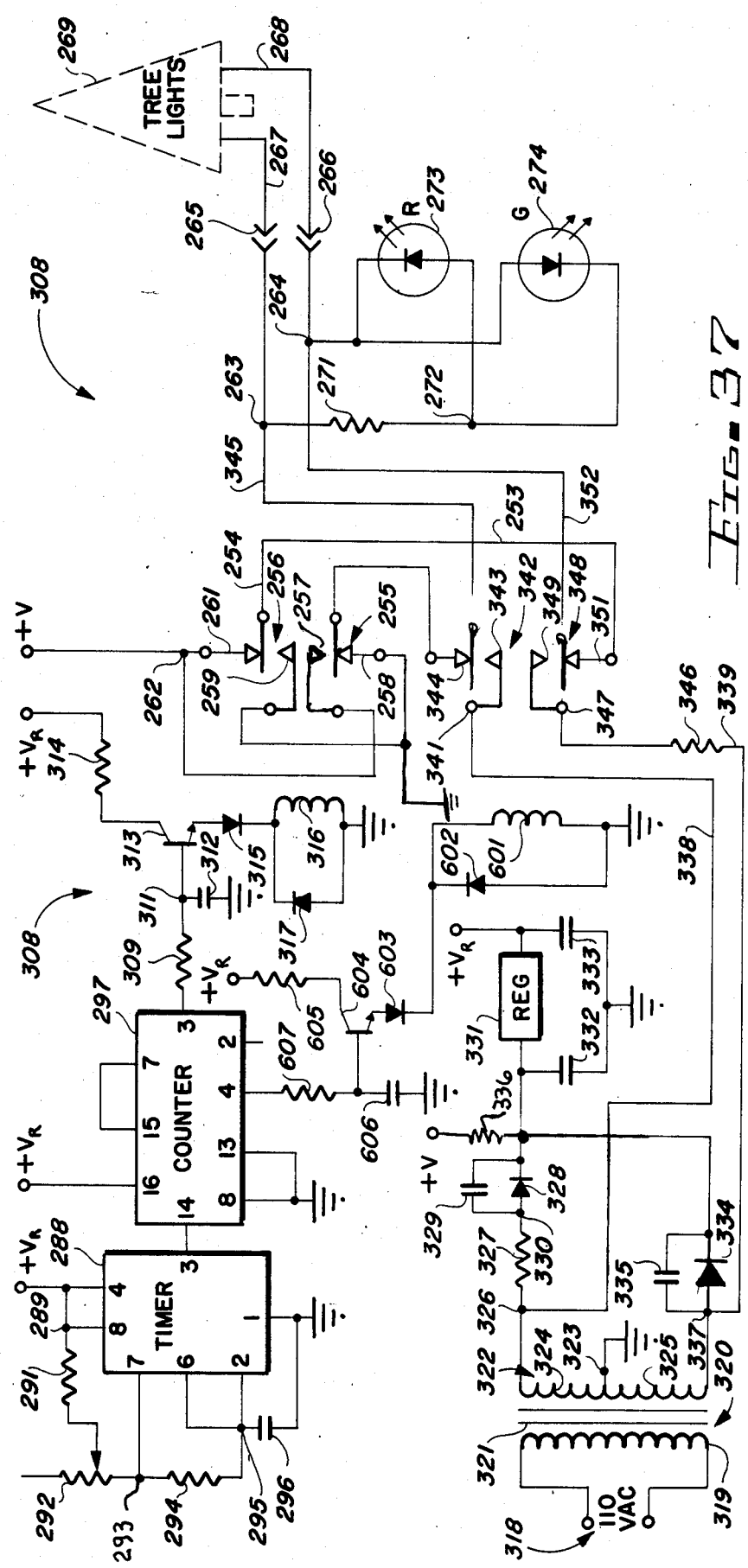

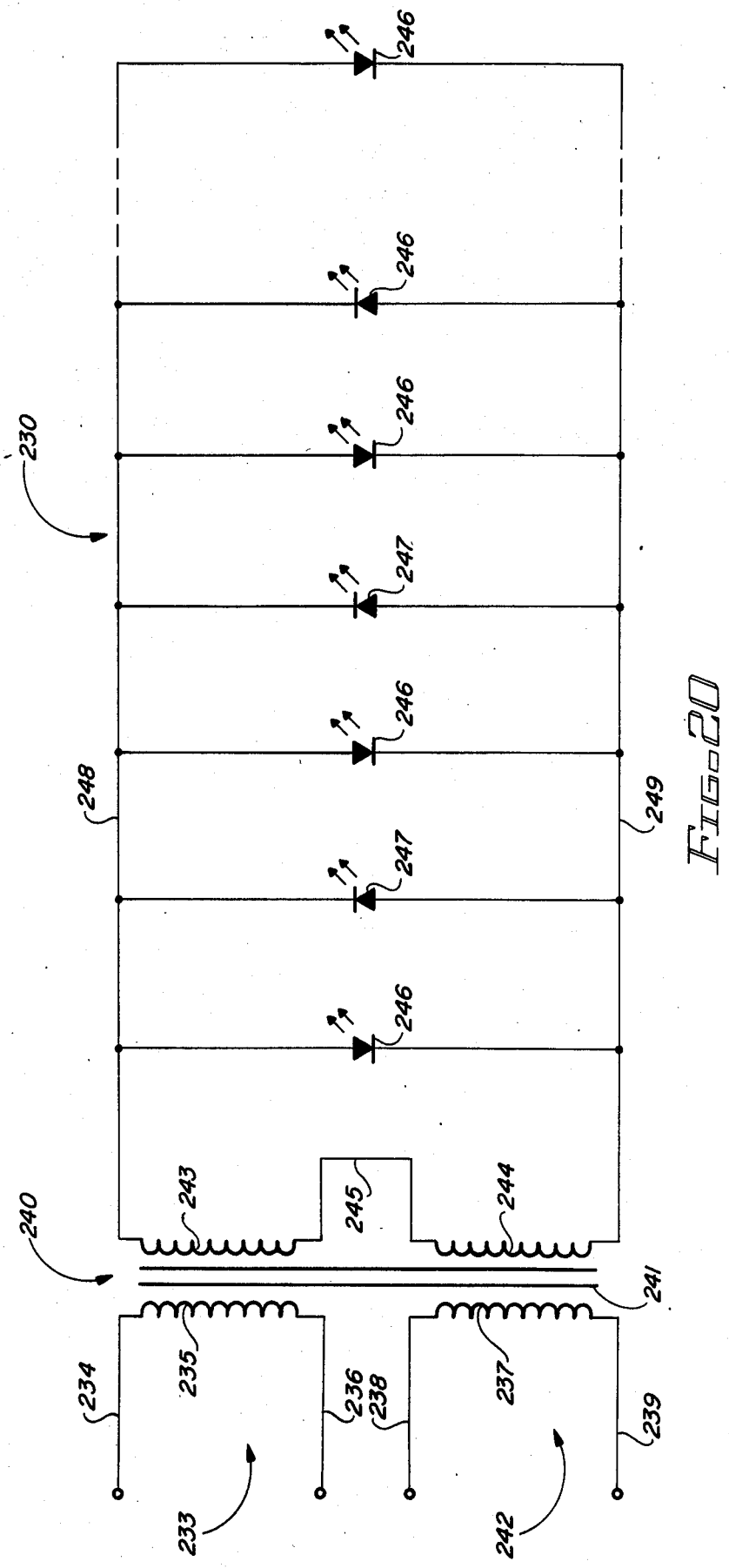

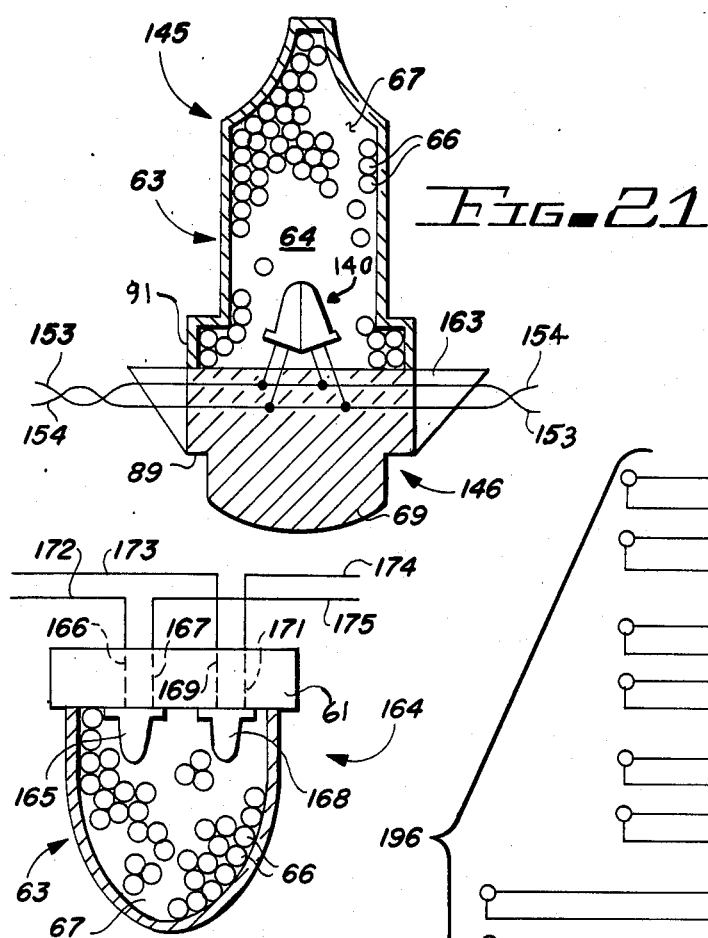
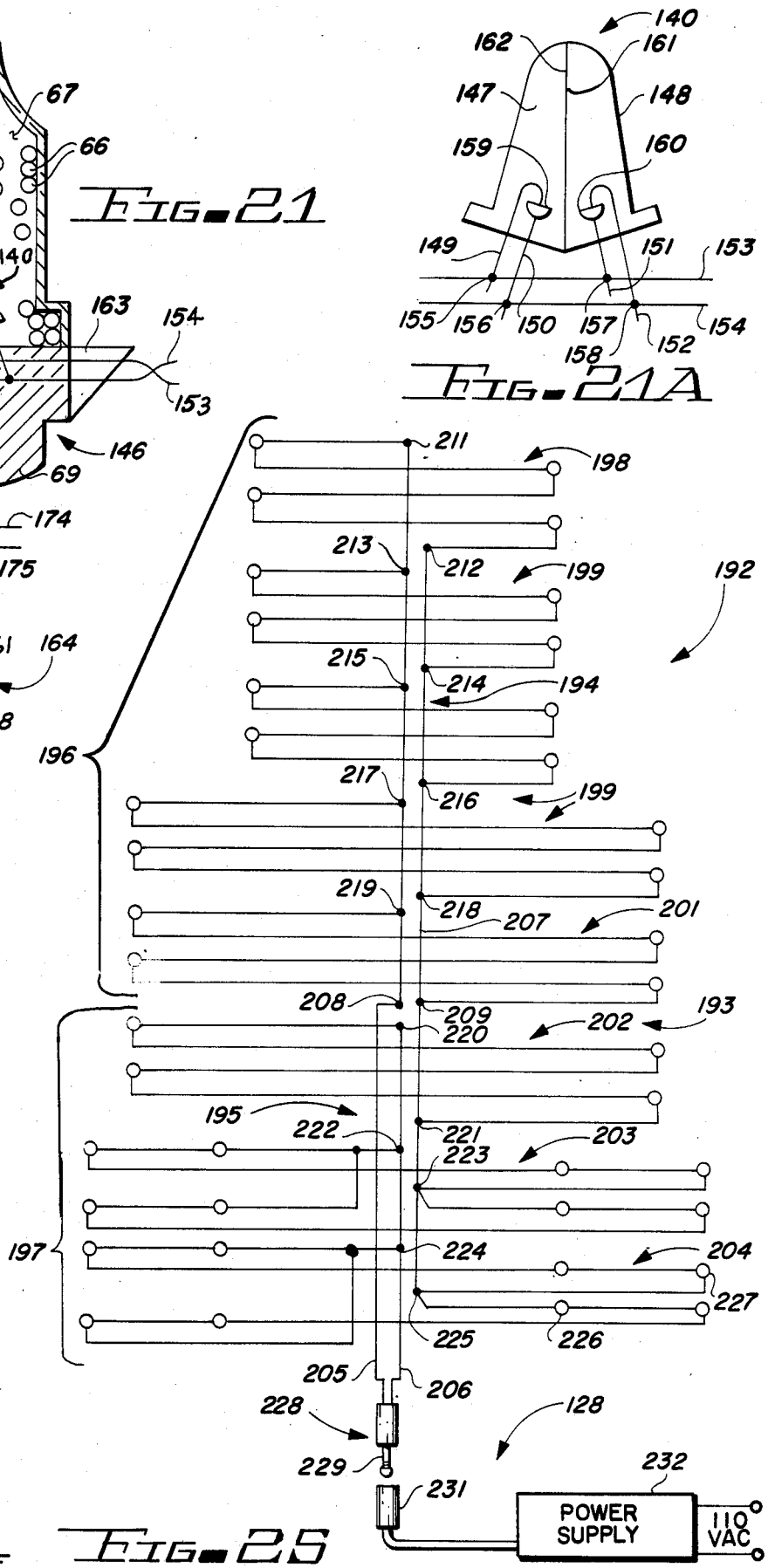
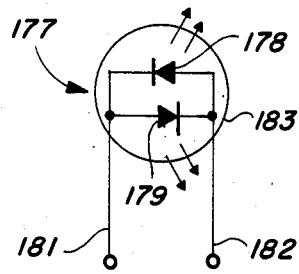
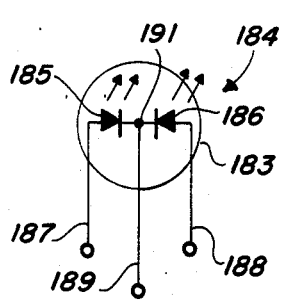

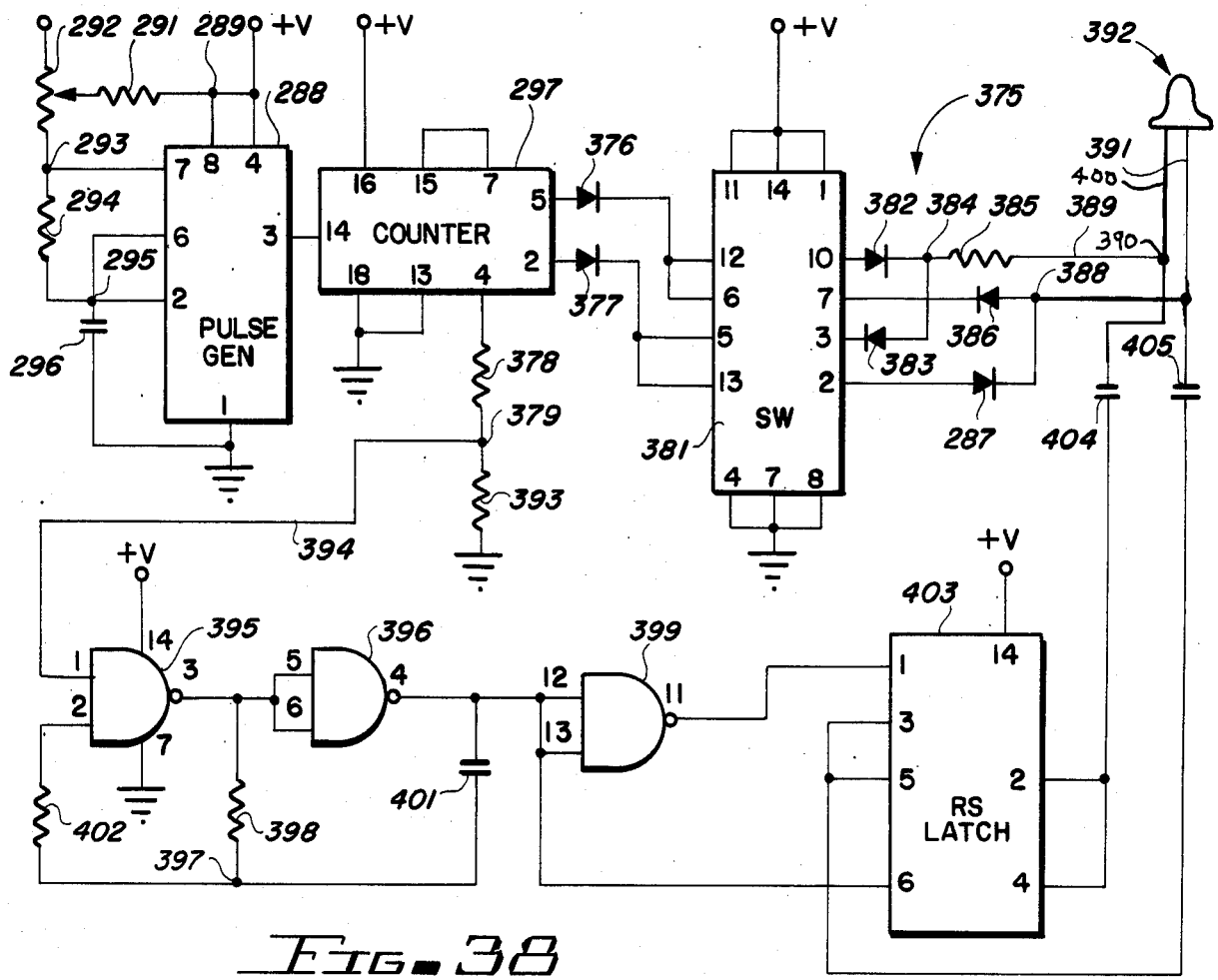
Fig. 38
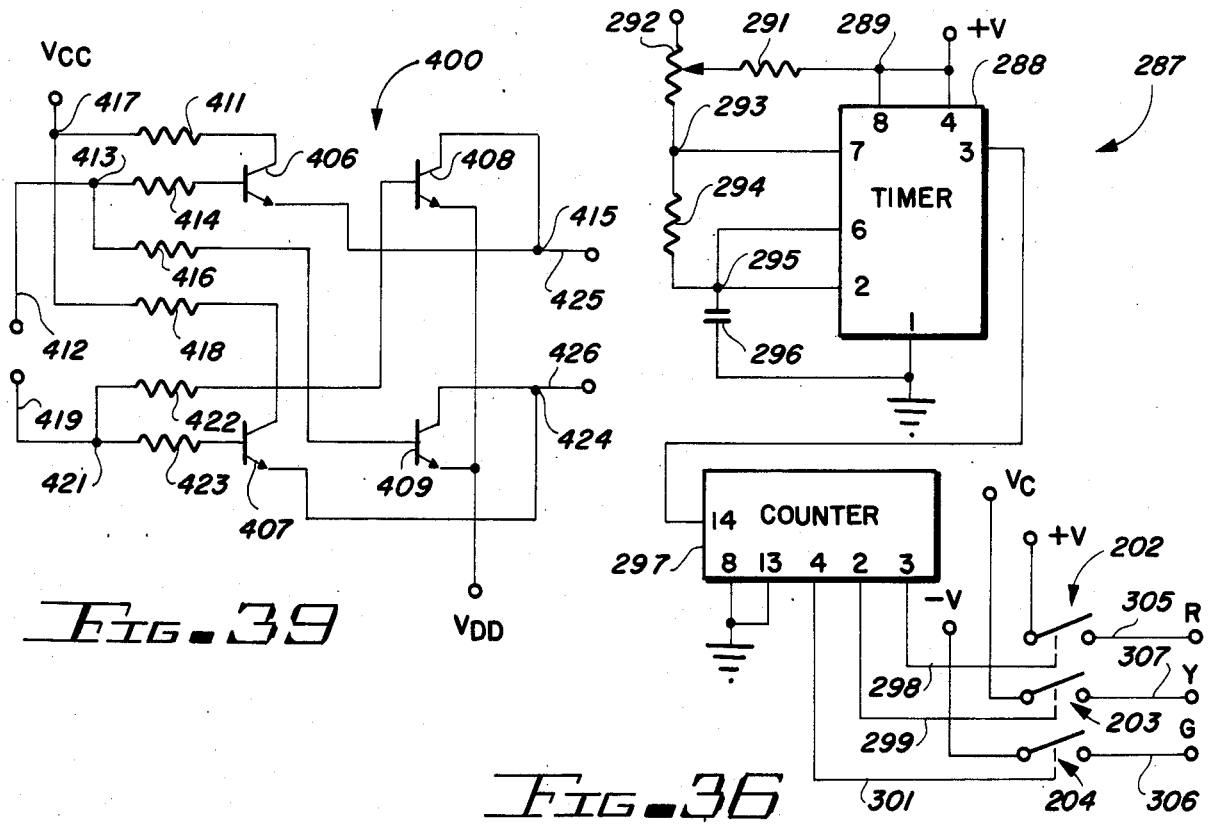
Fig. 39
Fig. 36

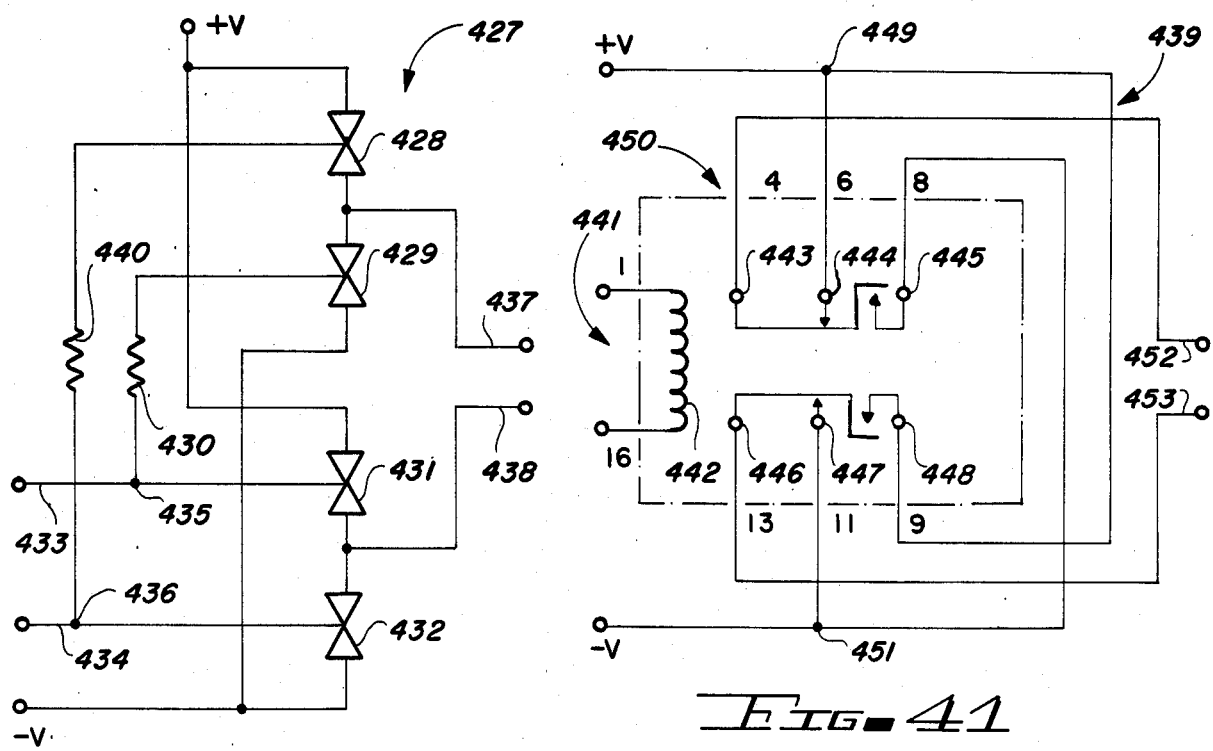
FIG-40
FIG-41
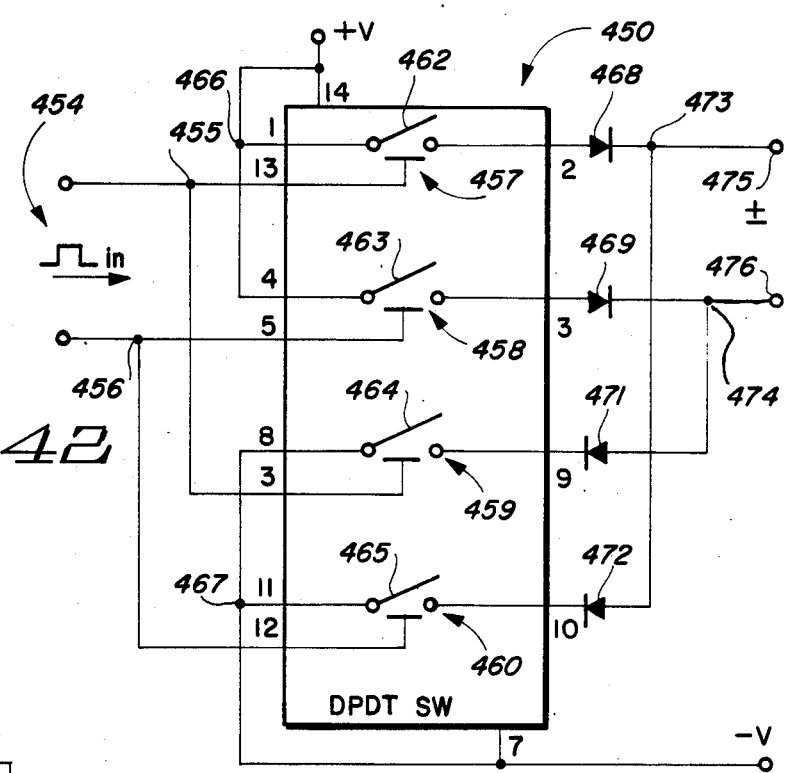
FIG-42
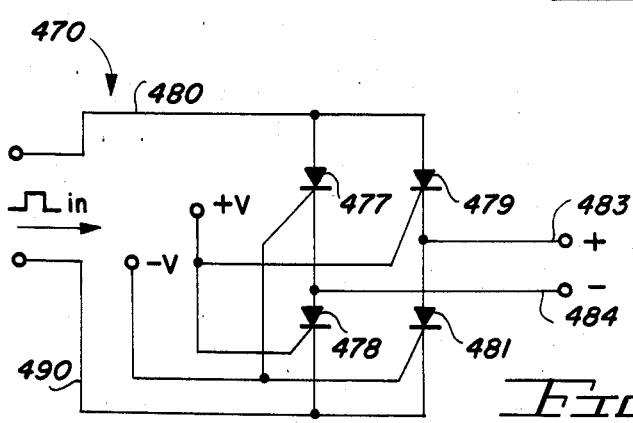
FIG-43

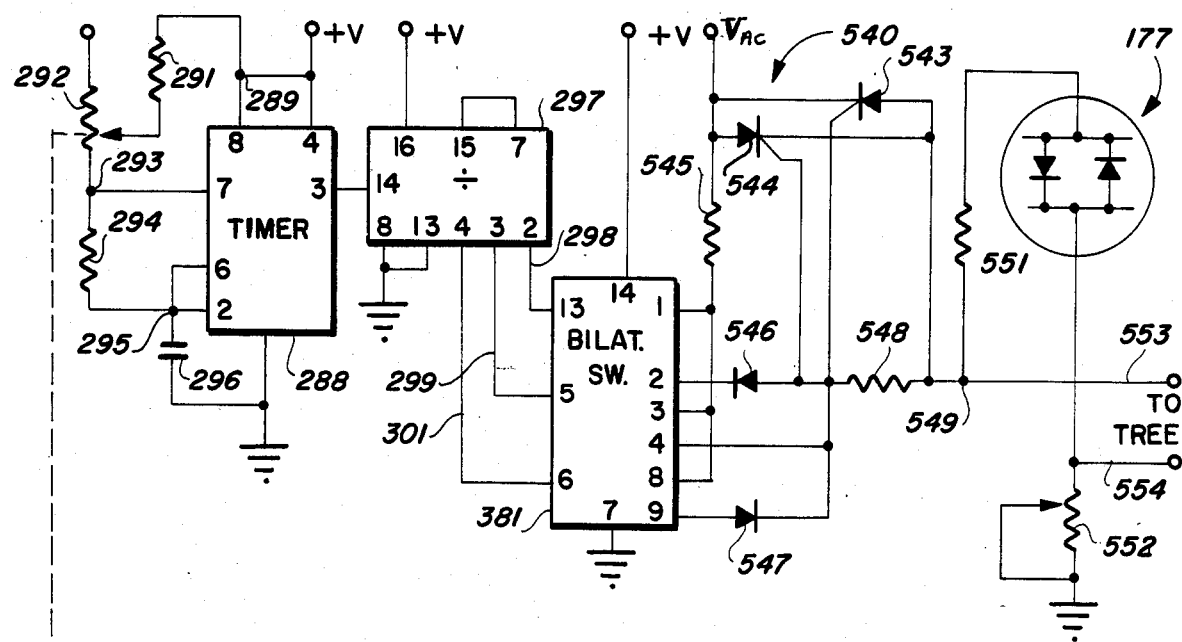
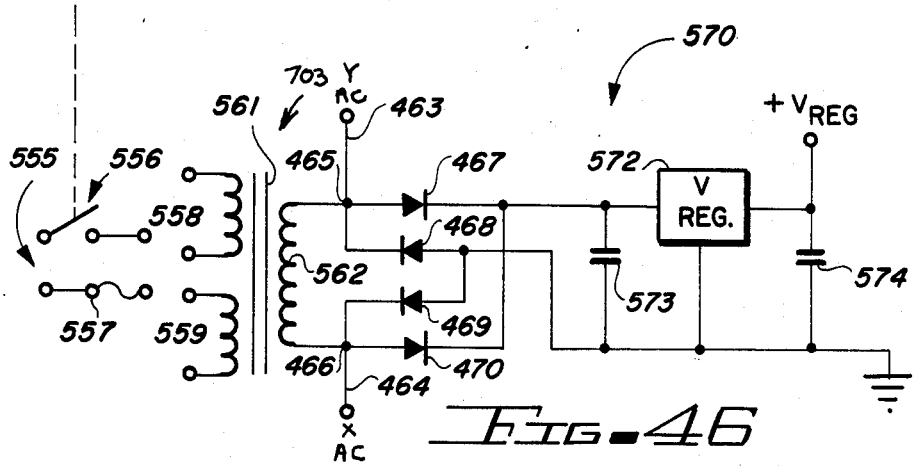
Fig-46
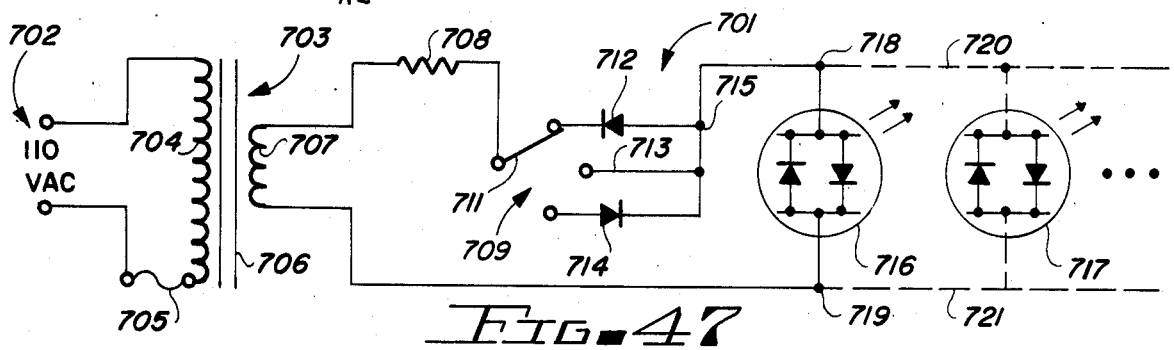
Fig-47
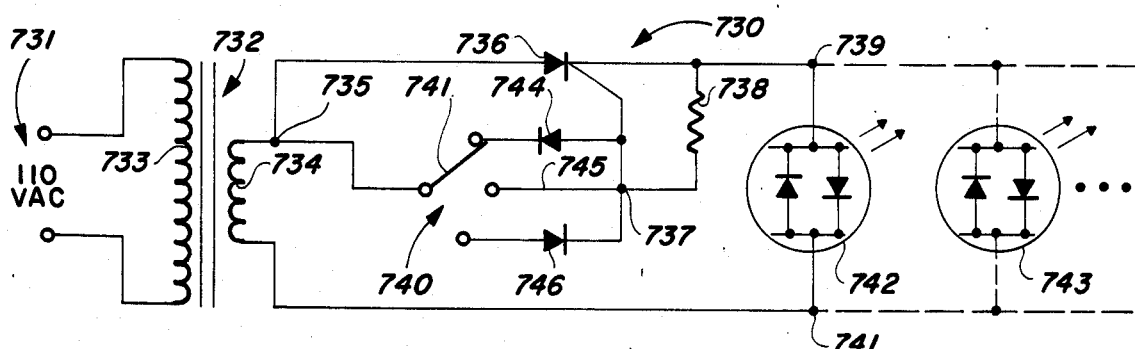
Fig-48

LIGHT-EMITTING DIODE ASSEMBLIES AND SYSTEMS THEREFORE

BACKGROUND OF THE INVENTION

1. Field of the Invention

The present invention relates generally to lighting systems and more particularly to light bulb assemblies incorporating either mono-color or bi-color light-emitting diodes and having improved light-conducting and dispersion characteristics and to various wiring arrangements, light-emitting diode light strings, ornaments, decorations and control circuitry therefore.

2. Description of the Prior Art

Many types of lighting systems are commercially available in the prior art and have been since the time of Edison. The primary light bulb in use today is the standard incandescent light bulb which comes in a variety of sizes and shapes and is adapted for many different and diverse uses. The primary shortcomings of the standard incandescent light bulb include the fact that it consumes very significant amounts of electrical power; it has a relatively short life due to frequent burnout, breakage, and the like; it dissipates a tremendous amount of heat which can burn a persons hands or otherwise injure person, pets or property. The incandescent light bulbs in use today present significant fire hazards in many uses, both from heat and from short circuits. Additionally, these bulbs have very slow switching speeds; they come in white only; and they break quite easily causing frequent replacement even for those bulbs placed in hard-to-reach areas where replacement is extremely time consuming and results in greatly increased expense.

For the last two decades, since the first miniature Christmas tree light came over from Italy, miniature Christmas tree bulbs and strings of such bulbs have been available commercially, particularly during the Christmas season. While these miniature light bulbs represent a significant improvement over the standard or larger incandescent light bulbs, they are subject to the same problems although usually to a lesser extent. While less power is consumed, less heat generated, and less of a fire hazard presented; but the power problem, and the heat and fire hazards are still very significant. Furthermore, even the miniature light bulbs or mini-lights have reduced switching times and come in white only. To obtain colors for decorative purposes and the like tinted bulbs are used over the incandescent light source. These bulbs break quite easily and are generally poorly constructed so that continued movement of the light strings during assembly, disassembly, storing etc. often results in the light bulb portion being separated or broken from the base, bulb breakage, or broken lead wires and sockets. They're relatively unreliable and since they are often wired in series, the loss of a single bulb through burnout or breakage results in loss of the entire string or string series segment. Such bulbs have been configured to light in a blinking or on-off manner or to light sequentially over a few colors but only relatively short strings can be used efficiently and DC power supplies and batteries which lend portability and the like cannot be readily used without significant loss of intensity down the string.

Since the light strings using miniature incandescent Christmas tree bulbs are usually single piece strings or string segments wired in series they must be connected end to end to reach around a Christmas tree or for use in Christmas decorations and the like. Again, if a single bulb burns out, the entire string is often lost. Therefore, parallel connections for multiple strings is used resulting in many awkward and unsightly pairs of wires. Additionally, the miniature light bulb strings are extremely difficult to run or wind down the trunk of the tree since bending often causes electrical shorts or breaks in the wire, they are difficult to assemble on the branches since they turn in all directions, usually upside down on the limbs.

Again the length of the strings is limited for a given power input without a loss of intensity down the string; and connections are made through standard plug and socket connections which are large, unsightly, difficult to make, and cause the inner end portion of the strings to sag down and be readily visible from outside the tree. The bases of the incandescent bulbs are adapted to position the bulb leads downward for connection to the wire so that the bulbs are positioned in all directions depending on the particular twist in the wire at the location in which the bulb is placed. Additionally, since the wire is usually pulled out to position the bulb away from the axis of the wire, the bulb rotates from its own weight and sags down rather than up as desired on typical Christmas tree applications.

The present invention provides an improved light-emitting diode bulb assembly and various light string and wiring configurations and control circuitry therefore for solving substantially all of the problems of the prior art and providing many unique advantages thereover.

SUMMARY OF THE INVENTION

Accordingly, it is an object of the present invention to provide a light bulb assembly or construction which has a relatively long life; which does not readily burn out, break, short circuit, or come apart from the base; which comes in both mono-color and bi-color light sources; which generates very little heat to greatly reduce burn injury to person or property; which consumes very little power for high energy efficiency; which has greatly enhanced light-conduction and dispersion characteristics; which can be made significantly smaller than any miniature incandescent lamp of the prior art for decorative purposes and the like; which substantially eliminates any potential fire hazard and the like from excessive heat or short circuits; which enables light strings to be made considerably longer without loss of intensity along the string; which is truly asthetic rather than unsightly; which can be driven from AC sources, DC power supplies or batteries; which can be switched extremely fast due to the solid state nature of the light-emitting diodes for operation in the blinking mode, switching mode, or any of various types of sequencing modes.

It is another object of the present invention to provide a miniature light bulb assembly utilizing a light-emitting diode as a light source and having an envelope about the diode for resembling the recognizable appearance of the miniature incandescent tree light or any other desired Christmas light bulb shape.

It is a further object of the present invention to place light-conducting glass or plastic optical spheres or balls, or even relatively uniform crystal-like configurations or geometric shapes, within the envelope of light bulbs to increase the light transmission and dispersion characteristics thereof and improve the visibility of the bulb.

It is still another object of the present invention to provide different types, materials, sizes, and configurations of optical spheres within the various envelopes for various improved dispersion characteristics.

It is yet another object of the present invention to provide at least one of a light-conducting epoxy means or the like, a light-conducting liquid, and a light-conducting gas within the envelope and sealed therein for further increasing the light-conducting, light-dispersion and appearance or aesthetic characteristics of the bulb.

It is still another object of the present invention to provide relatively long or short light strings having any reasonable desired number of light-emitting diodes therealong without loss of intensity of the light down the string.

It is a further object of the present invention to provide single color or multi-color light strings wherein the colors may be alternated, blinked, sequenced in any desired manner, or the like.

It is still a further object of the present invention to provide a base construction for the light-emitting diode bulb assemblies wherein the diode leads are disposed approximately perpendicular to the axis of the bulb and through or adjacent to the base for stabilizing the bulb and permitting it to remain upright on the Christmas tree branches for decorative purposes.

It is another object of the present invention to provide a further decreased hazard of fire due to the extremely low voltage used to power the light-emitting diode strings since fire due to defective wiring is eliminated and due to excessive heat generated by the bulbs.

It is still a further object to provide extremely low energy consumption which is normally at least 1/10 of that of the conventional miniature incandescent Christmas tree bulbs making the bulbs virtually impossible to turn out so that they hardly ever need replacement and greatly increasing the life of the light-emitting diode light sets or strings and enabling the useful life to be measured in terms of multiple years rather than hours as with current light sets.

It is still another object of the present invention to provide an improved Christmas tree light set which presents substantially no danger from electricity or heat dissipation to infants, toddlers, children or pets playing with or otherwise contacting the bulbs or wires.

It is a further object to provide a light string assembly having no readily visible or unsightly wires or plugs showing.

It is still a further object of the present invention to provide a unique series-parallel light string arrangement involving the use of a master trunk line and a plurality of limb line sets which can be physically and electrically connected at predetermined vertical locations along the master trunk line to enable the easy connecting and disconnecting of relatively horizontal limb lines for quick and easy assembly, maintenance, replacement, and the like while insuring that all lights have a substantially equal intensity at any position along the strings.

It is yet a further object of the present invention to provide an improved light string which can be operated with greatly reduced power while insuring uniform light intensity along the string and while minimizing the need for replacing string segments due to burnout or the like.

It is a further object of the present invention to provide an improved light string wherein the master trunk line lays against or around the trunk of the tree and the individual lights of the limb lines lie relatively flat on the branches with LED's erect rather than in a random or upside-down direction as in the prior art.

It is another object of the present invention to provide an increased brightness, greater visibility, and enhance light dispersion from the LED bulbs due to the use of super bright light-emitting diodes and/or to the use of the spherical glass balls or other geometric shapes within the bulbs and due to the epoxy, liquid or gas, alone or surrounding the balls.

It is a further object of this invention to provide a light string of any desired reasonable length which can be used both indoors or outdoors since it is totally waterproof and presents no shock hazard.

It is still another object of the present invention to provide an improved LED light string which may be constantly illuminated due to its low energy consumption while presenting no danger of fires and the like thereby making burglars and the like think that somebody is home at all times.

It is a further object of this invention to provide bi-color or other multi-color light-emitting diodes that can be used with simple low cost switching circuits so that each bulb can produce three separate and distinct characteristic colors in various switching and sequencing arrangements.

It is yet another object of the present invention to provide an improved light string which enables different colors and different strings to be phased or sequenced to simulate different colors or sequences moving around the tree along the branches, or the like.

It is still a further object of this invention to provide a unique snap-on or plug-in branch string or light limb arrangement wherein the limbs are removeably connected and unconnected to the main trunk line to allow greater freedom in positioning lights, in putting lights up and taking them down, and replacing individual branch lines and the like.

It is another object of this invention to provide light strings which can be used with AC, rectified AC, pulsed current, simple DC power supplies or batteries for power so that relatively small table top trees or decorations can be illuminated without electrical plugs, adapters, etc. and relatively long lines for large trees or outside decorations can also be used with equal ease.

It is a further object of the present invention to provide trunk wraps and snap-on limb lines which make setting up and taking down the tree extremely fast, simple, and trouble free; and a system wherein lights may be left on artificial trees during storage without damage, breakage, or blown out bulbs, as desired.

These and other objects and advantages of the present invention will be further described with respect to the brief summary of the invention presented hereinbelow.

The present invention provides a miniature light bulb apparatus or bulb construction for individual use or decorative purposes, for Christmas decorations, for light strings, for decorator light strings, or strings of Christmas tree lights, and the like. The miniature light bulb construction includes a light-emitting diode, either mono-color, bi-color, or other multi-color operably disposed within a substantially elongated, hollow, light-conducting envelope. A plurality of light-conducting glass or plastic optical spheres or balls, or even relatively uniform glass or plastic crystal-like particles or geometric shapes, are placed within the envelope for transmitting and diffusing the light emitted from the light-emitting diode for improved visibility from the side of the bulb.

Furthermore, a light transmitting epoxy means or the like, light-transmitting liquid, or light-transmitting gas is operably disposed within the envelope and about the spheres and sealed therein for maintaining the bulb configuration and aiding in the light-conduction, transmission and dispersion within and through the envelope with light striking the spheres being refracted at approximately 90° to produce a "halo" or ring of light emminating from the side of the sphere which passes out of the bulb for improved brightness and visibility.

In the preferred embodiment of the present invention, the individual miniature light bulb constructions are such that the envelope and optical spheres may include either glass or plastic. The spheres may be substantially optically perfect and may include balls of different sizes or balls having a uniform diameter. The spheres may include relatively large balls having a diameter slightly less than the inside diameter of the envelope to enable the balls to be stacked one upon the other along the axis of the envelope for light-transmission and dispersion characteristics. Lastly, glass or plastic fragments having a relatively uniform crystal-like structure or geometric shape or out-of-spherical beads can also be used although intensity, brightness, and visibility may suffer.

Furthermore, the optical spheres may be tinted but are preferably clear; and the spheres may be translucent but are preferably transparent. The envelope may be made in any desired shape including the shape of the conventional miniature Christmas tree bulb, any conventional full-sized Christmas tree light bulb, or that of a right cylinder, sphere, other geometric shapes or the like and may include a hook on the top portion thereof for hanging the bulb on a tree branch and the like. The spheres may be densely or loosely packed within the envelope or may be centrifuged to the outside surface with the center devoid of balls for further improved dispersion characteristics; or settled on one surface portion, on the opposite surface portion, or on both surface portions.

Alternately, the envelope may be devoid of balls and have a scarred, scored, scratched, or etched surface or it may include a fresnal-type surface for improved light dispersion from the bulb. These envelopes may be filled with a similar epoxy, liquid or gas and may also include balls, etc., if desired.

The invention also contemplates a method of manufacturing a miniature light-emitting diode light bulb comprising the steps of molding an envelope with at least one partially opened end, feeding light-conducting optical spheres into the envelope, adding epoxy, liquid, or air, if desired, (or alternately, mixing the spheres with the epoxy and then filling the envelope with the mixture) inserting the light-emitting diode into the opening and sealing the envelope with the diode leads protruding therefrom.

The present invention also contemplates a bi-color or tristate light-emitting diode apparatus which includes first and second light-emitting diode portions mounted proximate one another and each having a ground surface operatively disposed against the ground surface of the other for establishing a predetermined focal angle for giving the optimum appearance of a single light source or a first and second LED in a single diode package, as commercially, available, for producing three colors from two LED's. The first and second light-emitting diode portions or LED's each have its own different and distinct characteristic color so that two colors can be produced by alternately energizing first one and then the other of the light-emitting diode portions. Furthermore, the two light-emitting diode portions can be energized rapidly and alternatively to produce a combined third different and distinct characteristic color as a combination or mixture of the visible light.

Similarly, the tri-color light-emitting diode apparatus generally includes an envelope which may be filled either loosely or tightly with a plurality of optical spheres or the like. Both the envelope and the spheres may be glass or plastic and the spheres may be hollow or solid, uniform size or mixed size, clear or tinted, translucent or transparent, optically perfect or not, and may be relatively large having a diameter slightly less than the inside diameter of the envelope for stacking one upon the other. Furthermore, the balls may be centrifuged or otherwise disposed along the entire inside surface of the envelope walls with the portion along the central axis of the hollow cavity devoid of spheres for increased light transmission and dispersion properties or settled to one side or opposite sides of the envelope.

Additionally, the envelope may be filled with epoxy, liquid or air and sealed; and various color combinations may be used. For example, if a red light-emitting diode portion and a green light-emitting diode portion are used, the color red, the color green, and the resulting mixture or combination color yellow may be produced by the bulb of the present system. The combinations or resulting third colors follow conventional color combination properties and will not be described in detail herein.

The present invention provides a light string system having a first and second electrical conductor and a plurality of either mono-color, bi-color or multi-color light-emitting diodes electrically connected between the first and second conductors. The plurality of light-emitting diodes is operatable for extremely long periods of time without burning out, require an extremely low amount of electrical power for energy-efficient operation, produce substantially no heat thereby eliminating burn and fire hazards, and enable relatively long strings of lights to be used without loss of intensity down the string, and provide a means for supplying electrical power to the conductors.

The light string system of the present invention includes a unique envelope filled with optical spheres etc, and, if desired, light-conducting epoxy, liquid, or gas as described hereinabove. Furthermore, relatively long or short strings can be provided and using AC, DC, batteries, rectified AC, or pulses can be used for driving and illuminating the light-emitting diodes.

Various types of control circuits are provided for driving the light-emitting diodes or light strings to provide sufficient drive, to provide switching and the like so that a wide variety of sequencing including blinking, alternating between two colors, sequencing between two, three or more colors, sequentially stepping along a string or around the tree and the like, are possible.

The control circuitry may simply utilize stepped-down AC waveform with the positive portion of the waveform driving one set of light-emitting diodes and the negative portion of the AC waveform driving the oppositely poled or reverse polarity configured light-emitting diodes. Furthermore, a control system may be provided which includes timing means for providing clock pulses at a desired sequencing rate, means for generating switching signals and means responsive to the switching signals for sequentially selecting first, second and third colors to be produced and for driving the circuit output for providing the proper illumination. A variable duty cycle control circuit may be added between the switching circuit output and the drivers for selectively controlling the pulse rate, and the duty cycle for providing different pulse durations, as desired, for enabling even very long strings to be driven with even less power by reduced duty cycles, and for enabling the use of higher frequency drive or switching signals.

The present invention also provides a Christmas tree light system, Christmas tree wiring system, or light string set comprising a master trunk line electrical connector adapted to be operatively disposed substantially vertically down the trunk of the Christmas tree. The master trunk line may include an upper trunk line portion electrically connected in series with the lower trunk line portion. The system further includes a plurality of modular limb line sets adapted to be operably disposed substantially horizontally along the limbs of the Christmas tree extending outwardly from the master trunk line. The plurality of modular limb lines or limb line sets includes individual modular sets of light limbs and a plurality of light-emitting diodes, either monocolor, bi-color, or multi-color, and either ground and constructed or purchased OEM, with or without epoxy and with or without spheres or the like operably disposed along the length of the light limbs and electrically connected thereto in a series path at predetermined selected intervals therealong.

A source of electrical power is provided, and means for removeably electrically connecting the upper and lower trunk portions to the source of electrical power for lighting the LED's is also provided. Means for selectively removeably connecting and unconnecting individual ones of the sets of light limbs to the upper and lower master trunk line portions are provided so that the light limbs may be quickly and easily assembled, disassembled, replaced, added to and the like; and the individual sets of light limbs are in parallel with each other.

The resulting series-parallel master trunk line-light limb arrangement provides a unique Christmas tree light system wherein individual light limb sets may be quickly and easily assembled, disassembled and changed for replacement or the like; wherein if a single light burns out, only a given light limb must be changed, and wherein the unique series-parallel combination allows significantly less energy to be used for illuminating relatively long strings of lights covering any normal sized Christmas tree without loss of intensity anywhere in the system. Furthermore, the light-emitting diodes of the Christmas tree light system of the present invention may include the envelope construction, optical spheres and light-conducting epoxy, liquid or air as described hereinabove. Additionally, various control circuits are provided to enable any desired sequencing or switching of the light-emitting diodes to produce the effects previously described.

Still further, relatively short series-parallel arrangements using the master trunk line/limb line configuration may be used for miniature or table top Christmas trees can be driven by batteries so that no wires are needed for making the miniature Christmas tree portable and the like.

Still further, a base is contemplated for attachment to the bottom of the envelope and the LED leads extend in opposite directions either through or adjacent to the base and substantially perpendicular to the axis of the envelope for attaching to the light limb conductors in such a manner as to provide increased stability so that the individual light bulbs substantially always stand upright on the limbs rather than falling down or turning upside down as in the prior art. Lastly, various timing circuits, drive circuits, polarity reversing circuits, variable duty cycle control circuits, transformer circuits, and the like are provided for driving either indoor or outdoor lights, are provided for driving the light strings of different lengths and including various numbers of light-emitting diodes, including extremely long sets of lights, and are provided for producing any desired number of switching signals for sequencing control signals to enable blinking, alternating lights, sequencing three lights. Any desired sequence can be affected using the control systems described herein or various modifications thereto.

Other advantages and meritorious features of the present invention may be more fully understood from the following description of the drawings of the preferred embodiment, the appended claims and the drawings which are described hereinbelow:

BRIEF DESCRIPTION OF THE DRAWINGS

FIG. 1 is a sectional side view of the light bulb apparatus of the present invention;

FIG. 2 is a sectional side view of one embodiment of the light bulb apparatus of the present invention;

FIG. 3 is an alternate embodiment of the light bulb apparatus of FIG. 1 of the present invention;

FIG. 4 is still another embodiment of the light bulb apparatus of FIG. 1 of the present invention;

FIG. 5 is a sectional side view of a spherical light bulb apparatus;

FIG. 6 is a sectional side view of a light-emitting diode;

FIG. 7 is an alternate embodiment of the light bulb apparatus of FIG. 1 of the present invention wherein the surface of the envelope is scarred or provided with a fresnal lens pattern or the like;

FIG. 8 is still another embodiment of the light bulb apparatus of FIG. 1 of the present inventon;

FIG. 9 is yet another embodiment of the light bulb apparatus of FIG. 1 of the present invention;

FIG. 14 is a schematic representation of internal reflection set within an ordinary bulb or tube;

FIG. 15 illustrates internal transmission, reflection, refraction, and dispersion in one embodiment of the light bulb apparatus of the present invention;

FIG. 16 is a sectional side view of a portion of the light-emitting diode bulb apparatus including a base;

FIG. 17 is an alternate embodiment of the light apparatus of FIG. 16 including a modified base;

FIG. 18 is another embodiment of the light bulb apparatus of FIG. 16 with still another base;

FIG. 19 is yet another modified base assembly for a light-emitting diode bulb assembly;

FIG. 20 is an electrical schematic diagram of an AC power source for driving alternate, polarity reversed, light-emitting diodes connected in string fashion;

FIG. 21 is a sectional side view of a bi-color or two LED light bulb assembly;

FIG. 21A is a blown-up view of the bi-color LED portion of the bulb assembly of FIG. 21;

FIG. 22 is a sectional side view of another two LED bulb assembly;

FIG. 23 illustrates a conventional, reverse polarity-connected bi-color LED;

FIG. 24 shows an alternate representation of a bi-color LED which employs a third electrical connector;

FIG. 25 is a schematic representation of the series-parallel master trunk line/limb line wiring configuration for Christmas tree light sets;

FIG. 26 is a plan view of a connector apparatus useful in master trunk line connections or limb line;

FIG. 27 is an example of a conventional tie fastener used for mechanically securing the master trunk line to the tree;

FIG. 28 is a schematic representation of male and female snap fasteners for securing the individual light limbs to the master trunk line;

FIG. 32 is a miniature series/parallel master trunk line/limb line circuit for miniature or table top Christmas trees and the like;

FIG. 36 is an electrical schematic diagram, partially in block form, illustrating another sequencing arrangement useful in addressing the various bi-colored light-emitting diodes of the present invention;

FIG. 37 is an electrical schematic diagram of one control circuit useful in sequencing the LED light strings of the present invention;

FIG. 38 is an alternate embodiment of the control system for a light string apparatus as shown in FIG. 37;

FIG. 39 is an electrical schematic diagram of one polarity reversal circuit useful in the system of FIG. 34;

FIG. 40 is an alternate embodiment of a polarity reversal circuit useful in the system of FIG. 34;

FIG. 41 is still another embodiment of a polarity reversal circuit useful in the system of FIG. 34;

FIG. 42 is yet another embodiment of the polarity reversal portion of the block diagram of FIG. 34;

FIG. 43 is yet another electrical schematic diagram embodying another polarity reversal circuit useful in the circuit of FIG. 34;

FIG. 46 is an electrical schematic diagram, partially in block form, exemplifying the variable duty cycle controller of the block diagram of FIG. 34.

FIG. 47 is an electrical schematic diagram of a simple AC step-down transformer circuit for operating the light strings of the present invention; and FIG. 48 is an alternate embodiment of the circuit of FIG. 47.

DETAILED DESCRIPTION OF THE DRAWINGS

Figure 10:
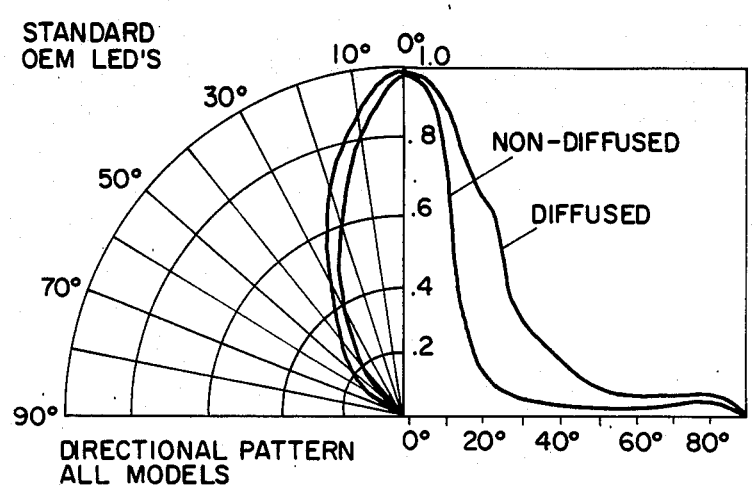
FIG. 10 is a directional pattern for standard light-emitting diodes.

FIG. 1 shows a miniature Christmas tree light or light bulb assembly 51 of the present invention. The light bulb assembly 51 includes a light-emitting diode (LED) 52; a bulb, shell, or envelope portion 53; and a base assembly 61. The light-emitting diode 52 includes a first electrode configured as a parabolic mirror or reflector 54 having an electrical input lead 55 connected thereto as by contact 56 or the like and a second electrode or solid state semiconductor light emitter portion 57 having an input lead 58 electrically connected to the electrode 57 as indicated by contact or solder point 59.

The bulb base assembly 61 houses a portion of the LED 52 structure and seals the bottom 50 of the envelope portion 53 as hereinafter described. The LED 52 is positioned at least partially within the envelope 53 and a plurality of light rays or photons 62 are emitted into the bulb 53 by electrode 57. The bulb 53 includes a generally cylindrical elongated shell or envelope 63 having a substantially hollow interior 64 along the longitudinal axis 65 thereof. In the preferred embodiment of the present invention, the hollow interior 64 of the envelope 63 is at least partially filled with light-transmitting, optical balls or spheres 66 for improved light transmission, diffusion, and dispersion characteristics, as hereinafter described.

As an alternate embodiment, the interior 64 of the envelope 63 may include, either separately or in addition to the optical spheres 66, a light-transmitting liquid, a light-transmitting gas, or a light transmitting solid such as a curable, light-conducting epoxy, thermo-setting or other plastic-like material 67. A potting compound of epoxy or sealing material 68 may be used to seal the bottom 50 of the envelope 63 against leakage therefrom and to secure the position of the light-emitting diode 52 therein.

The diode 52 actually includes a light-emitting semiconductor chip including the electrode 57 and different materials may be used for the chip depending upon the color of illumination to be produced by the LED. For example, a red color is produced by GaAsP, a green color is produced by GaP and a yellow color is produced by GaP, with appropriate semi-conductor doping and the like. The electrode 54 actually serves as a diode holder and is actually an integral part of the semiconductor structure making up the LED 52 itself. The LED assembly 52 then includes, in one common structure, a dome-shaped LED capsule portion 70 for housing the semiconductor portion therein.

FIG. 2 is similar to FIG. 1 and all similar components in future Figures will utilize similar reference numerals to designate corresponding similar parts. The light-emitting light bulb assembly 51 of FIG. 2 also shows the potting compound or sealing material 68 as a block sealably positioned about the bottom or open end 50 of the envelope 63, about the base of the LED capsule 52, and mounted on the base 61. The base 61 includes an elongated, downwardly-directed base extension 69 extending substantially along the longitudinal axis 65 and coaxial therewith.

FIG. 3 shows a light bulb assembly 51 having the envelope 63 in the shape of a right cylinder to show that alternate designs or geometric shapes of the bulb or envelope 63 are possible in the present invention.

FIG. 4 shows another embodiment of the present invention wherein the envelope 63 is shaped as a conventional full size incandescent Christmas tree light bulb and the plurality of optical spheres 66 include different sized or diameter spheres 66 including both large light-conducting balls 71 and smaller balls 72 generally mixed within the interior of the envelope 63 and surrounded, if desired, by epoxy material 67 or the like.

FIG. 5 illustrates a spherical envelope 63 embodied in a light bulb assembly 51 while FIG. 6 illustrates a conventional light-emitting diode 52 wherein the capsule portion includes a dome 73 and an elongated LED base 74. FIG. 7 shows a light bulb assembly 51 having an alternate envelope portion 63. The envelope 63 has the outer envelope surface 75 covered at least partially with scoring, etched, or scarring lines 76 which may be in the shape of a fresnal lens pattern 77 or the like. Furthermore, the envelope 63, and any others, may include an integrally-formed upper hook portion 78 for hanging on the Christmas tree limb or the like. The scoring 76 or the fresnal lens pattern 77 basically serve as a rather limited alternate to the light-conducting optical spheres and aid in light dispersion and diffusion from the envelope 63.

FIG. 8 shows another embodiment of the light bulb apparatus 51 wherein the envelope 63 is filled with a plurality of relatively large diameter optical spheres 79 where the diameter of the spheres 79 is just slightly smaller than the inside diameter of the envelope 63 so that the balls 79 can be stacked, one-upon-the-other, within the envelope for improving the light transmission, dispersion and diffusion characteristics thereof.

FIG. 9 shows still another embodiment of the light bulb assembly 51 of the present invention wherein a plurality of light-conducting spheres 66 are disposed within the hollow interior 64 of the envelope 63 and centrifuged or otherwise settled to or placed against the inside surface area with the hollow portion 64 down the longitudinal axis 65 substantially devoid of balls 66. The interior may be, as previously described, filled with a light-conducting epoxy material 67, liquid or gas. Alternately, a plurality of relatively uniform crystal-like glass or plastic structures, fragments, or particles or glass or plastic geometric shapes 60 may be enclosed within the envelope 63, with or without epoxy 67.

Figure 11:
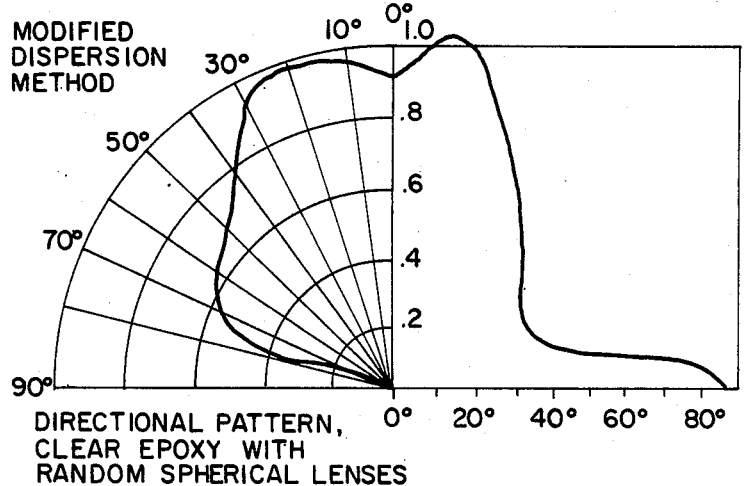
FIG. 11 is a directional pattern for light-emitting diodes provided with the modifications of the present invention.
Figure 12:
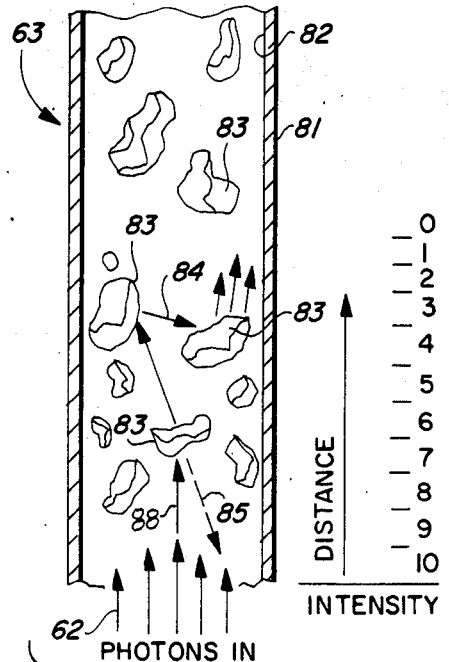
FIG. 12 is a diagramatic illustration of reflection, refraction, and interference from irregular glass fragments and the resulting variation of intensity with distance.
Figure 13:
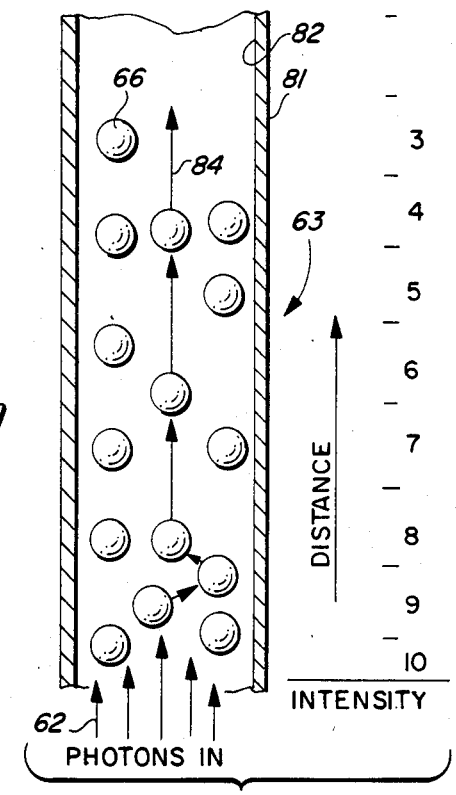
FIG. 13 is a similar diagram showing the improved variation of intensity with distance utilizing the light bulb apparatus of the present invention.

FIGS. 10 and 11 compare the directional pattern of standard OEM LEDs with the modified dispersion pattern produced by the method and apparatus of the present invention; and it will be seen that a much greater degree of diffusion, as shown in FIG. 11, is possible with the light bulb assembly of the present invention. FIGS. 12 and 13 compare the distance versus intensity plot of irregular glass or plastic fragments, chips, or pieces 83 with the optical spheres 66 of the present invention. FIG. 12 shows that a portion of the light ray 85 is reflected while a rather random angular path is followed by the incoming ray 88 as it is refracted and transmitted through the various fragments. Much of the light intensity is lost or captured within the envelope 63 for greatly decreased intensity with distance. On the other hand, FIG. 13 shows that the optical spheres provide a much greater intensity with distance characteristic due to the nature and light-conducting properties of the spheres 66, as hereinafter described.

FIGS. 14 and 15 show internal reflection patterns for light rays 84, 86 in an envelope 63 devoid of spheres, and for light ray 84 of an envelope 63 wherein the spheres 66 are centrifuged, settled, or positioned along the inside surface 82 of the wall 81 of the envelope 63.

With solid state or non-incandescent heat production lighting techniques such as those employed by the light bulb apparatus 51 of the present invention, the problem was to diffuse or disperse light in such a fashion that the losses may be kept as low as possible and that the light not be reflected back into the source to cause heat or additional losses. When light passes through a spherical ball with the light or photons entering at a given pole, the light will pass directly to the opposite pole and the sphere acts as a lens in that it refocuses the light back to a beam and also enlarges the exact diameter of the sphere. The light will appear additionally as a ring or halo at the equator region of the sphere and tests verified this unique result. When the potting compound or epoxy material 67 is introduced into the envelope 63, the light transmission and dispersion properties are maintained as the light passes from sphere to sphere. When large groupings of balls or spheres 66 are used, photons bounce more in the core of the plotting compound 67 and appear very intense as if the core itself were the source of light.

Many of the systems in use today for light dispersion use a frosted coating which is irregular or uses a milky substance in the potting so that a lot of internal heat is generated and photon direction is readily seen to give higher intensity at the source and lower intensities with distance. In incorporating the optical spheres or balls 66 and the like into the light bulb assembly 51, the size and distribution of the balls can be selected to give a substantially uniform photon dispersion throughout the designed region. This enables the light-bulb assembly 51 of the present invention to be used in many other applications of decorative lighting, and industrial applications where a low loss, high output is necessary and internal coloring is not necessary to obtain diffusion and a smooth contour of light emission.

The spheres 66 actually defract light and will split the spectrum in given circumstances much like rain drops causing a rainbow. In lighting uses it has been found that the size of the optical spheres 66 can be determined for potting ease, for mixing and for insertion without any substantial deterioration in the optical properties. As the spheres become smaller, the effect becomes more fogged and the larger the balls, the more clarity. It is believed that the photons actually behave in a chain reaction effect of bouncing from ball to ball as the photons pass through a transparent or even a translucent potting compound to the next ball, the end result which has been experienced is low loss, at high yield, at the greatest output potential stemming from solid state LED lighting which is still in its infancy.

In the preferred embodiment of the present invention the light-emitting diodes 52 used may be any commercially available color such as red, green, yellow, amber, orange, and blue, and in either normal intensities or in the super bright or ultra bright ranges which go as high as from 2000 to 5000 MCD at present. For example, the model H2K, a new 2000 mcd LED (which measures as high as 5000 mcd) from Stanley Electric Co., Ltd. of Hatano City, Japan. The envelope 63 may be any commercially available light-transmitting or conducting glass or plastic material, either translucent or transparent. A clear or transparent envelope is best and the outer or exterior surface may be polished to further eliminate light losses and heat. Further, the envelope may be tinted or covered with a tinted or colored medium, as known in the art, to produce additional lighting effectes although light transmission will be decreased accordingly.

Similarly, the optical balls or spheres 66 or geometric shapes 50 may include any commercially available light-conducting or transmitting glass or plastic material. Preferably, the material is transparent or clear but translucent balls will also work with decreased optical characteristics. The balls may also be colored or tinted, if desired with additional loss of intensity, and the balls may be either of a uniform size or diameter or of a mixed size or diameter within the envelope 63. Further, the quality of the balls may be that of commercially obtained glass beads used for sand blasting or the like although optically perfect, highly spherical balls, are preferred. Further, the spheres 66 may be either hollow or solid and may be placed randomly in the envelope 63, packed loosely or tightly, stacked one upon the other, centrifuged to the inner wall of the envelope 63 with the hollow interior 64 devoid of balls or settled to one or both opposite wall portions. Similarly, a plurality or relatively uniform glass or plastic chips or fragments can be used and particularly those with crystalline structures, regular geometric shapes and the like.

The method of making the light bulb assemblies 51 of the present invention is as follows. A mold is produced in a desired shape of the light bulb or envelope 63 to be produced such as that of a conventional miniature or Italian Christmas tree light, a cylinder, a sphere, a conventional, full size, incandescent light bulb, or the like. The mold may be made by any vacuum forming, injection, or compression technique or the like and any curable liquid, preferably clear or transparent material such as glass, glass-like material, plastic, thermoplastic, a two part catalyst system, a thermo-setting material, or a relatively transparent, pure lead epoxy molding compound 67 can be used to make the envelope 63. While all forms appear to be translucent in nature, when they are molded, they will harden or cure to provide a relatively pure optical clarity with a relatively high durability.

The spherical glass or plastic beads, balls or spheres 66 or geometric shapes 50 are then preferably mixed with the liquid to be molded, in one embodiment, to create uniform dispersion characteristics. The liquid molding compound is placed into the mold and then the microbeads or balls 66 are preferably introduced either before or after this step depending upon the material used and optical characteristics desired. The LED is then suspended into the material with the leads extending outward from the potting material and the epoxy is allowed to set and cure to its maximum hardness. Alternately, the envelopes could be purchased with or without the epoxy, with or without the balls and/or with or without the LEDs and assembled accordingly.

The light-emitting diodes and microball combination encased in the mold having a desired shape of envelope is then removed from the envelope after it is set. The leads are affixed and the excess length of leads is trimmed off. A base is then molded in the relatively same manner as the bulb 63 with many different designs and materials being useable. Liquid plastic or other plastic-like or rubberized material can also be used, as conventionally known in the art.

With the LED light bulb assembly attached to a wire, the base mold is filled with a molding material and made to except the lower portion or end of the envelope 66 with the LED and wires placed preferably in a horizontal line, one going to the left and the other going to the right substantially perpendicular to the longitudinal axis of the envelope 63. The base and envelope assembly with the wires attached are then molded together to make a single unit (which could be done in a single operation, if desired) and wires containing a plurality of such LED light bulb assemblies 51, spaced at any given distance or interval therebetween, are ready for use.

The combination of the light-emitting diodes 52 with the optical spheres 66 and/or added light-conducting liquid, gas or epoxy material 67 produce many advantageous results for light bulb assemblies or strings of light bulb assemblies made in accordance with the present invention. The present invention results in an extremely low power or low energy consumption apparatus which is normally at least one tenth of that of any known incandescent Christmas tree bulb, miniature or not. It is virtually impossible to burn out or break the LED light bulb assemblies 51 of the present invention so there is never a need for bulb replacement, maintenance or the like. The low energy consumption substantially eliminates any possible danger of burns to persons, children, pets or the like or from fire since virtually no significant heat is generated due to the low thermal dissipation from the bulb and since the use of low voltage eliminates fire hazards due to defective wiring.

Since the life of the LED light set is measured in terms of years rather than hours, for all practical purposes, it lasts for a substantially indefinite time period and requires substantially no maintenance. The unique bulb construction allows even rough handling such as stepping on the bulbs without breakage and no readily visible wires are shown when the teachings of the present invention, as hereinafter described, are employed. There is no danger of electricity or heat to infants, toddlers, children or pets playing with the bulbs or wires and they may be used on live, fresh cut, or artificial Christmas trees. They can be used on trees of all sizes as well as on decorative arrangements, outdoor strings, short strings, long strings, and the like.

Individual lights are adapted to lie flat on the branches of the tree rather than in random directions due to the unique wiring placements and excellent brightness and light dispersion due to the super bright LEDs and the use of the glass balls within the bulbs are produced. Since the bulbs are waterproof, they can be used indoors or outdoors and they may be constantly illuminated due to the low power consumption and no danger of fire so as to make burglars and the like think that somebody's home at all times. Bi-color or multicolor lights may be used with simple low cost switching circuits so that each bulb can produce at least three separate colors. Relatively simple circuits can permit blinking with or without multiple colors and different strings can be phased or sequenced to simulate different colors moving around the tree, within strings, and the like. Ultimately, a three LED bulb including one LED of each of the three primary colors can be controlled to generate all basic colors of the visible light spectrum.

A unique snap-on or plug-in branch string assembly of lights or light limbs removeably connectable and unconnectable to a master trunk line, as described herein, allows far greater freedom in positioning lights on a tree and in putting lights up and taking them down and in replacing individual branch lines or light limbs if a defect occurs than was heretofor possible. Very long strings are possible without any loss in brightness in accordance with the present invention and AC, rectified AC, pulsed current DC power supply or simple batteries can be used for power so that small table top trees or decorations can be illuminated without electrical cords and made portable thereby. Ultrabright LED lights can be manufactured in the shape of a conventional Christmas tree mini bulb or in any desired shape with the glass micropheres and/or epoxy already included therein, if desired. Since the annual decrease in LED costs, based upon prior history, insures an ever-growing market since the price of LEDs has significantly decreased each year and will, in all likelihood, continue to do so.

Unique parallel/series wiring configurations, as hereinafter described, insure consistent LED intensities and longer light strings and insure or minimize outage if a break in any branch line of limb line occurs since it will not result in losing the entire tree but only in a single light limb or branch. The lights may be left on artificial trees from year to year, without damage, breakage, or blown out bulbs and they can be packaged in conventional Chrismtas tree light cartons, if desired.

FIG. 16 shows a base assembly 61 wherein a potting compound or sealing material 68 is operably disposed about the LED 52 to seal the open end of the envelope 63 and secure the LED 52 therein. The electrical leads 55, 58 protrude horizontally downward, substantially parallel with the longitudinal axis 64 of the envelope 63 are connected at contacts 88, 87 to horizontally disposed wires 95, 94, respectively. The horizontal placement of th leads or wires 95, 94 increases the stability of the light bulb assembly 51 and permits the bulbs to be positioned on the Christmas tree limbs or branches in a vertically upright position without a chance of random tipping or turning upside down for uniform asthetic appearance and the like. The baase assembly 61 is shown as including a downwardly extending extension, weighted, or balancing portion 69 generally coaxial with the longitudinal axis 64 of the light bulb assembly 51. The base also includes a horizontally extending portion 89 operably disposed beneath the bottom of the potting material 68 with the electrical wires 94, 95 operably disposed therebetween and substantially perpendicular to the longitudinal axis 64 of the bulb assembly 51.

FIG. 17 shows an alternate embodiment of the base assembly 61 wherein each of the elongated, horizontally extending portions 89 are provided with sides 91 having top surface portions 92 thereon. The sides 91 form a hollow interior portion of socket-like opening 93 within the central area of the base 61 for receiving the potting material 68 therein. The vertically extending leads 55, 58 of the diode 52 extend downwardly parallel to the longitudinal axis and through the base or bottom of the potting material 68 into the base portion 61. The electrical wires run through the base portion and are soldered or otherwise connected to the leads 55, 58 at contacts 87, 88 respectively, as known in the art.

FIG. 18 provides still another embodiment of the base assembly 61 of FIGS. 16 and 17 and shows the sides 91 of the base 61 extending vertically upward until the upper surface 92 of the sides 91 is substantially coplanar with the top surface of the potting material 68 for still another appearance and no exposed epoxy material. Lastly, FIG. 19 shows a base 61 having a bulbous rounded balancing portion, weighted portion, or downward extension 69 and with the LED leads, 55, 58 extending only into the lower portion of the epoxy 68 with the wires 94, 95 extending through the walls 91 of the base 61 and through the lower layer of epoxy material 68 (or the leads 55, 58 extending rearwardly along the same path) for securing to the leads 55, 58 at contacts or connections 87, 88, respectively.

FIG. 20 shows a simple stepped-down AC transformer circuit for driving a string of alternately poled light-emitting diodes wherein every other light-emitting diodes has its polarity reversed from that on either side of it. The circuit includes a first 110 volt AC input 233 coupled through a lead 234 which is connected to one terminal of a primary transfer coil 235 and back to the input 233 by a lead 236. A second primary coil or transformer 237 is connected at its opposite ends by leads 238 and 239 to a second power source, such as a 220 volt AC input 242. The transformer includes a transformer core 241 and secondary coils 243 and 244. The secondary coil 243 has one end oppositely connected to a lead 248 and its opposite end connected by intermediate lead 245 to one end of the secondary coil 244 whose opposite end is connected to lead 249. Lead 248 is connected to lead 249 through the parallel combination of alternate (for example, odd numbered LEDs) LEDs 246 each having its anode electrically connected to the lead 248 and its cathode connected to lead 249. The opposite alternate (for even numbered LEDs) LEDs 247 are connected in reverse polarity with their cathodes connected directly to lead 248 and their anodes connected to lead 249.

In operation, either the 110 volt input 233 or the 220 volt input 232 are selected, and the secondary coils 243, 244 will generate a stepped-down AC voltage such as 24 volt AC, 12 volt AC, or the like to drive the LEDs 246, 247. The positive portion of the AC waveform will drive one set of diodes 246 while the opposite poled or reverse polarity coupled diodes 247 will be driven by the negative portion of the AC waveform, as known in the art. In this manner, an extremely simple, low cost drive system can be used for alternating or sequencing between adjacent LEDs to produce first one color and then the other, in sequence, indefinitely.

FIGS. 21 and 21A show a bi-color LED light bulb assembly 145. The bi-color assembly 145 includes a base assembly 146, an LED assembly 140 and an envelope 63. The LED assembly 140, as shown in FIG. 21A, includes a first LED portion 147 and a second LED portion 148. The first LED portion 147 includes first and second electrical leads 149, 150 extending from the photon emitter portion 159 for connection to electrical wires 153, 154 at solder points or contacts 155, 156, respectively. The second LED portion 148 has electrical leads 151, 152 extending from the photon-emitter portion 160 and connected to electrical leads or wires 153, 154 at solder points or contacts 157, 158, respectively.

In practice, the first and second LED portions 147, 148 each includes a ground surface 161, 162 adapted to be operatively disposed proximate or against one another to provide the appearance of a single light source by proper focal alignment, as known in the art. As previously discussed, the envelope 63 can contain a plurality of optical spheres 66 and an epoxy compound 67, if desired.

FIG. 22 shows another embodiment of a bi-color or tri-state LED light bulb assembly 164 wherein a conventionally shaped envelope 63 is positioned over a pair of different-colored, separate and distinct, light-emitting diodes 165 and 168. The LED 165 has a pair of leads 166, 167 extending parallel to the axis of the bulb assembly 164 connecting to a pair of electrical wires 172, 175, respectively. LED 168 has a pair of electrical leads 169, 171 electricaly connected to a pair of wires 173, 174, respectively. The wiring arrangements permits the two different colored LED's 165, 168 to produce a first characteristic color for LED 165, such as red, and a second different and distinct characteristic color for light-emitting diode 168, such as green with the combination, mixing or blending of the two colors produced when the LED's are lighted simultaneously or switched back and forth quickly so that the eye cannot discern the switching sequence but sees instead a single source of a third different and distinct characteristic color, such as yellow. In this manner, the two LED bulb apparatus 164 of FIG. 22 can produce a tri-state or three different and distinct colored light from only two individual, differently colored LED's. Conventional LEDs may be used such as a model MU9471/MU9475 LED manufactured by General Instruments Optoelectronic Division of Palo Alto, Calif.

FIG. 23 shows the electrical symbol 177 for a bi-color or tri-state light-emitting diode device. The device 177 includes a first LED 178 having a first different and distinct characteristic color and a second LED 179 having a second different and distinct characteristic color. A pair of leads 181, 182 serve as the input and the cathode of LED 178 and anode of led 179 are commonly connected to lead 181 while the cathode of LED 179 and anode of 178 are commonly connected to lead 182. The enclosure bulb portion or bi-color LED assembly 164 itself is indicated by the reference number 183.

FIG. 24 shows an alternate embodiment of the bi-color device 177 of FIG. 23 as it illustrates another bi-color or tri-state LED 184 having first and second oppositely poled LED's 185, 186, each having its own different and distinct characteristic color. The anode of diode 185 is connected to a first electrical lead 187 while the anode of LED 186 is connected to a second lead 188. A third lead 189 is required for connection to a junction or node 191 at the common cathode junction of both LED's 185, 186, respectively. Either of the bi-color or tri-state LED's 177 or 184 of FIGS. 23 and 24 may be used although the device of FIG. 23 is preferred due to the two wire rather than three wire construction thereof. The manufacturer of the bi-color LED's of the present invention is similar to the manufacture of the mono-color or single state LED's previously described with the exception that the ground surfaces to produce a single focal point or light source are ground and pre-assembled before insertion into the envelopes.

FIG. 25 illustrates the Christmas tree light string set of the present invention which is a series/parallel wiring string assembly 192. The wiring string assembly 192 includes a main trunk line 193 adapted to be operably disposed against or around the trunk of the tree and it includes an upper master trunk line 194 and a lower trunk line 195. The wiring string assembly 192 also includes an upper limb light group 196 and a lower limb light group 197. The upper limb light group 196 includes a first, upper, or top limb light limb set 198, at least one intermediate limb light set 199 and a last or bottom limb light set 201. Similarly, the lower limb light group 197 includes a first, upper or top limb light set 202, at least one intermediate limb light set 203, and a bottom or last limb light set 204.

The master trunk line 193 includes, at its lower end portion, a first main trunk line wire 205 and a second main trunk line wire 206. The main trunk line wiring string assembly 192 further includes a third or common main trunk line 207. The first main trunk line lead or wire 205 extends upwardly along the trunk of the tree and past the lower limb light group 197 to complete an electrical series-connection to a first connector node 208 (which represents a manually-operated, connect-/disconnect fastening means) of the upper master trunk line 194. The upper trunk line 194 then electrically connects the first or top terminal or nodes 211, 213, 215, 217, and 219, (all of which represent similar fasterners) of the top light limb set 198, three intermediate light sets 199, and the last or bottom light set 201 of the upper limb light group 196, respectively. The opposite end of terinal of each of the individual ones of the upper limb light sets 196, including the nodes or contacts 212, 214, 216, 218, and 209, (which similarly represent such fasteners) are electrically and mechanically removeably connected to the common main trunk line wire 207.

The second main trunk line wire 206 is electrically connected to the individual light sets 202, 203, and 204 of the lower limb light group 197 through electrical contacts 220, 222, and 224, respectively. Similarly, the opposite ends of the individual light sets 202, 203, and 204 are connected to the third or common main trunk line wire 207 via contacts 221, 223, and 225, respectively.

Each of the individual sets of upper and lower limb lights 196, 197 has a single series-connected string of light-emitting diodes operatively positioned at predetermined intervals or distances therealong and in electrical series contact with each other. Each of the individual ones of the upper limb light sets of group 196 have their opposite ends or terminals electrically connected to the first master trunk line wire 205 and to a third or common main trunk line wire 207 while each of the sets of the lower light limb group 197 has its opposite terminals connected to the second main trunk line wire 206 and the third or common main trunk line wire 207.

As can be seen in FIG. 25, each of the individual series-connected light limb sets has a single continuous series-connected string or path but the path can be thought of as being divided into a series of branch portions or segments each on a slightly different relative horizontal level of the tree or adapted to be strung along different branches thereof. Therefore, the light-emitting diodes 226 can be viewed as being operably positioned at preselected intervals along the lines or along the individual line or branch segments with the distance between the light-emitting diodes being selected for giving the tree a fully lit appearance or the like. Further, each of the segments of each of the upper and lower limb light sets 196, 197 has a light-emitting diodes 227 at the outer end portion or branch tip where one segments meets the next, oppositely-directed lower segment.

The first and second main trunk line wires 205, 206 are secured to a male electrical connector 228 having a male member 229. The fastener or connector 128 which includes the male connector 228 also includes a corresponding female connector portion 231 having a central aperture, not shown, but known in the art, therethrough for operatively receiving and both mechanically and electrically engaging the male member 229 of the connector 228 to complete an electrical path therebetween. The female connector portion is connected through a pair of wires to a power supply 232 which can be a conventional step-down transformer for producing 12 volts AC or 24 volts AC, or any desired AC voltage signal or pulsed DC signal required to operate the series/parallel wiring string assembly 192 of the system of FIG. 25.

The purpose of the main trunk line connectors 193 is to allow a horizontal connection of limb lines or limb light sets or segments 196, 197 to run approximately perpendicular to the main trunk line connector 193 running up the trunk of the tree. Another purpose is to allow polarity-reversed connections as the light-emitting diodes wired in the individual limb lines must be wired in such a fashion that the forward and reverse polarity can be observed in both the single or mono-color diodes and the bi-colored or multi-colored diodes previously described.

FIG. 26 shows a snap fastener-type connector or fastening device 96 for selectively connecting and unconnecting the lower master trunk line portion 195 to the upper master trunk line portion 194 and/or for selectively connecting and unconnecting the individual limb line sets 198, 199, 201, and 202, 203, 204 to predetermined locations on the master trunk line 193. The connecting apparatus 96 includes a base or support 99, a pair of slots or apertures 100 through the base 99 and a male snap-connector 102 and a female snap connector 103 secured to the base or platform 99. Electrical connectors or wires 97, 98 pass through the first aperture 100 from the bottom of the support or base 99; electrically connect to the snap-type fasteners 102, 103, respectively and pass through the second or opposite aperture 100 from the top back to the bottom of base 99.

FIG. 27 shows a conventional tie means 96 having a head or enlarged portion 105, a pair of apertures 106 through the head 105, and elongated portion 108 having a plurality of tie locking teeth 109 and a tooth engaging loop or rectangular slot forming portion 107. The elongated portion 108 is used to wrap around the tree trunk and master trunk line to secure the master trunk line vertically along the tree trunk. Once wrapped, the toothed portion is inserted into the slot 107 to lock it in place.

FIG. 28 shows a snap fastener pair 101 having a male portion 102 having a male member or extension nd a female portion 103 having a female depression or pocket adapted to mechanically and electrically engageably receive and retain the male member 102 therein to complete an electrical connection between the male portion 102 and the female portion 103. Electrical connector or wire 97 is electrically connected to the female and male portions 97, 98, respectively while a wire 98 bypasses the portions 97, 98 via connector 111.

Figure 29:
FIG. 29 is a sectional side view of the female snap connector portion of the assembly of FIG. 28.
Figure 30:
FIG. 30 is a sectional side view of the male snap member of the assembly of FIG. 28.

FIG. 29 is an exploded, partially sectional, view of the male connector 102 of FIG. 28. The male snap-fastener 102 has an elongated stem 117 for connection to wire 97 and a generally disc-shaped or circular portion 115 having a male member 116 extending upwardly from the center of said circular portion 115. FIG. 30 shows the female snap fastener 103 of FIG. 28. The female portion 103 includes an elongated stem portion 112 for connection to the wire 97 of FIG. 28 and a generally disk-shaped or circular portion 113 having a socket-like indentation or male member receiving channel 114 therein for mechanically receiving and removeably securing said male member 116 therein to complete an electrical connection between the male and female snap-fastener portions as described in FIG. 28.

Figure 31:
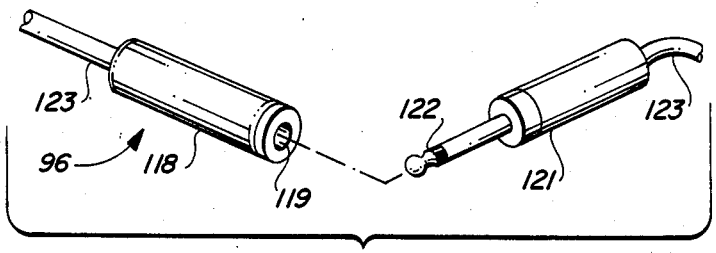
FIG. 31 is an alternate embodiment of the connector apparatus of FIG. 28.

FIG. 31 illustrates that any other type of mechanical/electrical removeable fastener or connector, such as the push and lock bayonet-type connector 96 can also be used, as desired. The connector 96 includes a generally cylindrical female socket-like plug 118 having a hollow interior. The electrical wire 123 is adapted to be received and secured into one end of the hollow interior and electrically connected thereto while the opening 119f in the opposite end is adapted to receive the male prong or elongated member 122 therein for completing a mechanical and electrical connection therein. The male connector portion 121 has an aperture at one end for receiving and securing the wire 123 therein and an elongated male member 122 for engaging opening 119 of the female portion 118. Any similar or conventional fastening means could also be used.

Snap connectors, as described herein, ar used so as to hold the vertical master or main trunk line wires securely and to prevent flexing at the snap connection which could cause fracture of the wire connector throughout the useful life of the wiring harness. The connectors are to be inserted, either thermally, by pressure inpact, or the like into the high density polyethelyne or equivalent plastic or non-plastic material to securely attach the snap portion to the polyethelyne. The color of the polyethelyne may be such as to become unnoticed or camouflaged as it runs up the tree trunk, but it could be any given color and could appear as an oranment or the like. Another design would be to allow the polyethelyne harness to also incorporate a holding design such as a fastener which is a part of the connector since the material is flexible.

The purpose of the main trunk line or limb line connectors 196, 197 of FIG. 26 is to make a selectively attachable and detachable mechanical and electrical connection which allows the limb lines to snap onto and off of the main trunk line and make an electrical connection. These connectors can be covered with some sort of vinyl or plastic-like material to hide or camouflage the metal snaps and for electrical insulation purposes but the material is not actually necessary due to the extremely low voltage employed in the LED systems of the present invention. The material should not be easily removable with the fingers and the like and it should be capable of securing the fasteners once installed. If the fasteners are designed correctly and by suitable manufacturing techniques, they could double as the same type used in the ain trunk line connectors. These fasteners could be easily crimped onto the wire, and the crimped tube will then double as an easy means of holding it with the fingers for removal or installation purposes.

However, the insulation part of the wire must also be crimped into the fastener so as not to cause breakage or other shortening in the useful life of the device. The master trunk line 193 of FIG. 25 may have a length of wire typically in the range of 2 to 30 feet long but any desired greater and lesser lengths can also be used. Preferably, a multi-strand, tin-plated wire of the desired color, is used as determined by the heighth of the tree. Connectors are attached at six to twelve inch intervals along the mastertrunk line 193 depending upon the heighth of the tree down the master line 193. A step-down transformer is used at the wall which converts 110 volt AC to 12 volt AC with the output of the transformer being determined by the consumption of power of the LED's which are selected to be well within the safety factor of the system. Any connector which provides electrical continuity may be used including snap-on connectors, pad connectors, plug connectors, bayonett-type connectors, and the like.

The limb lines 196, 197 are made in various lengths to produce various length segments and accomodate the length of the different individual tree branches on a typically-shaped Christmas tree. The lights are placed at predetermined intervals along the limb such as three to twelve inches and one light is always at the tip, turning point, or end of each limb line segment. A removeable connector is attached to the appropriate inside end of the limb line which will connect to a pair of the master trunk lines 193 to produce an electrical connection for illuminating the lights on the lines. The typical limb lines may be laid or positioned on the top of the branches in such a way as to blend with the tree branch and become virtually invisible. This design eliminates the unsightly wires draped around the tree and greatly enhances the asthetic appearance thereof. Each segment of an individual string of limb line is a two wire twisted pair so that each segment includes both the outgoing lead with LEDs and the return lead devoid of LEDs. Therefore each twisted pair or segment must terminate with an LED.

The master vertical trunk line 193 and plug-in horizontal limb lines make the tree extremely easy to maintain, extremely easy to assemble and disassemble, enable quick and easy replacement of a light limb set if a bulb should burn out, break, or the like, and enable a much smaller amount of power to be used for driving any more light-emitting diodes in each light string. The set of the series/parallel connections, i.e. the series connection of the upper main trunk line 194 with the lower main trunk line 195; the parallel connection of the individual limb light sets 198, 199, 201 with each other within the upper limb light group 196; the parallel connection of the individual limb line sets 202, 203, 204 within the lower limb light group 197; and the series connection of the individual light-emitting diodes 226 within individual ones of the light limb sets. This arrangement enables much greater illumination to be produced from a given power input and hence many more lights can be accomodated for a given power supply. Further, the system insures uniform visibility, brightness, or intensity (mcd) of the lights along the string with no loss of light intensity towards the end of the line or the like. For best operation, the number of LEDs in the upper light limb group associated with the upper master trunk line is equal to the number of LEDs in the lower light limb group associated with the lower master trunk line. Also, the number of LEDs on one side of the tree is equal to the number of LEDs on the opposite side.

FIG. 32 shows a miniature or table top series/parallel wiring system 124 wherein a main trunk line 125 including an upper trunk line 126 and a lower trunk line 127 are adapted to be vertically positioned along the trunk of the tree. A plurality of light limbs 134 are provided for electrical connection to the vertical master line connector 125 to extend horizontally nd are substantially perpendicular therefrom for alignment substantially with the branches of the tree.

The master trunk line 125 includes an upper master trunk line 126 having a first master line wire 131 and a common master line wire 132. The lower master trunk line 127 includes a second master trunk line wire 129 and the common wire 132. A first group of light limb sets is adapted to be connected to the upper master trunk line 126 and a second group of limb lines is adapted to be connected to the lower master trunk line 127. In the preferred embodiment, the total number of individual LEDs in the first group is equal or substantially equal to the number of individual LEDs in the second group.

Each of the horizontally disposed light limb sets 134 include a plurality of segments, one adjacent to or beneath the other, for being positioned along individual branches of the tree and all are connected in series with one another from an electrical terminal 138 (removeable connector) wherein the first end portion 137 of the light set 134 is connected to the second master trunk line wire 129 and the opposite end of the series connected limb light set 134 is connected via lead 135 to the common master trunk line connector 132 at terminal 136 so that an electrical series path 141 is established through the sets 134 from terminal or connector 138 to terminal 136 of the master trunk line 125.

Therefore, each of the strings of individual limb light sets 134 comprises a single series connected string of light-emitting diodes and individual sets 134 within the groups associated with the upper and lower master trunk lines 126, 127, respectively, are connected in parallel with each other. The upper master trunk line 126 is connected in series with the lower master trunk line 127. The light-emitting diodes within the sets 134 may be positioned at any desirable predetermined distance from one another along the limbs or limb segments depending on the degree of illumination required on the tree. A light-emitting diode 139 is used to terminate each segment and begin the next so that one LED 139 is positioned at the outer ends or turning point of each segment of the light set 134. Since the individual light-emitting diodes 140 of the sets 134 is connected in series, the loss of any one diode 140 or 139 will result in the loss of that individual set only, and it is a relatively simple matter to unsnap or disconnect that set at terminals 136 and 138 and replace it with another set to restore full operation of the tree. It should be noted, however, that the loss of a particular series light in th set 134 does not result in the loss of ay other lights on the tree other than those within set 134. This makes the tree easy to maintain, assemble, disassemble, and the like.

Furthermore, if the Christmas tree to which the light string assembly 124 of FIG. 32 is attached is artificial, the light strings may be left on the tree year round without any real danger of burnt out lights, breakage, or the like. The wires 129 and 131 of the lower end of the aster trunk line are supplied to a connector 126 which is adapted to operatively engage a female connector to form a fastening both mechanical and electrical, therebetween to connect the master trunk line to a source of power, not shown, but known in the art. One advantage of the small strings typified by FIG. 32 is that they can be driven by plain DC current or batteries thus rendering the tree portable so that it can be moved from place to place in the house, for decorative purposes and the like.

Figure 33:
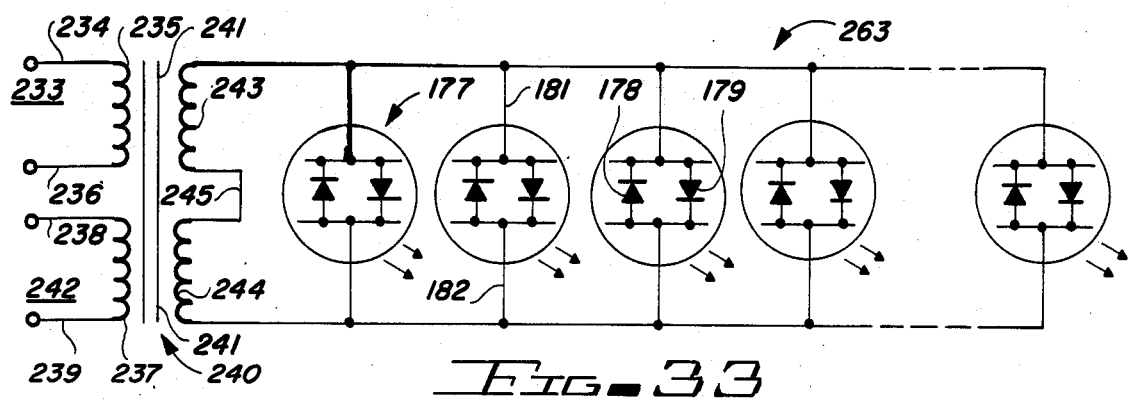
FIG. 33 is an electrical schematic diagram of an AC power supply system for driving oppositely-poled or reverse polarity LED combinations.

FIG. 33 shows an electrical schematic diagram of a relatively simple step-down transformer circuit 263 for driving bi-color of tri-state light-emitting diodes along a string. A first input 233 is connected to a lead 234 to one terminal of a primary transformer coil 235 whose opposite terminal is connected through lead 236 back to the input 233. This input may be, for example, a pulse transformer adapted to receive a pulse signals while the second input 242 is connected through lead 238 to one terminal of a second primary transformer coil 237 whose opposite terminal is connected through lead 239 back to the input 242. Input 242 may be, for example, a second pulse train input, and either of the inputs 233, 242, but not both, may be selected for driving the system.

The transformer 240 includes a core 241 and a pair of split secondary transformer coils 243 and 244. One terminal of the first secondary transformer coil 243 is connected via lead 181 to each of the light-emitting diodes 177 of the string 263 while the opposite terminal of secondarly coil 243 is connected through 245 to one terminal of the secondary coil 244. The opposite terminal of secondary coil 244 is connected via lead 182 to each of the opposite terminals of the light-emitting diodes 177. The transformer is preferably controlled and used as an impedance coupling device if used as a pulse transformer that can supply a given number of positive pulses with respect to negative pulses, then one color can be lit, if a given number of negative pulses are transmitted with respect to positive pulses, then the other LED will be it and thus another color produced. Also if they are then run at 50% positive and 50% negative pulses, then the third color combination of both will be seen.

As previously described, each of the bi-colored or tri-state light-emitting diodes 177 consist of a pair of oppositely poled light-emitting diodes 178 and 179 with one light-emitting diode 178 having its anode connected to lead 182 and its cathode connected to lead 181, while the oppositely poled or reverse polarity diode 179 has its anode connected to lead 181 and its cathode connected to lead 182. In this manner, as the positive pulses outnumber the negative pulses, a relatively low voltage, pulse signal having a frequency of less than 10 cps, is received by the secondary coils 243, 244, for illuminating light-emitting diodes 178, and when the negative pulses outnumber the positive pulses, the low voltage pulse signals will illuminate the alternate, opposited poled or reverse polarity LEDs 179 are alternately and sequentially illuminated for producing at least two different and distinct characteristic colors. If the pulses are equally positive and negative, the third color is seen. This extremely simple system allows a plurality of spaced-apart light-emitting diodes to be sequentially and alternately illuminated to alternately produce two or to sequentially produce three different and distinct characteristic colors by a simple pulse circuit.

Figure 34:
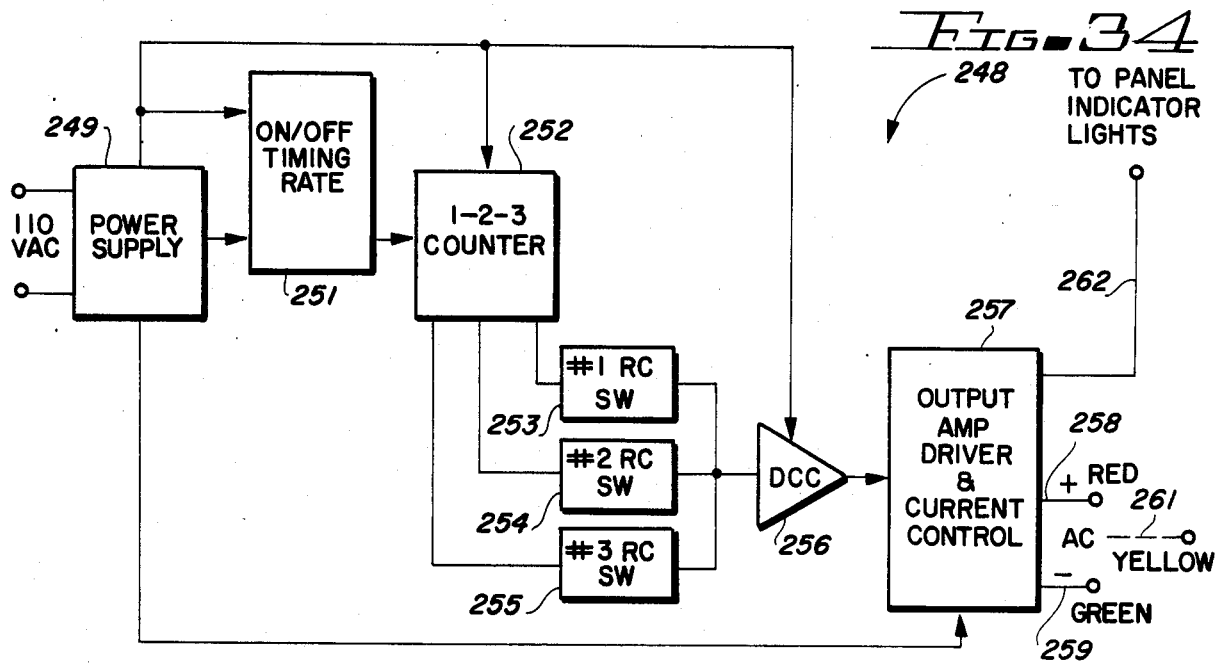
FIG. 34 is a block diagram representing a typical control system for operating the light strings of the present invention.

FIG. 34 shows a block diagram of a control system 248 useful in driving the various light strings, including very long strings, of the present invention. In FIG. 34, a power supply 249 feeds a clock or an on/off timing rate generator 251, a one-two-three counter 252, a series of RC switches 253, 254, and 255, a variable duty cycle control circuit 256, and an output amplifier-current control circuit 257. The power supply 249 supplies the necessary power to the timing rate generator or timer 251 which enables the timer 251 to produce a plurality of clock-like pulses at a preselected rate and supply these to a one-two-three counter 252. The individual first, second and third counts of the counter 252 are supplied to first, second and third RC switches 253 so that each is actuated on a different one of the one, two and three counts of the counter 252 in any given order. Whenever any of the RC switches 253, 254, 255 are actuated, the optional duty cycle controller 257 selects predetermined pulse widths for each of the positive and negative pulse trains and the output amplifier and driver circuitry 257 performs the necessary amplification and drive function for properly illuminating all of the light-emitting diodes in the string.

The outputs show a first or positive output 258 also labeled a "RED" output; a second or negative output 259, also labeled a "GREEN" output and a mixture of the two which produces an intermediate AC output 261 which rapidly cycles between the red and green or positive and negative signals to produce a third different and distinct characteristic "YELLOW" color with the cycling being such that it is not readily discernable to the human eye. The system utilizes a two light-emitting diode system to produce three different and distinct, characteristic colors sequenced by the RC switches 253, 254, and 255; and the duty cycle controller 256 allows a greater number of light-emitting diodes to be driven with less power by varying either duty cycle or the positive or negative pulse widths, or both.

Integrated circuit (IC) timers can provide precise timing intervals ranging from microseconds to hours and can be used as easily controllable, inexpensive oscillators. The most popular of the IC timers available is the conventional 555 timer. It generally comes in an eight-pin mini-dip package.

The 555 timer is basically a very stable IC that is capable of being operated either as an accurate bistable, monostable, or astable multi-vibrator. The timer comparators are actually operational amplifiers that compare input voltages to internal reference voltages generated by a voltage divider. The references are set at two-thirds of supply, and when the input voltage to either one of the comparators is higher than the reference voltage for that comparator, the operational amplifier goes into saturation and produces a signal that is used to trigger the flip-flop. The flip-flop then controls the output state of the timer, as conventionally known in the art. For a greater understanding of the 555 timer and circuits employing this device, references made to the publication 110 *IC Timer Projects* by Jules H. Gilder, published by Hayden Book Company, Inc. of Rochelle Park, N.J., 1979 edition, which is incorporated by reference herein. Timers used herein may be, for example, conventional ICM 7555 General Purpose Timers such as manufactured by Intersil.

To provide a basic understanding of many of the circuit descriptions which follow, th eight-pin 555 timer will briefly have the pin functions described. Pin 1 is the ground pin and gets connected to the negative side of the voltage supply while Pin 2 is the trigger input. When a negative-going pulse causes the voltage at the trigger input to drop below one-third of $V_{cc}$, the comparator to which this input is connected causes the flip-flop to change state, causing the output level to switch from low to high. The trigger pulse must be of shorter duration than the time interval determined by the external RC. If this pin is held low longer than that, the output will remain high until the trigger input is driven high again.

Pin 3 is the output pin and is capable of sinking or sourcing a load requiring up to 200 mA of current. Pin 4 is a reset pin that can be used to reset the flip-flop that controls the state of the output pin 3. Pin 5 is the control voltage input and by applying a voltage to this pin it is possible to vary the timing of the device independently of the RC network.

Pin 6 is the threshold input. This pin resets the flip-flop and consequently drives the output low if the voltage applied to it rises above two-thirds of the value of the voltage applied to pin 8. Pin 7 is the discharge pin. It is connected to the collector of the NPN transistor. The emitter of the transistor is normally connected to ground, so that when the transistor turns "on", pin 7 is effectively shorted to ground. Pin 8 is the power supply pin and is connected to the positive side of the supply.

Figure 35:
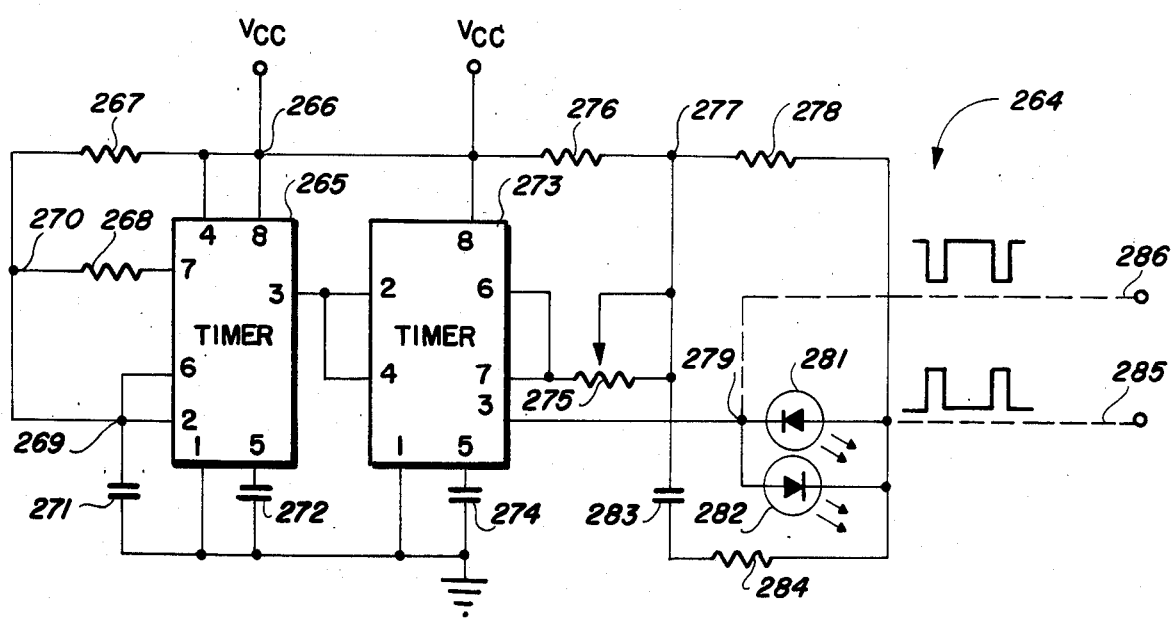
FIG. 35 is an electrical schematic diagram of one embodiment of a timing and sequencing circuit useful in driving the light strings of the present invention.

FIG. 35 shows one embodiment of a variable duty cycle control circuit 264 of block 256 of FIG. 34 employing first and second 555 timers 265 and 273, respectively, and external circuitry. Timer 265 has the supply pin 8 connected through a node 266 to the positive voltage reference $V_{cc}$. Node 266 is connected directly to the reset pin 4 and to one terminal of a resistor 267 whose opposite terminal is connected to node 270. Node 270 is connected through resistor 268 to pin 7, the discharge pin. Furthermore, node 270 is connected directly to node 269 which is connected directly to the trigger input P2 and the threshold input P6. Node 269 is also connected through a capacitor 271 to ground. Pin 1, the ground pin, is connected directly to ground and Pin 5, the control voltage pin is connected to ground through capacitor 272. The P3 output pin of timer 265 is connected directly to the P2 trigger pin and the P4 reset pin of the 555 timer 273.

Timer 273 has the supply pin, P8, connected to the voltage supply $V_{cc}$ through Node 266; the ground pin, P1 connected directly to ground; and the P5 control voltage pin connected to ground through capacitor 274. The threshold pin P6 and the discharge pin P7 are commonly connected together and to one terminal of a variable resistor or potentiometer 275 whose opposite terminal is connected to a node 277. The supply pin P8 of timer 273 is also connected to node 277 through resistor 276. Node 277 is further connected to an output 285 through the series combination of capacitor 283 and resistor 284. Node 277 is also connected to the output lead 285 through resistor 278. The output pin, Pin 3, is connected directly to a node 279, and node 279 is connected to the second output lead 286; to the cathode of the first light-emitting diode 281 whose anode is connected to output lead 285; and to the anode of a second light-emitting diode 282 which is connected in parallel and reverse polarity to the first light-emitting diode 281. The cathode of light-emitting diode 282 is then connected to the lead 285.

The circuit of FIG. 35 employs the first timer 265 configured in the astable mode with the reset locked continually on. Capacitor 271 establishes the timing of the device while capacitor 272 provides noise immunity and the like. The timer 265, in the present circuit, functions to supply a train of clock pulses for establishing the rate of change of the output. The second timer 273 serves as a driver and duty cycle controller wherein the potentiometer 275 may be used to vary the duty cycle of the DC output or pulse width or duration of both the positive and negative portions of the pulse train for enabling the circuit to be used to select predetermined duty cycles for the output signal, as known in the art.

FIG. 36 is a second embodiment of a simplified control circuit for driving the sequencing of the bi-color or tri-state light strings of the present invention. The main components of the sequencing circuit 287 are the 555 IC timer 288 and the divide-by-ten counter/decoder 297. Timer 288 has the supply pin, P8 and the reset pin, P4, commonly connected to a node 289 to a positive voltage source +V. Node 289 is connected through a resistor 291 to the variable tap of a potentiometer 292. One terminal of potentiometer resistor 292 is open while the opposite end is connected to a node 293. Node 293 is connected directly to the discharge input, P7 of the Timer 288 and through a resistor 294 to a node 295. Node 294 is commonly connected to P2, the trigger input and P6, the threshold input of the timer 288. Node 295 is then connected to ground through a capacitor 296 while P1, the ground pin is also connected directly to ground.

The output, taken at P3, of the timer 288 is connected directly to the pin 14 input of the counter 297. Pins 8 and 13 of counter 297 are commonly connected to ground while pins 3, 2, and 4 serve as the first, second, and third count outputs 298, 299, and 301, respectively, of the counter 297.

Output leads 298, 299 and 301 serve to operate a set of first, second and third normally-open switches 202, 203, and 204, respectively, and the output terminals or contacts of the switches 202, 203, 204, are connected to a first, "R" or "RED" output lead 305, a second output lead 307 which is the "Y" or "Yellow" output lead, and to a third output lead 306 which is the "G" or "Green" output. Furthermore, the opposite terminals of the switches 202, 203, and 204 are connected through normally-open switch arms, elements or members to a positive source of DC voltage +V, an oscillating or rapidly pulsed positive voltage source Vc, and negative DC input voltage source −V, respectively. The counter may be, for example, a conventional MC 14017B Decade counter/Divider device manufactured by Motorola Semiconductor Products, Inc. of Austin, Tex.

The sequencer circuit 287 of FIG. 36 provides a way of automatically turning a whole string of devices on and off in a sequence, automatically. The timer 288 is used in the astable mode to generate a string of clock-like pulses which are fed to a divide-by-ten counter/decoder 297. The counter/decoder 297 is really the heart of the sequencer, and for each pulse it receives at its input at pin 14, it generates each of the ten possible count outputs, in turn, for one complete clock period. By connecting to different outputs to a relay through a transistor driver, as conventionally known in the art, it is possible to turn devices on and off automatically. The three count states represented by the outputs 298, 299, and 301 will sequentially close the switches 202, 203, and 204, in sequence, while returning the previously closed switch to the open position so that the sequence of colors represented by leads 305, 307, and 306, respectively, are generated in the desired sequence. It will, of course, be understood that any desired sequence can be chosen.

FIG. 37 represents a complete control circuit 308 for driving the light strings 269 of the present invention. At the heart of the system is a 555 IC timer 288 and a conventional divide-by-ten counter 297. Timer 288 is operated in the astable mode so it must be continually retriggered. This is done by connecting the P2 trigger input to the P6 threshold input at node 295. In addition the timing resistor is now split into two separate resistors 294 and 292, with their junction point connected to the P7 discharge terminal. The P8 supply pin and the P4 reset pin are commonly connected at node 289. When power is applied to the circuit, the trigger P2 and threshold P6 inputs are both below the $\frac{1}{3}$ +V internal reference, the timing capacitor 296 is uncharged, and the output is high. The output stays high for a period of time determined by the RC time constant of resistors 291, 292, 294, and capacitor 296.

At the end of this timing period, the voltage on the timing capacitor 296 will have reached the internal reference $\frac{2}{3}$ +V at node 289, and the upper comparator in the timer 288 will trigger the internal flip-flop, and the capacitor 296 will begin to discharge through resistor 294. As the value of the voltage on the discharging capacitor reaches the $\frac{1}{3}$ internal reference +V at node 289, the timer retriggers itself and again starts to charge up to $\frac{2}{3}$ +V at node 289 voltage. This time, the time required to reach $\frac{2}{3}$ +V at node 289 is less than the previous time because the charging cycle is not starting from zero voltage, but from $\frac{1}{3}$ +V. This is adjustable by variable resistor or potentiometer 292, which limit is set by resistor 291. Pin 3 of timer 288 outputs such pulses into counter 297 at pin 14. The counter 297 may be a five-stage Johnson decade counter with built-in code converter. The ten decoded outputs are normally low, and go high only at their appropriate decimal time period. The output changes occur on the positive-going edge of the clock pulse at pin 14. The P13 clock enable pin is set to negative with pin 8, for continuous operation. The pin 7 output is the third counter output in the coded output chain and is wired back to the P15 reset pin to reset the counter 297 at the fourth count pulse. Pin 3 is the first count pulse that is output into dropping resistor 309 and is tied to spurious filter 312 at node 311.

The second counter output at pin 2 is not used as the mechanical function of the relay 316 automatically provides this state. The third counter output cycle is at pin 4 which is tied to dropping resistor 607 and into filter capacitor 606. The resistors 309 and 607 drop the counters output voltage for minimum biasing for minimum current draw, but still enable correct conduction of relay driver transistors 313 and 604 respectively. Resistor 314 sets correct current level for operation of relay 316 and within safe limits of the transistor 313 operation; diode 315 is for protection to block any back-EMF resulting from current induction from relay 316 during turn off state; and this current is bypassed through clamping diode 317 to the negative or ground connection.

An exact duplicate circuit is used to drive relay 601, consequently using driver transistor 604 to increase current to relay 601 using resistor 605 blocking diode 603 and clamping diode 602. The counter 297 can only drain 10 milliamps of current, and drive transistors 313 and 604 are used to increase drive current by using NPN devices in the emmiter follower as current amplifiers only. The supply pin and reset pin are commonly connected through a node 289 to a regulated power supply $+V_R$. Node 289 is connected through a resistor 291 to the variable tap of a potentiometer or variable resistor 292 which has one terminal open and the opposite terminal connected to node 293. Node 293 is also connected to the discharge pin P7 and through a resistor 294 to node 295.

Node 295 is commonly connected to the trigger pin P2 and threshold pin P6 of the timer 288 and also to ground through a capacacitor 296. Ground pin P1 is connected directly to ground and the output pin P3 is connected to the P14 input of the counter 297. The supply pin, pin P16 of the Counter 297, is connected directly to the positive voltage supply $+V_R$ while pins P7 and P15 are commonly connected together and pins P8 and P13 are connected to ground. The output pin, P3 pin 3, is connected to a node 311 through a resistor 309. Node 311 is connected to ground through a capacitor 312 and to the base of a npn transistor 313. The collector of transistor 313 is coupled to a positive source of DC potential +V through a resistor 314 while the emitter is connected to the anode of a diode 315. The cathode of diode 315 is connected to ground through the parallel combination of an inductor 316 and diode 317 with the anode of the diode 317 being connected to ground and the cathode being connected to the cathode of the diode 315.

A voltage supply circuit is also provided wherein an input 318 which supplies a 110 V AC input to a primary transformer coil 319 of a transformer 320 which may be, for example, a conventional F-359XP power transformer such as that manufactured by Litton Industries, Inc. The transformer 320 output is wired with the center tap grounded or negative, for supplying full wave rectification of alternating current into direct current. The resistor 327 is a surge protection resistor for protection of dioded 328 and regulator 331 during power-up. Capacitor 329 and 335 are for spurious spike suppression and diode protection; capacitor 332 is for input filtering for the voltage regulator 331; and the output filter capacitor 333 is for final filtration of the $V_R$ supply line. V is an unregulated dc power supply for used for the higher currents supplied directly through relay 261. Straight AC power is taken from nodes 337 and 326 via resistor 346 which sets overall current for all LED's used on three strings. The transformer 320 has a core 321 and a secondary 322 including secondary transformer coils 324 and 325. One terminal of the secondary coil is connected to a grounded center tap 323 which is also connected to one terminal of the secondary transformer coil 325. The opposite terminal of coil 324 is connected directly to node 326 and node 326 is connected through resistor 327 to a node 330. Node 330 is connected to the input of a conventional voltage regulator 331, such as a through the parallel combination of diode 328 and capacitor 329. Diode 328 is connected or poled with its anode connected to node 330 and its cathode connected to the input of the voltage regulator 331. The input of the voltage regulator 331 is connected to ground through capacitor 332 and the output of the regulator 331 is connected to ground through a capacitor 333 and to a positive source of potential $+V_R$. The voltage regulator 331 may be, for example, an MC7812 device manufactured by Motorola, Inc.

The second terminal of the second secondary transformer coil 325 is connected to node 337, and node 337 is connected to a positive source of potential $+V_R$ through the parallel combination of capacitor 335 and diode 334 in series with resistor 336. The diode 334 is poled with its cathode connected to one terminal of resistor 336 at the voltage regulator 331 input, and its anode connected to node 337. The node 326 is connected through lead 338 to a first normally-open switch contact node 341 while node 337 is connected to a normally-open switch contact node 347 through lead 339 and resistor 346. Resistor 346 is used to set the intensity balance of the AC signal to the positive and negative DC signals.

The first switch 342 has a first normally-opened switch contact 343 and a second normally-closed switch contact 344, and the second switch 348 has a normally-opened switch contact 349 and a normally-closed switch contact 351. The switches 342 and 348 connect switching nodes 341 and 347 to a second set of switches 255 and 256, respectively, and to a nodes 263, 264 via leads 345, 352, respectively. Lead 253 connects normally-closed switch contact node 347 to the normally-closed switch contact 261 which is connected through node 262 to a positive voltage supply +V. Node 262 is connected directly to the normally-opened contact 257 of the switch 255 while the normally-closed second contact 258 of switch 255 is connected directly to ground and to the normally-opened switch contact 259 of switch 256. The normally-closed contact 261 of the switch 256 is connected to the voltage supply node 262 and through the switch arm and lead 254 back to switch node 351, as previously described. Similarly, the positionable switch arm of switch 255 is connected directly to the normally-closed switch contact 344 of switch 342, as previously described.

Lead 345 connects the positive voltage supply node 341 to node 263, and node 263 is connected through a plug-like connecting means 265 to supply power to the Christmas tree light strings 269 of the present invention through connector 267. Similarly, lead 352 connects the negative voltage supply node 357 to a node 264, and node 264 is connected through the plug-like connector 266 to the Christmas tree light sets 369 via lead or wire 268.

Node 263 is connected through a resistor 271 to a node 272, and node 272 is connected to the anode of a first light-emitting diode 273 which has, for example, a first different and distinct characteristic color, such as red, and the cathode of light-emitting diode 273 is connected directly back to node 264. Similarly, node 264 is connected to the anode of a second light-emitting diode 274, which also has a separate different and distinct characteristic color, such as green, and the cathode of LED 274 is connected back to node 272.

As previously described, the operation of the control system 308 of FIG. 37 is relatively simple with the timer 288 supplying a series of clock-like pulses to the counter 297. At predetermined selected counts, (not necessarily of the same duration) the output at pin 3 drives NPN transistor 313 to drive the relay coil 316 supply positive or negative DC voltage to the indicator LED's 273 and 274 and to the tree lights 269 for driving first one, and then the other, alternately, with positive and negative DC potential. The pin 4 output of counter 297 is connected through a drive transistor to drive relay coil 601 to produce rapidly oscillating (for example, 60 cps) AC-type signals from transformer 320 via nodes 326 and 337 for rapidly switching between LED's 273 and 274 to produce a third different and distinct characteristic color resulting from such a mixture or combination, such as yellow in the present example. This gives the LED's the appearance of producing, sequentially, three separate and distinct colors of three, perhaps different, durations and repeating the cycle indefinitely for decorative effects and the like. The LED's 273 and 274 serve as indicators and illustrate exactly what the sequence at the Christmas tree light strings 269 is at any given time.

The relay coil 601 is connected in parallel with a clamping diode 602 with the anode of the diode 602 connected to ground and the cathode connected to the cathode of a series diode 603. The anode of blocking diode 603 is connected directly to the emitter electrode of an npn transistor 604 whose collector is connected through a resistor 605 to a regulated source of potential $+V_R$. The base of transistor 604 is connected to ground through a capacitor 606 and to one terminal of a resistor 607 whose opposite terminal is connected to the P4 output of the counter 297. This provides for operation of the relay 601 in accordance with the counter output for oscillating or sequencing the stepped-down AC input signal to produce the third color, as previously described.

The timer 288 produces a repetitive output of pulses whose rate can be controlled to determine how fast the lights will sequence their color changes, from red to green to yellow. The counter 297 counts the output pulses from timer 288 and advances one count for each incoming pulse from the timer. The relay 316 is normally-closed and will automatically light one color (red) and when power is applied by the first count is energized and switches to green on the first count. On the second count, the relay is de-energized by loss of the positive signal into the transistor 313 and relay 316 goes normally-closed which is one of the regular colors, red or green, as wired. Then upon the counter advancing to the third count, relay 601 is energized disconnecting DC reverse power from relay and connecting the tree lights output 267, 268 directly to AC power from the transformer at nodes 326 and 337, bypassing all forms of rectification, thus putting alternating current to both LED's 273, 274 which then light and produce the combination or light mixtures color yellow.

This sequence then goes on to repeat via the counter's counts. The voltage regulator 331 sets very well-filtered and regulated voltages $V_R$ to operate the timing circuit 288 and counter 297 and relay pull-in activations, well within the fluctuations which will occur due to load changes, by switching via relay 316 at the transformer 320 and diodes unregulated DC signals to light the string of LEDs 269 which are the main loads in this circuit. This enables the timer 288 and counter 297 to function without fluctuation of timing or loss of counting or errors due to surges as they have all been well-filtered and regulated. The relays were designed to handle up to 1 amp of current and with present specifications of LED loads as designed, will handle a 169 LED tree easily which requires about 1000 ma or current in the present design.

FIG. 38 represents still another control circuit 375 for operating the Christmas tree light strings of the present invention. The control system 375 again includes a conventional 555 IC timer 288 and a conventional divide-by-ten counter 297. Additionally, the circuit 375 includes a bilateral switch IC 381, an RS latch 403 a Schmitt trigger 395 and a pair of NAND gates 396, and 399.

The supply pin P8 and reset pin P4 of timer 288 are connected through node 289 to a positive source of potential +V. Node 289 is connected through a resistor 291 to a variable tap of a potentiometer resistor 292 which has one terminal open and the opposite terminal connected to node 293. Node 293 is connected directly to the P4 discharge input and through a resistor 294 to node 295. Node 295 is commonly connected to the threshold input P6 and trigger input P2 of the timer 288 and to ground through a capacitor 296. The ground pin P1 is also connected directly to ground, while the output P3 is connected to the P14 input of the counter 297.

The counter output from pin 5 is connected to the anode of a diode 376 whose cathode is commonly connected to input pins P6 and P12 of the bilateral switch 381. Similarly, the output pin, P2 is connected to the anode of a second diode 377 whose cathode is commonly connected to the P5 and P13 inputs of the bilateral switch 381. Pins P1, P11 and P14 of the bilateral switch 341 are connected to a positive source of potential +V while pins P1, P7 and P8 are connected directly to ground.

The output from pin P10 of the bilateral DPDT switch IC 381 is connected to the anode of a blocking diode 382 whose cathode is connected to node 384, while the pin P3 output is connected to the cathode of a blocking diode 383 whose anode is connected directly to node 384. Node 384 is connected through a balancing resistor 385 to one output node 390 and then to one input lead 389 of the tri-state light-emitting diodes 392, representing the light strings of the present invention. Similarly, the pin P7 output is connected to the cathode of diode 386 while the anode of diode 386 is connected to node 388, and the pin P2 output is connected to the anode of diode 287 whose cathode is connected to node 388. Node 388 is connected to input lead 391 of the tri-state device 392. The bilateral DPDT switch 381 may be, for example, a conventional MC14066B Quad Analog Switch such as that manufactured by Motorala, Inc. of Austin, Tex.

The pin P4 output of counter 297 is connected through a voltage divider resistor 378 to node 379 which is grounded through resistor 393. Node 379 is also connected through lead 394 to a first input of a two-input Schmitt trigger 395. A power supply input is connected to a source of potential +V while a ground input is connected to ground. The output of the Schmitt trigger 395 is connected directly to both inputs of a logical NAND gate 396 and to node 397 through resistor 398. Node 397 is connected to the second input of the Schmitt trigger 395 through resistor 402 and to the output of gate 396 through capacitor 401. The output of gate 396 is also connected in common to both inputs of another logical NAND gate 399 which functions as an inverter and to the pin P6 input of an RS latch 403, which performs the DPDT operations at a rate determined by the RC timing of the gated oscillator 395, 396, 399, while the output of the NAND gate 399 is connected to the pin P1 input. The Schmitt trigger 395 together with gates 396, 399 and the included circuitry, is configured to operate as a gated oscillator. The supply pin P14 is connected to a positive source of potential +V while the pin P2 and pin P4 outputs are commonly connected together through a coupling capacitor 404 to node 390, as previously described. Similarly, the pin P3 and pin P5 outputs of latch 403 are commonly connected through a coupling capacitor 405 to lead 389 and hence to the input lead 391 and node 388 of the tri-state LED 392. The Schmitt trigger 395 may be, for example, a conventional MC 14093B Quad 2-input "NAND" Schmitt trigger such as that manufactured by Motorola, Inc. of Austin, Tex.

In operation, the timer 288 produces the sequence of pulses establishing the rate of change of the circuit while the counter 297 counts the pulses to sequence the output between three sequential counts which in turn switch a first DC polarity signal to one set of LED's having a first different distinct characteristic color and through a reverse polarity to a second set of LED's having a second different and distinct characteristic color. Meanwhile, the third output of the Counter 297 is supplied to the gate circuitry which is configured as a gated oscillator to trigger the latch 403 so as to alternate, rapidly between the previously described reverse polarity DC states to produce the visual effect of a combined third different and distinct characteristic color, as previously described.

Resistor 292 is the R in the R/C circuit of resistor 292, resistor 293, and capacitor 296. Resistor 294 sets a modest duty cycle for the timer 288. Resistor 291 set the range of potentiometer 292. Potentiometer 292 is the frequency control of the timer 288 and puts the timer 288 in a range for producing the actual visable optimum aesthetic range of color changes. The output of the timer 288 is sequenced by counter 297 for a 1, 2, 3 count only; the rest of the counter is ignored. Diodes 376 and 377 are blocking diodes for any back EMF from switch 381, as it is a bilateral switch and can connect feedback signals to counter 297. The resistors 378 and 393 set a lower voltage divider network at node 379 for lead 394's input into the Schmitt trigger 395.

The 1st count on pin 5 of counter 297 will output a positive voltage into switch 381 which is wired to use two of the four switches in this device to double its current-handling capabilities. The switch 381 is wired in a DPDT fashion (double pole, double throw) to enable a reversing of polarities at the outputs P2, P3, P7, P10 of switch 381. Diodes 382, 383, 386, and 287 are again back EMF blocking diodes to disallow any reverse current accidental inputs at the output from damaging any circuitry. The resistor 385 is selected to match the difference in intensity between green and red LED's as they are not matched for visability by the factories and must be adjusted to suit completed light strings.

On the third count from counter 297 on pin 4 into the divider network of resistors 378 and 393, the input is used to gate on the oscillator 396, and the 395 is such a gate. It places the Schmitt trigger 395 in a NAND function which then allows NAND gate 396 to start oscillating at a frequency set by the feedback R/C network including capacitor 401 and resistor 398, which selects the frequency high enough to pass through pass coupling capacitors 404 and 405. The NAND gate 399 is used to invert the signal into the DPDT relay 403 and not falsly trigger and cause latch up and consequential damage to latch 403.

The R/S latch 403 will function at frequency set by gate 396 and deliver a 50% positive, 50% negative duty cycle to the load 392. It can also be seen here that the diodes 382, 383, 386, and 287 are used in blocking the signal presented from capacitors 404 and 405. This shows how an effective control arrangement can be constructed from a single polarity power supply or battery and using NO high current relays coils to do switching but instead, using an all solid state configuration utilizing only low current devices. This also gives very precise timing control and fixed duty cycle to the tree lights. It is a very accurate and stable method of achieving the desired results.

FIG. 39 shows a first embodiment of a driver circuit 400 such as that represented by the block 257 of FIG. 34. The driver circuit 400 uses a pair of Darlington-configured power transistors 406, 409, and 407, 408. A positive source of potential $V_{cc}$ is connected to a node 417 and node 417 is connected through a resistor 411 to the collector of an npn power transistor 406 whose emitter is connected to an output node 415, and whose base is connected through a resistor 414 to a node 413. The node 413 serves as an input node to the first Darlington pair including power transistors 406 and 409. Input node 413 is connected to the input lead 412 and through a resistor 416 to the base of npn power transistor 409.

The input supply node 417 is connected through a resistor 418 to the collector of npn power transistor 407 whose emitter is connected to the output node 424 and whose base is connected through a resistor 423 to input node 421. Input node 421 is connected to input lead 419 and through resistor 422 to the base of npn power transistor 408. The collector of power transistor 408 is connected directly to the first output node 415 which supplies output drive power to the string of Christmas tree lights or the like of the present invention via output lead or wire 425. The emitter of power transistor 408 is commonly coupled to the emitter of npn transistor or power transistor 409 and then to ground $V_{DD}$. The collector of power transistor 409 is connected to the second output node 424 which supplies output power of a reverse polarity to that of output node 415 to the light strings of the present invention by a lead 426.

In operation, the first and second npn power transistors 406 and 409, respectively, form a first pair while the second npn power transistors 407, 408, respectively form a second pair. When a signal having a first polarity is received on input lead 412, transistors 406 and 409 conduct to pass current from the voltage source $V_{cc}$ to output node 415 for supplying the first polarity drive signal to the load via lead 425. Since node 413 also connects the input signal on lead 412 to power transistor 409 through lead 416, transistor 409 is also switched on so that the output node 424 and the signal on lead 426 is pulled to ground or switched off.

Simultaneously, since the opposite polarity signal is present on lead 419, node 421 maintains transistors 407 and 408 off to insure that the signal output node 424 is low or off while the signal is also passed through resistor 422 to maintain output transistor 408 off as well. As soon as the input signals at 412, 419 indicate that a polarity reversal has occurred, the signal at node 413 goes low to turn off transistor 406 and pull the first output node 415 low. Simultaneously, the low at node 413 maintains transistor 409 off while the opposite polarity signal at node 421 turns transistor 408 off through resistor 422.

Therefore, output node 415 is held low but the input signal on lead 419 is supplied to the base of transistor 407 causing it to conduct power from the positive source of potential $V_{cc}$ through resistor 418 and through the conducting transistor 407 to the output node 424. The reverse polarity input signal present at nodes 413, 421 is conducted to the light strings of the present invention via lead 426 so that as the different pairs of power transistors 406, 409 and 407, 408 are alternately turned off and on, the polarity of the output drive and output leads 425 and 426, respectively, alternates in polarity as well. This enables a set of monostable light-emitting diodes to be alternately blinked on and off or a string of bi-color or tri-state LED's to be sequenced for producing, sequentially first, second and third different and distinct characteristic colors as previously described.

FIG. 40 shows another embodiment of the polarity reversal switching circuit of block 257 of FIG. 34 which uses a power MOSFET circuit 427 that functions as a double-pull, double-throw (DTDT) switch. In FIG. 40 the active elements include four power MOSFET power transistors 428, 429, 431, and 432, respectively. A first input lead 433 is connected through a node 435 to the gate electrode of the third MOSFET transistor 431 and through a resistor 430 to the gate electrode of the second MOSFET transistor 429. Similarly, the second input lead 434 is connected through a node 436 to the gate electrode of the fourth MOSFET transistor 432 and through a resistor 440 to the gate electrode of the first MOSFET transistor 428. The source electrode of MOSFET transistors 428 and 431 are directly connected to a source of potential $+V$ while the source electrode of MOSFET transistors 429 and 432 are commonly coupled directly to a negative source of potential $-V$. The drain electrodes of the first and second MOSFET transistors 428 and 429, respectively, are commonly connected, and the common connection is supplied via output lead 437 to one electrical connector of the wiring string apparatus of the present invention. Similarly, the train electrodes of MOSFET transistors 431 and 432 are commonly connected together, and the connection is supplied via output lead 438 as the reverse polarity input of the light strings of the present invention.

The MOSFET circuit 427 provides very fast switching times with the restriction that the input must have make-before-break capability. Due to the extremely low leakage current of the MOSFET transistors, this circuit is most efficient for switching relatively high currents at relatively high repetition rates. The operation of the circuit itself is conventional and will not be described in detail herein. However, when a signal appears on input lead 433, MOSFET transistors 429 and 431 conduct, so that transistor 429 supplies negative potential to the first output lead 437 while transistor 431 supplies positive current on the second output lead 438. However, when the input signal on lead 434 is high, transistors 428 and 432 conduct to connect the positive potential to input 437 and the negative potential to lead 438 thus polarity reversing the output signal for use in driving the light strings for sequencing and the like as previously described.

FIG. 41 shows still another embodiment of the polarity reversal drive circuit 439 of the present invention. The circuit 439 includes a solid state, single chip DPDT relay-operated switch 450. The switch 450 has an input 441 with one terminal connected to one end of a relay coil 442 while the opposite terminal of the relay coil 442 is connected back to the second input terminal of input 441. The relay coil 442 operates the switching mechanisms or switches as hereinafter described. The DPDT relay-operated switch 450 includes first, second, third, fourth, fifth and six switch inputs 443, 444, 445, 446, 447 and 448, respectively. Switch node 443 is connected to the normally-closed contact 444 while the normally-closed contact is connected to the third switch input node 445. Similarly, the fourth switch input node 446 is connected to the normally-closed switch contact associated with the fifth switch input node 447 while the sixth switch input node 448 is connected to a normally-closed contact.

Switch input nodes 444, and 448 are connected to a positive source of DC potential +V via node 449 while switch input nodes 447 and 445 are connected to a negative source of potential −V via node 451. These supply the DC inputs to the switch 450. Nodes 443 and 446 supply opposite portions of the AC waveform from the relay coil 442 directly to the first and second output leads 452 and 453, respectively. When the signal appears at the first input terminal of input 441 the relay coil 442 opens the switch contact at node 444 to disconnect the switch from the positive source of potential and closes switch 445 to connect the switch to the negative source of potential so that the negative DC signal is supplied via node 443 to the output 452. Simultaneously, the relay coil 442 activates the second portion of the switch so that the normally-closed contact 447 opens to disconnect node 446 from the negative source of potential while normally-opened switch associated with input 448 closes to complete a current path between the positive source of potential and the second output lead 453.

When the signal at the input 441 is reversed, the relay 442 closes the normally-closed contact 444 while opening the normally-opened contact associated with node 445 so as to connect the positive source of DC potential +V to lead 452 via node 443 while disconnecting the negative source of potential −V from node 445. Likewise, the relay coil 442 closes switch 447 to supply the negative source of potential to output 453 via node 451 while opening the normally-open contact 448 to break contact with the positive source of potential. Therefore, "0" or "1" single polarity input signals produce reverse polarity drive current outputs on leads 452 and 453 for driving the Christmas tree light strings or the like as previously described.

FIG. 42 shows still another embodiment of a double-pole double-throw or DPDT switch 450 used to drive the light strings of the present invention. The semiconductor chip or IC 450 has an input 454 with one terminal connected to input node 455 and the opposite terminal connected to input node 456. The DPDT switch 450 includes first, second, third and fourth switches 457, 458, 459, and 460, respectively, and each switch has a normally-opened switch arm or switch element 462, 463, 464, and 465, respectively, an output contact and a switch input, as known in the art.

With reference to the pins or pin numbers on the integrated circuit chip 450, which are used solely for explanation and for the purpose of brevity, a pin will be designated by the letter "P" while the pin number will be placed in arabic numeral form immediately thereafter. A positive source of DC potential +V is commonly connected to the switching arm or moveable switch element 462 and 463 of switches 457 and 458, respectively, through a node 466 while the negative source of DC potential −V is connected to the switch element 464 and 465 of switches 459 and 460, respectively, through node 467.

The first input terminal of input 454 is connected to input node 455 and connected directly to the switch element 462 and 463 of the first and third switches 457 and 459, respectively, while the opposite terminal of the input 454 is connected to an input node 456 which is commonly connected to the switch input of switches 458 and 460, respectively for supplying the opposite polarity signal thereto. The switch output terminals of switch 457 is connected to the anode of a diode 468 whose cathode is connected to an output node 473, and node 473 is connected directly to the first output lead 475. Similarly, the switch output terminal of switch 460 is connected to the cathode of a diode 472 whose anode is connected to output node 473. Further, the switch output from switch 458 is connected to the anode of a diode 469 whose cathode is connected to the second polarity reversal output 476 through a node 474, while the switch output of switch 459 is connected to the cathode of a diode 471 whose anode is commonly connected to node 474.

In operation, circuit 450 provides the necessary drive as well as rectification and back EMF protection, and when a first polarity signal is present at node 55 and the opposite polarity at node 56, switch elements 462 and 464 close so that the positive source of potential is connected through diode 468 to output lead 475 while diode 471 blocks positive DC current. Similarly, node 456 connects the opposite polarity signal to the switch input of switches 458 and 460 for maintaining the normally-opened switch element 463 and 465 open to disconnect the positive and negative sources of potential from node 74 while closing switch element 464 to conduct negative DC current to the output node 474 through diode 471.

When the input signal is zero or reversed, the zero or negative signal at node 455 maintains the normally-opened switch elements 462 and 464 open to disconnect the positive source of potential from diode 468 and 471. The positive signal of node 56 closes switch elements 463 and 465 to supply the positive DC signal to output lead 475 through diode 469 and the negative DC signal to the first output lead 475 through closed switch 465 and diode 472.

FIG. 43 represents a Silicon-Controlled Rectifier (SCR) circuit 470 for controlling the drive of the light strings of the present invention and having rectification capabilities. A first AC input lead 480 is commonly connected to the anode of a first SCR 477 and the anode of a second SCR 479. The cathode of LED 477 is connected to the anode of SCR 478 and the common connection therebetween is supplied via output lead 284 to supply drive current to the light strings of the present invention. The cathode of SCR 478 and the cathode of SCR 481 are commonly connected to a second AC input via lead 490. The cathode of SCR 479 is directly connected to the anode of SCR 481 and this connection supplies the first polarity output signal on output lead 483.

A positive source of DC potential +V is commonly connected directly to the gate or trigger of SCR 279 and SCR 278 while a negative source of DC potential −V is connected directly to the gate or trigger electrode of SCRs 477 and 481.

In operation, the DC switching polarities represented by the positive and negative sources of DC potential alternately turn on SCR's 478 and 479 to make out lead 483 positive and lead 484 negative, respectively, while the opposite input causes SCR's 477 and 481 to conduct for connecting the negative portion of the AC waveform on lead 490 to the output lead 483 and the positive portion of the AC waveform on lead 480 to the output 484 via conducting SCR 477. In this manner, the output can be switched or sequenced between opposite polarity states and used to drive the light strings of the present invention with switched or rectified AC signals.

Figure 44:
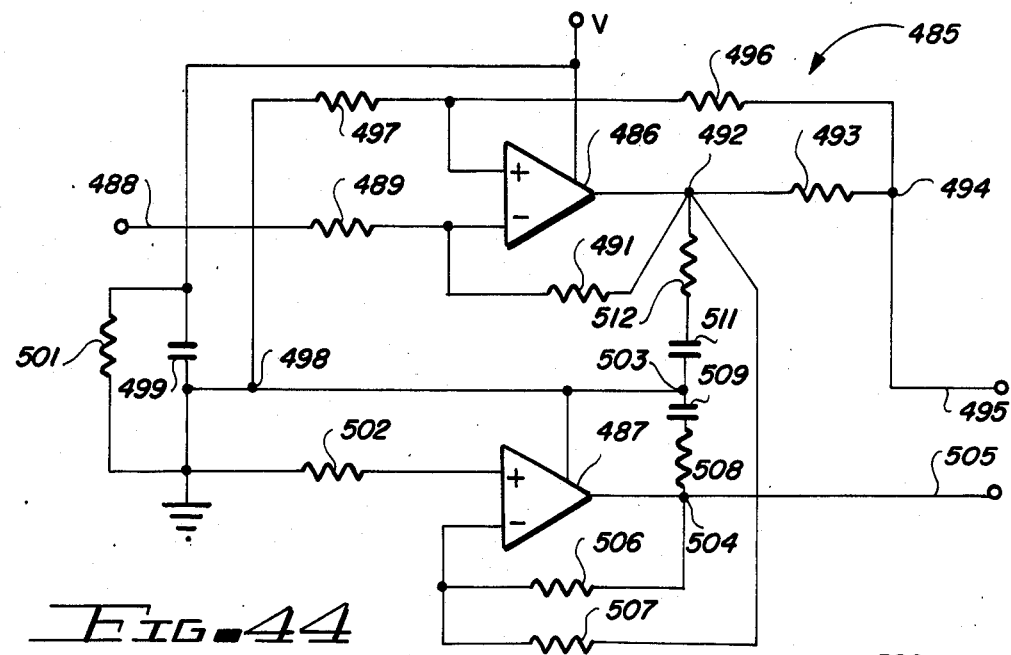
FIG. 44 is an electrical schematic diagram of one embodiment of a driver circuit useful in amplifying the switching output and providing the necessary drive current to the light-emitting diodes of the light string assembly of the present invention.

FIG. 44 represents a first embodiment of an output driver circuit 485 useable with the polarity reversal circuits previously described. The driver circuit 485 includes a pair of operational amplifiers 486 and 487. The circuit input is taken on lead 488 which receives the timing input signals or signals from the output of the polarity reversal circuits previously described and supplies them through a resistor 489 to the inverting or negative input of amplifier 486. The output of amplifier 486 is supplied directly to node 492 and node 492 is connected in a negative feedback loop or configuration to the negative or inverting input of amplifier 486 through a feedback resistor 491. The positive input or non-inverting input of amplifier 486 is connected through a resistor 497 to node 498 and through a resistor 496 to an output node 494. Node 494 is connected to a first output lead 495 and is further connected through a resistor 493 to node 492. The operational amplifiers may be, for example, conventional L272M devices such as those manufactured by SGS.

A positive source of potential +V is directly connected to the power supply input of operational amplifier 486 which is connected to ground through the parallel combination of capacitor 499 and resistor 501. Ground is also connected through resistor 502 to the non-inverting input of the second operational amplifier 487 and node 498 is connected to the power supply input of amplifier 487. The power supply input of amplifier 487 is also connected directly to a node 503. Node 503 is connected through the series combination of capacitor 509 and resistor 508 to an amplifier output 504. Node 504 is connected in a negative feedback arrangement with a resistor 506 connecting the output node 504 to the inverting input of the amplifier 487 for feedback purposes.

Similarly, the inverting input of amplifier 487 is connected through a resistor 507 to the node 492. Output node 504 is connected directly to the second output lead 505 while output node 503 is connected to node 492 through the series combination of capacitor 511 and resistor 512.

In operation, the drive circuit 485 is responsive to the reverse polarity input signals on lead 488 to generate a plus and minus switch output which is both current-limited and overload protected. The operation of the amplifiers 486 and 487 is conventional and will not be described further herein.

Figure 45:
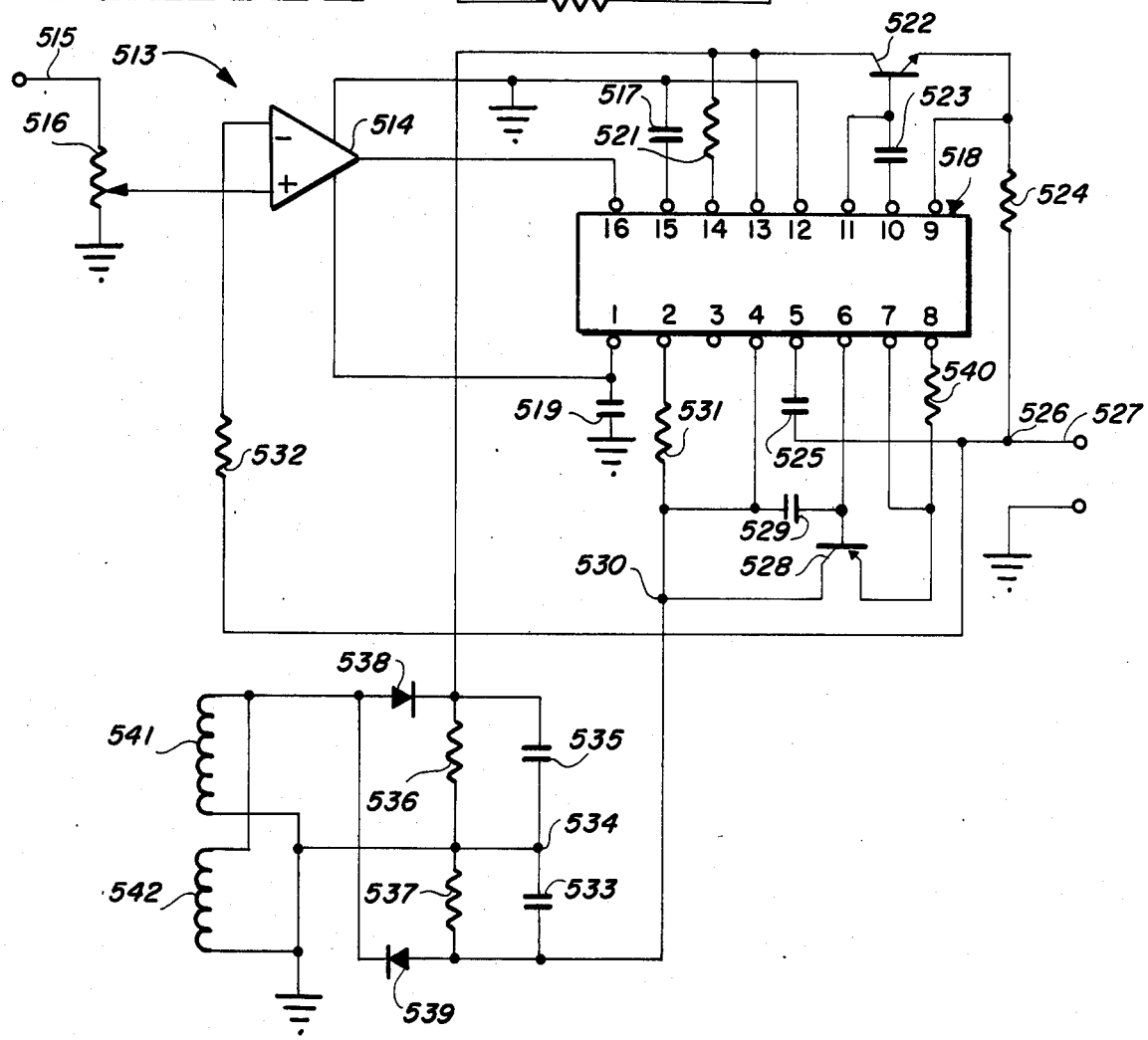
FIG. 45 is an alternate embodiment of the circuit of FIG. 44 showing another electrical schematic diagram of a circuit for controlling the operation of the light string of the present invention.

FIG. 45 is an alternate embodiment of the output driver circuit 485 of FIG. 44 representing a more sophisticated driver circuit 513. The input of the driver circuit 513 is taken from lead 515 which is connected to one terminal of a potentiometer resistor 516 whose opposite terminal is grounded. A variable tap on the potentiometer 516 is connected directly to the non-inverting input of amplifier 514 while the inverting input of operational amplifier 514 is connected through a resistor 532 to output node 526. Output node 526 is connected to the circuit output lead 527 while the opposite circuit output lead is grounded. One reference input of the operational amplifier 514 is grounded and pin P12 of IC circuit 518 is connected directly to ground while pin P15 is connected to ground through capacitor 517. The opposite reference input is connected to IC input P1 and to ground through a capacitor 519.

The integrated circuit 518 has P16 directly connected to the output of the amplifier 514; Pin 13 connected directly to the collector of an npn transistor 522; P14 is connected to the collector of transistor 522 through a resistor 521; pin P11 is connected directly to the base of transistor 522 while P10 is connected to the base of transistor 522 through a capacitor 523. P9 is connected to directly to the emitter of transistor 522 while P3 is open. P1 is connected to ground through a capacitor 519 while P2 is connected to a node 530 through resistor 531. P4 is connected directly to node 530 while node 530 is connected through a capacitor 529 and commonly connected to the base of a second pnp transistor 528 and to P6 of the IC 518. The collector of transistor 528 is connected directly to node 530 while the emitter is connected directly to P7 and to P8 through a resistor 540. The base of transistor 528 is connected directly to P6 and P5 is connected through capacitor 525 to output node 526.

A first and second transformer coil 541 and 542, respectively, are connected as follows. One terminal of transformer coil 541 is connected to the anode of a diode 538 whose cathode is connected directly to the collector of transistor 522. The opposite terminal of the first transformer coil portion 541 is connected to node 534 and to ground. The first terminal of the second transformer coil 542 is connected to the anode of diode 538 while the opposite terminal is grounded. The anode of diode 539 is connected through the series combination of resistors 436 and 437 to the collector of transistor 522 is connected directly to node 530, and simultaneously the cathode of diode 539 directly to the anode of diode 538. The anode of diode 539 is also connected to node 534 through a resistor 537 while the cathode of diode 538 is connected to node 534 through resistor 536. The anode of diode 539 is also connected to node 534 through a capacitor 533 while the cathode of diode 538 is connected to node 534 through capacitor 535.

The transformer coils 541 and 542 supply the positive and negative portions of the AC waveform to the inputs P13 and P14 and P2 of IC 518 and simultaneously to the collector of transistors 522 and 528. The transistors 522 and 528 are driven by control signals from P10, P11 and P6, respectively of the IC 518 for driving the signal on output lead 517. When the polarity of the of the input signals reverse, the output of amplifier 514 is supplied to P16 and causes the opposite conductivity of transistors 522 and 528, respectively for reversing the polarity of the output drive signal of lead 517 for use as previously described herein.

FIG. 46 represents a complete control circuit 540 useful in driving the light strings of the present invention. The main components of the control circuit 540 include a conventional 555 IC timer 288, a divide-by-ten counter 297, a bilateral switch assembly 381, and a pair of Silicon-Controlled Rectifiers 543 and 544. The 555 timer 288 has its supply input P8 and reset input P4 connected to a positive source of potential +V through node 289. Node 289 is connected through a resistor 291 to the tap of a variable resistor or potentiometer 292 having one terminal floating and its opposite terminal connected to a node 293. Node 293 is connected directly to the discharge input P7 and through a resistor 294 to a node 295. Node 295 is connected directly to the threshold input P6, the trigger input P2, and to one plate of a capacitor 296 whose opposite plate is connected to ground. The ground pin P1 is also connected directly to ground and the output P3 is connected directly to the P14 input of the counter 297.

The divide-by-ten counter 297 has P16 connected to a positive source of potential +V; P7 connected directly to P15; and both P8 and P13 commonly connected to ground. The counter outputs P2, P3 and P4 are connected via counter output leads 299, 298, and 301, respectively to the P5, P13 and P6 inputs of the bilateral switch assembly 381. P14 of the switch assembly is connected directly to the source of potential +V while P7 is grounded.

The P1, P3, and P8 outputs of the bilateral switch 381 are commonly connected to one terminal of a resistor 545 whose opposite terminal is connected directly to an AC source 463 of potential. The AC source of potential 463 is also connected to the cathode of a SCR 543 whose anode is connected to a node 549 and to the anode of a SCR 544 whose cathode is connected to node 549 through a resistor 548. The SCR's 543 and 544 are, therefore, oppositely poled to handle reverse polarity signals. The gate electrode of SCR's 543 and 544 are commonly connected to the anode of a diode 546 whose cathode is connected to P2 of the bilateral switch assembly 381 and through a resistor 548 to node 549. P4 of the bilateral switch 381 is connected directly to the junction of the anode of blocking diode 546, to the cathode of diode 547, to one terminal of resistor 548 and directly to the gate electrode of the SCR's 543 and 544.

Similarly, P9 is connected to the anode of diode 547 whose cathode is connected directly to the junction of the anode of blocking diode 546 and one terminal of resistor 548 and thence to the gate electrode of SCR's 543 and 544. Node 549 is connected through a resistor 551 to one terminal of a bi-color or tri-state LED 177 whose opposite terminal is connected to output lead 544 and to one terminal of a potentiometer 552 whose opposite terminal is grounded. Node 549 is also connected directly to the other output lead 553.

The control circuit 540 also includes its own power supply portion and includes an input 555 operatively coupled through a normally-opened switch 556 and through a fuse 557 to a selected one of two primary transformer coils 558 and 559 of a transformer 732 having a core 561. The primary coil 558 may be, for example, adapted to receive a 110 volt AC signal while the primary coil 559 is adapted to receive a 220 volt AC signal, or the like. The transformer also includes a secondary transformer coil 562 having one terminal connected to node 456 and its opposite terminal connected to node 466. Node 465 is connected to an output 463 while node 466 is connected to an output 464. Node 465 is also connected to the anode of a diode 467 whose cathode is connected to a conventional voltage regulator 572 and through a capacitor 573 to ground. Node 465 is also connected to the cathode of an oppositely-poled diode 468 whose anode is connected to ground and to the anode of a diode 469 whose cathode is connected to node 466. Node 466 is connected to the anode of a diode 470 whose cathode is connected to the junction of the cathode of diode 467 and the input of the voltage regulator 572. The output of the voltage regulator supplies a regulated DC voltage $V_{reg}$ and the output is connected through capacitor 574 to ground.

In operation, the timer 288 supplies a series of adjustable switching pulses which determine the timing or sequencing rate of the color changes of the circuit to the counter 297, and preselected counts operate the bilateral switches for polarity reversing purposes. When the count on P2 goes high on lead 298, P1 is connected to P2 of bilateral switch 381 to allow diode 546 to conduct negative pulses or ½ of the 60 cycle AC waveform reduced voltage from AC input 463. This in turn allows SCR 543 to conduct and supply voltage to illuminate one portion of the LED 177.

When counter 297 has advanced to supply a signal, when P4 of counter 297 goes high, then P6 of bilateral switch 381 connects P8 and P9 together and supplies AC signal decreased by resistor 545 from AC input 463. This allows diode 547 to conduct positive ½ AC signal to the SCR 544 and reverses polarity to produce the second and different color within the LED 177. When the counter 297 advances to the P# terminal and produces a high state at control P5 of switch 381 which connects P4 to P3, then the full wave AC from source AC1 is connected to both SCR's 540 and 543 simultaneously causing both to turn on and off on each wave front as sent to their respective gates; causing LED 177 to rapidly switch from one state to the next causing yet a third different and distinct combination-produced color from the two LED elements within LED 177. The return path for the AC wave is through regulator 552 to set the desired current and intensity on the overall tree lighting which is basically a dimmer control to achieve a dim lighting effect, if desired.

The SCR's 543 and 544 have the ability to handle large amount of AC current directly from the input transformer 561 plus have the ability to half wave rectify AC current at the same time, thus they can be controlled with little gate current to perform an on and off function of rectification and switching to a many LED'S 177 on a light string. This again enables two polarity outputs from a single polarity supply 570.

FIG. 47 illustrates another relatively simple control circuit 701 useable with the light strings of the present invention. The circuit 701 has a 110 V AC input 702 connected to opposite terminals of the primary coil 704 of a transformer 703 having a core 706 and a secondary coil 707. A fuse 705 is connected in series with the primary coil 704. One terminal of the secondary coil 707 is connected through a current or intensity control resistor 708 to the switch arm 711 of a three position switch 709. Switch 709 includes a positionable switch element 711; a first switch contact connected to the cathode of a diode 712 whose cathode is connected to node 715; a second switch contact which is connected directly to node 715 via lead 713; and a third switch contact connected to the anode of a diode 714 whose cathode is connected to node 715. Node 715 is connected to output lead 720 which is electrically connected to LED 716 via nodes 718. The opposite terminal of the secondary coil 707 is connected to output lead 721 which is electrically connected to LEDs 716 via node 719.

In operation, the AC input waveform is stepped down and supplied to the switch 709. When the switch arm 711 is closed on the first contact, diode 712 clips the waveform and passes only the negative polarity signal to the LEDs 716. With switch arm 711 positioned on the second contact, both positive and negative waveform portions are passed to note 715 so that LEDs 716, receive oscillating or rapidly changing alternate polarities for producing the third or mixed color. Lastly, when the switch arm is closed on the third contact, the positive portion of the AC waveform supplies a positive drive to LEDs 716, thereby producing three different and distinct colors from two colored LEDs.

The purpose of this circuit 701 is to show that a half wave rectification presenting unfilltered chopped 60 cycle or AC will effectively light LEDs at a 50% duty cycle or half wave and still give the full apparency of the correct result of one color on only one LED 716 on, or switch 709 put in position on contact 713 allowed full wave AC current which then would light both LEDs giving the third and combination color and reversal by diode 714 would cause the other color of LED of 716 to be energized. All this with minimum of components and the utmost of simplicity. Resistor 708 is for intensity control or maximum allowable current into said number of parrallel LEDs 716.

In FIG. 48, the AC input signal is used to produce a stepped-down AC voltage, such as 12.6 volts AC, across the secondary coil 734. When the switch element 745 is positioned on the first switch terminal at the cathode of diode 744 only the negative portion of the AC waveform is supplied to node 737 so that the SCR 736 is not switched on. With the SCR 736 off, the positive waveform portion is transmitted directly to node 741 so that a first LED portion is illuminated to produce the first different and distinct characteristic color previously described. However, when the switch element 745 is positioned to the third switch contact at the anode of diode 746, the cathode of diode 746 supplies a positive portion of the AC waveform to node 737 causing SCR 736 to be switched to a conductive state for passing the positive waveform portion to nodes 739 for illuminating the second LED portion of diodes 742, 743 for producing the second different and distinct characteristic color.

Lastly, when switch element 745 is positioned on lead 745, the non-rectified AC voltage is supplied to node 737 causing the SCR 736 to transmit during each positive waveform portion and to switch off during each negative waveform portion by the current through resistor 738. In this manner, the LED 742 and 743 are alternately illuminated with a first polarity and second polarity signal resulting from the positive and negative waveform portions of the AC input causing the first and second colors to be produced to rapidly for the human eye to see and resulting in the apparent production of a third different and distinct characteristic color as previously described.

FIG. 48 is an alternate embodiment of the circuit of FIG. 47 and utilizes SCR control. The circuit 730 has a 110 V AC input 731 to the primary coil 733 of a stepdown transformer 732 having secondary coil 734. One terminal of the secondary coil 734 is connected to a node 735 which is connected both to a positionable switch element or arm 745 of a three position switch 740 and to the anode of an SCR 736. The cathode of SCR 736 is connected to a first output node 739 and to the switch output node 337. A first switch contact is connected to the cathode of a diode 744 whose anode connects to node 737; a second switch contact is connected directly to node 737 via lead 745; a third switch contact is connected to the anode of a diode 746 whose cathode connects to node 737; and the gate or trigger electrode of the SCR 736 is connected directly to switch output node 737. Node 737 is connected through a resistor 738 to the first output node 739 while the opposite terminal of the secondary coil 734 is connected directly to the second output node 741. The LED strings are then connected to output nodes 739, 741 as previously described.

In operation, when a positive portion waveform is received at contact three via closed switch arm 745, the SCR is turned on each half cycle to pass a positive polarity signal to output node 739. When the negative portion of the waveform is received at the first contact, the SCR passes the negative portion to produce the second color. Lastly, when switch arm 745 is closed on the second contact, the rapidly oscillating waveform turns the SCR 736 on and off for rapid polarity reversals to mix the first and second colors and generate the third color as previously described.

The circuits previously discussed herein were designed to allow switching circuitry of minimum component count to realize cost effectiveness for mass manufacturing techinques. All of the electronic switching components and supply isolation transformers would preferably be housed and potted or sealed in one separate enclosure which will plug right into the wall plug receptacle to support the complete assembly. The assembly is to include an indicator light and also an on-off switch which could be positioned on the same shaft as the rate change control.

The bi-color LED drive schematics show the very basic concepts of switching, either manually or automatically, to show that the LED diodes or diode portions will run within their manufactured parameters using both AC source for half-wave illumination/rectification to light both alternately on the plus/minus swing of the 60 cycle AC waveform. Timing control circuits illustrate basic designs to create timing changes to automatically change from one state to the next a sequential order of, for example, red, green, yellow or the like. The timer-counter arrangement utilizes the outputs of the counter to directly interphase with switches whose purpose it is to isolate the AC and the positive and negative DC voltages from the control circuits. The output of the switches can either power small tree or swings up to 25 milliamps or be used as a pre-drive circuit to control power drivers for driving substantially longer strings.

The additional timing and switching control circuits show various means for producing the tri-color effect described previously. It is extremely important to note that tests have revealed that it is unnecessary to follow manufacturer's recommendations of a dropping current limiting resistor to be located in each and every LED and it has further been discovered that if the LED's are treated as a rectifiers as they are and not as lights or a resistive element then they are capable of separate conductions in an AC wavefront especially if they are wired in a series/parallel arrangement as previously described.

While manufacturer's take into account each LED's milliamp current drain and state, the parallel connections used herein will increase the current with each successive LED according to Ohm's law, actual tests reveal that LED's wired in parallel to produce a predicted large milliamp drain assuming a 20 milliamp capacity for each LED did, in fact, result in an increase of 40 milliamps for each LED and the total current never exceeded one thousand milliamps total. This may be, perhaps, explained by taking into account the fact that LED's are not resistive elements as contemplated by 0hms's law. Rather, they are diodes having certain of the characteristics thereof. It appears safe to say that many more diodes can be driven by the circuitry of the present invention and predicted by the manufacturer's specifications.

In an attempt to minimize the number of components and move toward solid state reliability, a number of integrated circuit chips are used in the circuits of the present invention. The most common chip used herein is the timer which may be a conventional 555 integrated circuit chip; the quad bilateral switch may be a conventional 4066 integrated circuit chip; and the decade counter may be a conventional 4017 intergrated circuit chip. Similarly, the operational amplifier may be a LM 741; the multi-vibrator may be a conventional 4047 chip; and the circuit 518 of FIG. 45 may be a conventional 8036 chip; the Schmidt trigger circuit may be a conventional 4093 chip and the voltage regulator may be a conventional 78L08CP voltage regulator chip. All of these chips are available from one or more companies and are conventionally used in the prior art.

With this detailed description of the specific apparatus and circuitry used to illustrate the preferred embodiment and various alternate embodiments of the present invention and the operation thereof, it wll be obvious to those skilled in the art that various modifications can be made in this invention without departing from the spirit and scope of the present invention which is limited only by the appended claims.

We claim:

1. A miniature light bulb apparatus for strings of Christmas tree lights, Christmas decorations, ornamental light strings, decorative lights and the like comprising:
   a light-emitting diode;
   an envelope means operably disposed about at least a portion of said light-emitting diode; and
   light-conducting spherical means operably disposed within said envelope means for transmitting, dispersing, and difussing the light emitted from said light-emitting diode.

2. The miniature light bulb apparatus of claim 1 further including light-transmitting epoxy means operably disposed within said envelope and about said spherical means for maintaining the configuration of said spherical means within said envelope means and aiding light conduction and transmission within said envelope means.

3. The miniature light bulb apparatus of claim 2 wherein said spheircal means are operably disposed proximate the inner surface of said envelope means and the area about the longitudingal axis of said envelope means is substantially devoid of said spherical means.

4. The miniature light bulb apparatus of claim 1 further including liquid light-conducting means operably disposed within said envelope means and means for sealing said envelope means to prevent the leakage of said liquid therefrom.

5. The miniature light bulb apparatus of claim 4 wherein said liquid includes carbontetrachloride.

6. The miniature light bulb apparatus of claim 1 wherein said envelope means includes a plastic material.

7. The miniature light bulb apparatus of claim 1 wherein said envelope includes glass.

8. The miniature light bulb apparatus of claim 1 wherein said spherical means includes plastic balls.

9. The miniature light bulb apparatus of claim 1 wherein said spherical means includes glass balls.

10. The miniature light bulb apparatus of claim 1 wherein said spherical means include substantially optically perfect balls.

11. The miniature light bulb apparatus of claim 1 wherein said spherical means includes balls of substantially uniform size.

12. The miniature light bulb apparatus of claim 1 wherein said spherical means include a mixture of spheres having at least some different diameters.

13. The miniature light bulb apparatus of claim wherein said spherical means includes large balls having a diameter substantially equal to the inside diameter of said envelope means for stacking said spherical means one on top of the other in a single file therein.

14. The miniature light bulb apparatus of claim 1 wherein said envelope means is formed in any conventional light bulb shape.

15. The miniature light bulb apparatus of claim 1 wherein said envelope means is an elongated, generally cylindrical shell at least partially open at one end for operatively receiving said light-emitting diode therein and generally tapered to a tip at the opposite end for decorative purposes and the like.

16. The miniature light bulb apparatus of claim 1 wherein said envelope means is in the shape of a right cylinder.

17. The miniature light bulb apparatus of claim 1 wherein said envelope means is in the shape of a hollow sphere.

18. The miniature light bulb apparatus of claim 1 wherein said envelope means includes at least a partially opened end for operatively receiving the light-emitting diode therein and a closed end, said closed end including a hook portion for hanging from Christmas tree limbs and the like.

19. The miniature light bulb apparatus of claim 1 wherein said spherical means includes a plurality of optical balls densely packed within said envelope means.

20. The miniature light bulb apparatus of claim 1 wherein said spherical means includes a plurality of optical balls loosely packed within said envelope means.

21. The miniature light bulb apparatus of claim 1 wherein said light-emitting diode has an intensity within the range of $2\text{mcd} \leq 1 \leq 24$.

22. The miniature light bulb apparatus of claim 1 wherein said light-emitting diode has an intensity within the range $24\text{mcd} \leq 1 \leq 500\text{mcd}$.

23. The miniature light bulb apparatus of claim 1 wherein said light-emitting diode has an intensity with a range greater than 500mcd.

24. The miniature light bulb apparatus of claim 1 wherein said light-emitting diode is colored.

25. The miniature light bulb apparatus of claim 24 wherein said light-emitting diode is at least one of red, green, yellow, amber, orange, and blue.

26. The miniature light bulb apparatus of claim 1 wherein said light-emitting diode is multi-colored.

27. The miniature light bulb assembly of claim 1 wherein said light-emitting diode is bi-colored.

28. The miniature light bulb apparatus of claim 1 wherein said light-emitting diode is tri-colored.

29. The miniature light bulb apparatus of claim 1 wherein said envelope means is substantially transparent.

30. The miniature light bulb apparatus of claim 1 wherein said envelope means is substantially translucent.

31. The miniature light bulb apparatus of claim 1 wherein said envelope means is tinted.

32. The miniature light bulb apparatus of claim 1 wherein said envelope means is colored.

33. A miniature light bulb comprising:
   a light-emitting diode;
   envelope means substantially surrounding said light-emitting diode and having a central axis parallel to the direction in which said light-emitting diode transmits light, the surface of said envelope means being scarified for diffracting light away from said axis and out of said envelope for increased visibility on the part of an observer; a light-conducting liquid operably disposed within said envelope means for conducting light along said axis and radially outward therefrom to said scarified surface; and means for sealing the envelope to prevent the leakage of said liquid therefrom.

34. The miniature light bulb apparatus of claim 33 wherein the outer surface of said envelope means is scarified in a uniform pattern.

35. The miniature light bulb apparatus of claim 33 wherein said scarified surface includes a fresnel defraction pattern for increasing the visibility of the light to an observer.

36. The miniature light bulb apparatus of claim 33 wherein said light-conducting liquid includes light-conducting epoxy means.

37. A method of making a miniature light bulb apparatus comprising the steps of:
  molding a generally elongated light-conducting envelope having a hollow interior, at least one partially opened end, and a closed end;
  inserting light-conducting optical spheres into the hollow interior of the envelope;
  adding epoxy to the interior of the envelope for binding the optical spheres in place;
  positioning a light-emitting diode into said at least partially opened end of said envelope, with the electrical leads of the diode extending therefrom;
  curing the epoxy/sphere mixture for hardening same;
  sealing the at least partially opened end with the electrical leads extending therefrom to prevent the leakage of epoxy and optical spheres from the hollow interior of the envelope; and
  electrically connecting power transmission means to the diode leads for powering the light-emitting diode.

38. The method of claim 37 further including the step of directing the optical spheres to the inner surface of the envelope before the epoxy cures.

39. The method of manufacturing a miniature light bulb comprising the steps of:
  molding a generally elongated, substantially transparent envelope having a hollow interior portion, at least one partially opened end, and a closed end;
  inserting light-conducting spherical balls into the hollow interior of the envelope during said molding step;
  adding at least one of a light-conducting liquid and light-conducting epoxy to the interior of the envelope during the molding step for immersing the optical balls disposed therein;
  positioning the light emitting diode within the at least partially opened end for emitting light along the axis of the hollow interior thereof; and
  sealing the at least partially opened end to prevent the escape of liquid and epoxy therefrom.

40. The method of manufacturing a miniature light bulb comprising the steps of:
  molding a generally elongated, light-conducting envelope having a hollow interior, an axis extending longitudinally through the hollow interior, and said envelope having at least a partially opened portion at one end thereof;
  scarifying the outer peripheral surface of the envelope to increase light diffusion and transmission therefrom;
  inserting a light-emitting diode into the at least partially opened portion at one end of the envelope;
  sealing the at least partially opened end to contain the light-emitting diode; and
  adding a light-conducting liquid to the hollow interior of the envelope to increase the light-conducting diffusion and transmission properties thereof.

41. The method of claim 40 wherein said light-conducting liquid includes light-transmitting epoxy.

42. An improved miniature light bulb apparatus including a generally elongated envelope having a hollow interior, a longitudinal axis extending through the hollow interior, the envelope having at least one partially opened end portion and one closed end portion, the envelope including at least one of light-conducting glass and plastic material and being at least one of transparent, translucent, tinted, and colored, the improvement comprising:
  a light-emitting diode operably disposed within the at least partially opened end portion of the envelope and into the hollow interior for transmitting light along the longitudinal axis and radially outward therefrom;
  means for sealing the at least partially opened end; and
  a plurality of substantially spherical light-conducting balls operably disposed within the hollow interior of said envelope.

43. The improved miniature light apparatus of claim 42 wherein said balls include at least one of light-conducting glass and plastic materials.

44. The improved miniature light bulb apparatus of claim 42 wherein said balls are at least one of uniformally sized and mixed sized.

45. The improved miniature light apparatus of claim 42 wherein said balls include at least one of solid and hollow optical spheres.

46. The improved miniature light bulb apparatus of claim 42 wherein said balls have a relatively large diameter slightly smaller than the inner diameter of said envelope for stacking therein, one upon the other, along said longitudinal axis.

47. The improved miniature light bulb apparatus of claim 42 wherein said balls are substantially optically perfect.

48. The improved miniature light bulb apparatus of claim 42 wherein further including at least one of air, light-conducting epoxy, and light-conducting liquid operably disposed within the hollow interior of said envelope for improving the light transmission and diffusion properties thereof.

49. An improved miniature light bulb apparatus including a generally elongated envelope having a hollow interior with a longitudinal axis therethrough, at least one partially opened end, and a closed end, the improvement comprising:
  a plurality of light-conducting spheres operably disposed wihin the hollow interior of said envelope for improving the light diffusion and dispersion characteristics thereof and the visibility of the bulb to an external observer;
  a miniature incandescent bulb operably disposed through the at least partially opened end of the envelope and into the hollow interior thereof; and means for sealing the at least partially opened end of the envelope for retaining the spheres and said incandescent bulb therein.

50. The improved miniature light bulb apparatus of claim 49 further including at least one of light-conducting epoxy, light-conducting liquid, and air operably disposed within the hollow interior of said envelope and sealed therein for increasing the light transmission and diffusion characteristics of the bulb.

51. The improved miniature light bulb apparatus of claim 49 wherein said envelope includes at least one of light-conducting glass and light-conducting plastic material.

52. The improved miniature light bulb apparatus of claim 49 wherein said optical spheres include at least one of light-conducting glass and light-conducting plastic balls.

53. An improved string of Christmas tree lights having a plurality of electrical conducting means and a power source for supplying electrical current thereto, the improvement comprising:
a plurality of light-emitting diodes electrically connected along said electrical conducting means for receiving electrical current therefrom and adapted to be placed in various arrangements about a Christmas tree for display purposes;
a plurality of light-conducting envelopes, each of said envelopes being substantially hollow and having a longitudinal axis therethrough, each of said envelopes having at least a partially opened end for operatively receiving at least a portion of said light-emitting diode therein and a closed end; and
a plurality of light-conducting optical spheres operably disposed within said hollow interior of said envelopes for improved light diffusion and transmission characteristics.

54. The improved string of claim 53 wherein said connector means includes:
a master trunk line adapted to be secured substantially vertically down the trunk of a Christmas tree, said master trunk line including at least upper and lower master separate and distinct trunk line sections electrically connectable and unconnectable to each other in a series electrical path;
a plurality of groups of limb light sets adapted to be positioned substantially horizontally along the Christmas tree branches, each of said groups including a plurality of limb light sets selectively connectable and unconnectable from said master trunk line, each set being electrically connected in parallel with the other light limb sets in said group;
a plurality of light-emitting diodes operably disposed at predetermined distances along said limb light sets for decorative purposes, said light-emitting diodes within each limb light sets being electrically connected in series with one another; and selectably operable fastening means for connecting and unconnecting said light limb sets to said main trunk line at predetermined locations therealong for ease of assembly, disassembly, and replacement of said light-emitting diodes.

55. The improved string of claim 54 wherein said fastening means are operably disposed a predetermined distance "m" apart along said substantially vertical master trunk line where $4 \leq m \leq 18$ inches.

56. The string of claim 54 wherein said light-emitting diodes are operably disposed on said limb lines a predetermined distance "n" apart where $1 \leq n \leq 12$ inches.

57. The string of claim 54 wherein each limb light set is a twisted pair representing different segments for different tree branches and at least one light-emitting diode is operably disposed at the distal end of each twisted pair limb line segment.

58. The string of claim 54 wherein said plurality of limb lines may be divided into upper and lower groups associated with said upper and lower master trunk lines sections, respectively, where each group includes a plurality of limb line sets each having a predetermined length beginning at the top of the master trunk line and increasing in length at predetermined increments down the master trunk line to the base so that an additional longer set of limb lines can always be added to the bottom while another set is added to the top so that the string is adaptable for any height of tree.

59. The string of claim 53 wherein each of said envelopes includes at least one of light-conducting glass and light-conducting plastic material.

60. The string of claim 53 wherein said spheres includes at least one of light-conducting glass and light-conducting plastic material.

61. The string of claim 53 wherein said spheres are adapted to be operably disposed within said hollow interior are at least one of a uniform sizes, mixed sizes, or a single large diameter size where the diameter of the sphere is approximately equal to the width of the hollow interior for stacking the spheres upon one another along said axis.

62. The string of claim 53 further including at least one of light-transmitting epoxy and light-transmitting liquid operably disposed within said hollow interior of said envelope for improved light transmission and diffusion therethrough.

63. The string of claim 53 wherein said plurality of light-emitting diodes have luminous intensities in the range of 2 mcd to 500 mcd.

64. The string of claim 53 wherein each of said upper and lower master trunk line sections, said upper and lower limb light groups, and opposite halves of the tree include an equal number of LEDs therein.

65. The string of claim 53 wherein said plurality of LED's has a luminous intensity in a range of 500 mcd or greater.

66. A string of Christmas tree lights comprising:
a master trunk line adapted to be disposed substantially vertically along the height of the Christmas tree for conducting electrical current supplied thereto, said master trunk line having at least an upper nad lower master trunk line portion electrically connected in series with one another;
trunk line fastening means for selectively connecting said upper and lower portions in electrical series with one another;
a plurality of limb light sets adapted to be operably disposed substantially horizontally along the branches of the tree, said plurality of limb light sets being divisible into upper and lower groups of individual light limb sets, the individual light limb sets within a given group being electrically connected in parallel with one another;
a plurality of light-emitting bulbs operably disposed at predetermined intervals along the length of each of said sets for decorative purposes; and
selectively operable limb line fastening means for mechanically and electrically connecting and unconnecting each of said individual limb light sets of said upper and lower groups of light limb sets to corresponding ones of said upper and lower groups, respectively, of said master trunk line for supplying current thereto;

said plurality of light bulbs includes at least one of light-emitting diodes and miniature incandescent bulbs;

a plurality of light-conducting envelopes each including a hollow interior portion, at least a partially opened end, and an opposite closed end, each of said envelopes including at least one of light-conducting glass and light-conducting plastic material; and a plurality of light-conducting spherical balls operatively disposed within the hollow interior of said envelopes and sealed therein for improved light transmission and diffusion characteristics.

67. The light string of claim 66 wherein said balls include at least one of light-conducting glass and light-conducting plastic material.

68. The light string of claim 66 wherein said plurality of spherical balls include at least one of a uniform mixture of substantially equally dimensioned balls, a mixture of balls of various dimensions, and a plurality of relatively large balls having a diameter substantially equal to size of the hollow interior of the envelope for stacking the balls along the axis of the interior one on top of the other.

69. The light string of claim 66 further including at least one of light-transmitting epoxy and light-transmitting liquid operably disposed within the hollow interior of said envelopes for improved light transmission characteristics.

70. A string of Christmas tree lights comprising:

a master trunk line adapted to be disposed substantially vertically along the height of the Christmas tree for conducting electrical current supplied thereto, said master trunk line having at least an upper and lower master trunk line portion electrically connected in series with one another;

trunk line fastening means for selectively connecting said upper and lower portions in electrical series with one another;

a plurality of limb light sets adapted to be operably disposed substantially horizontally along the branches of the tree, said plurality of limb light sets being divisible into upper and lower groups of individual light limb sets, the individual light limb sets within a given group being electrically connected in parallel with one another;

a plurality of light-emitting bulbs operably disposed at predetermined intervals along the length of each of said sets for decorative purposes;

selectively operable limb line fastening means for mechanically and electrically connecting and unconnecting each of said upper and lower groups of individual limb light sets to said upper and lower master trunk line portions, respectively, for supplying current thereto; and a plurality of glass fragments operably disposed at least against the interior surface within the hollow interior of said envelopes.

71. The light string of claim 70 wherein said plurality of glass fragments include at least one of substantially regular geometric shapes and defined crystalline structures.

72. A miniature light bulb apparatus for use in a string of Christmas tree lights or the like comprising:

a light-emitting device including a light-emitting portion, a base portion opposite the light-emitting portion, and at least first and second electrodes extending from the base portion of the light emitting device;

generally elongated envelope means having a hollow interior with a longitudinal axis therethrough and an aperture at one end thereof, said light-emitting device being operably disposed at least partially through said aperture and within said hollow interior of said envelope means for transmitting said emitted light therethrough, said longitudinal axis through the central portion of the hollow interior of said envelope means being coincident with the axis of said light-emitting device;

means for encapsulating the base of the light-emitting device and sealing the aperture at the end of said envelope means;

base means operably secured to said encapsulating means for balance and decorative purposes;

said base means including a decorative base portion operatively secured to said encapsulating means and extending at least partially along said longitudinal axis; and the electrical conductor means including at least first and second wires operatively extending through said base means for electrical connection to said first and second electrodes, respectively, and generally oriented substantially perpendicular to said longitudinal axis.

73. The miniature light bulb apparatus of claim 72 wherein said decorative base means has one surface secured to the lower surface of said capsulating means with said first and second electrical wires extending between said surfaces and through said base means for enabling the light bulb to stand upright and to be readily disposed upright within the needles of the tree branches.

74. The miniature light bulb apparatus of claim 72 wherein said decorative base is operably disposed at least partially over the sides of said capsulating means and extends at least a predetermined distance toward said envelope means from the lower surface thereof; and wherein said electrical wires are operably disposed through said decorative base means and below said encapsulating means substantially perpendicular to said longitudinal axis for connection to said first and second electrodes, respectively, for increasing the stability of the light bulb, for enabling the light bulb to stand upright, and for enabling the light bulb to be easily positioned within the needles of the Christmas tree branches.

75. The miniature light bulb apparatus of claim 72 wherein said decorative base is operatively secured along the sides of said encapsulating means to the top surface thereof and wherein said electrical wires extend sideways through said decorative base below the lower surface of said encapsulating means substantially perpendicular to said longitudinal axis for electrically connecting said first and second electrodes, respectively, for providing the light bulb apparatus with stability, for enabling the light bulb apparatus to stand upright, and for enabling the light bulb apparatus to be readily positioned within the needles of the Christmas tree.

76. The miniature light bulb apparatus of claim 72 wherein said decorative base includes a weighted lower end portion.

77. The miniature light bulb apparatus of claim 72 wherein said decorative base includes an elongated portion extending away from said envelope means substantially along said longitudinal axis for further balancing the light bulb apparatus and further insuring that the light bulb apparatus will stand upright within the tree branches at all times.

78. A two-LED tri-color light comprising:
first and second light-emitting diodes, each having a ground surface operatively disposed against the ground surface of the other for establishing a predetermined focal angle for giving the appearance of a single light source, said first light-emitting diode having a first different and distinct characteristic color, said second light-emitting diode having a second different and distinct characteristic color and wherein a third color is produced whenever both said first and second light-emitting diodes are alternately energized at a rate undiscernable to the human eye thereby producing three separate and distinct characteristic colors from two individual light sources;
means for bonding the ground surfaces together for maintaining said focal angle;
a generally elongated envelope having a hollow interior with a longitudinal axis therethrough, said light-emitting diodes at least partially disposed within said envelope; and
a plurality of light-transmitting optical spheres disposed within the hollow interior of said envelope for increasing the light-transmitting and diffusion characteristics of the bulb.

79. The light of claim 78 wherein said envelope includes at least one of glass and plastic material.

80. The light of claim 78 wherein said optical spheres include at least one of glass and plastic material.

81. The light of claim 80 wherein said optical spheres include at least one of hollow and solid spheres.

82. The light of claim 80 wherein said spheres include at least one of spheres having a uniform diameter and spheres having a plurality of different diameters.

83. The light of claim 80 wherein said optical spheres are relatively large and have a diameter slightly less than the width of the hollow interior for enabling said spheres to be stacked one on top of the other for improved diffusion characteristics.

84. The light of claim 78 wherein the spherical balls are operably disposed substantially only against the outer surface of the hollow interior of the envelope and the central portion of the envelope along said longitudinal axis is devoid of spheres.

85. The light of claim 78 further including at least one of light-conducting epoxy and light-conductive liquid operably disposed within said envelope for improved light conducting characteristics.

86. The light of claim 79 wherein said envelope is at least one of tinted, colored, translucent, and transparent.

87. The light of claim 78 wherein said first and second light-emitting diodes are red and green respectively and said three colors produced thereby include red, green and yellow.

88. The light of claim 78 further including a third light-emitting diode ground and bond to the ground surfaces of said first and second light-emitting diodes to establish a single apparent light source therefrom, said first, second and third light-emitting diodes representing the colors red, green, and blue, respectively for producing any and all colors of the visible spectrum by illuminating various combinations of said three colors.

89. The light of claim 88 further including circuit means for operatively illuminating each and every combination and permutation of said first, second and third light-emitting diodes for generating all of the colors and hues of the visible spectrum.

90. The light of claim 88 further including at least one of light-transmitting epoxy means and light-transmitting liquid operably disposed within the hollow interior of said envelope about said optical spheres.

91. A Christmas tree light string system comprising:
a master trunk line electrical connector means adapted to be operatively disposed substantially vertically down the trunk of said Christmas tree;
said master trunk line electrical connector means including an upper trunk line circuit electrically connected in series with a lower trunk line circuit;
upper and lower groups of modular limb line electrical connector means associated with said upper and lower master trunk line circuits, respectively, and adapted to be operatively disposed substantially horizontally along the limbs of said Christmas tree;
said plurality of modular limb line electrical connector means including individual modular light limb sets;
a plurality of light-emitting diodes operably disposed along the length of said light limb sets and electrically connected thereto in a series path at predetermined selected intervals therealong;
a source of electrical power;
means for removably electrically connecting said upper and lower trunk line portions to said source of electrical power for illuminating said light-emitting diodes; and
means for selectively removably connecting and unconnecting individual ones of said sets of light limbs within each of said upper and lower groups of modular limb lines to said upper and lower trunk line circuits, respectively, such that said individual sets of light limbs are electrically connected in parallel with one another within each of said groups for ease of replacement and substitution of individual light limb sets;
said upper and lower master trunk line including first and second electrical conductors and first and third electrical conductors, respectively, said first electrical conductor being common to said upper and lower master trunk line each of said upper and lower master trunk line portions including first and second terminals;
said means for electrically connecting said upper and lower trunk line to said source of electrical power including first and second electrical power inputs, respectively;
said second electrical conductor of said upper trunk line having one terminal electrically connected to said first electrical power input and said third electrical conductor of said lower trunk line circuit having one terminal electrically connected to said second electrical power input for supplying electrical power to said upper and lower main trunk line portions;
said modular sets of light limbs being separable into upper and lower groups of modular light limb sets, each set of light limbs having first and second terminals and said plurality of selectively spaced light-emitting diodes therebetween, each of said upper and lower groups of light limbs including a first set, at least one intermediate set, and a last set, said sets electrically connected in parallel with one another within each of said upper and lower groups;

said second electrical conductor of said upper trunk line circuit being selectively removably connected and unconnected to one terminal of each of said upper group of modular light limb sets;

said third electrical conductor of said lower trunk line circuit being selectively removably connected and unconnected to one terminal of each of said lower group of light limb sets;

the opposite terminal of each of said upper and lower groups of light limbs being electrically connected to said first common electrical conductor; and said upper and lower master trunk line of said master trunk line upper and lower groups being electrically connected in series with each other, all sets of light limbs within each of said upper and lower groups of light limb sets being electrically connected in parallel with one another, and said individual light-emitting diodes within each set of light limbs within each of said upper and lower groups of light limb sets being serially connected to one another within each of said sets.

92. The Christmas tree light system of claim 91 wherein:

each of said individual sets of light limbs include a plurality of "n" limb segments each including a twisted pair having a length "l" adapted to be operatively disposed along the branches of said Christmas tree, each of said sets of light limbs in said upper group of light limb sets having one terminal electrically connected to said second electrical conductor of said upper main truck line portion and its opposite terminal electrically connected to said first electrical conductor of said main trunk line; and each of said individual sets of light limbs in said lower group light limb sets having one terminal electrically connected to said third electrical conductor of said lower master trunk line portion and its opposite terminal electrically connected to said first electrical connector of said master trunk line.

93. The Christmas tree light system of claim 92 wherein each of said "n" light limb sets includes a light-emitting diode electrically connected approximate the outer distal end of said light limb twisted pair segments.

94. The Christmas tree light system of claim 92 wherein each of said light-emitting diodies is substantially equally spaced along a given light limb segment.

95. The Christmas tree light system of claim 92 wherein the number of light-emitting diodes in the upper and lower groups of modular limb light sets are equal and the number of light-emitting diodes connected to each of said upper and lower master trunk line sections is also equal.

96. The Christmas tree light system of claim 92 wherein alternate mono-colored light-emitting diodes are electrically connected to said light limb segments with reverse polarity.

97. The Christmas tree light system of claim 96 wherein said means for connecting said power supply to said upper and lower master trunk line groups include control circuit means for supplying alternate polarity current to said light limb sets for alternatively illuminating at least one polarity of said light-emitting diodes and then the opposite polarity of said light-emitting diodes.

98. The Christmas tree light system of claim 97 wherein said control circuit means includes a step down transformer means for converting the conventional 110 volt AC input signal into a significantly reduced AC input signal for driving said polarity reversed light-emitting diodes for sequentially and alternately illuminating at least one and then the other thereof.

99. The Christmas tree light system of claim 92 wherein said means for selectively removably connecting and unconnecting said sets of light limbs to said master trunk line including means for selectively mechanically and electrically connecting and unconnecting same.

100. The Christmas tree light system of claim 99 wherein said means for mechanically and electrically connecting and unconnecting said sets of light limbs to said master trunk line includes snap fastener means, said snap fastener means including one of male and female snap portions mechanically and electrically connected to said main trunk line at predetermined distances therealong and the terminals of each of said light limb sets being electrically and mechanically connected to the other of said male and female snap portions such that when said male and female snap portions are mechanically engaged, a mechanical and electrical connection is completed between said main trunk line and said light limb set.

101. The Christmas tree light system of claim 99 further including means for operatively securing said master trunk line to the trunk of said Christmas tree.

102. The Christmas tree light system of claim 91 wherein alternate ones of said light-emitting diodes are electrically connected to said light limbs with a reversed polarity from other ones of said light-emitting diodes and including control circuit means for sequentially driving one, and then the other, and then both of said oppositely poled light-emitting diodes for sequentially generating said first, second, and third different and distinct characteristic colors, respectively.

103. The Christmas tree light system of claim 102 wherein said circuit means for electrically connecting said master trunk line portions to said source of electrical power include control circuit means for driving the odd and even numbered, oppositely connected, light-emitting diodes to illuminate at least first one and then the other of said alternate light-emitting diodes.

104. The Christmas tree light system of claim 103 wherein said control circuit means includes a step down transformer means for reducing the normal 110 volt AC input to a substantially reduced AC signal the positive portion of which illuminates one polarity of light-emitting diode and the negative portion of which illuminates the opposite polarity of said light-emitting diodes.

105. The Christmas tree light system of claim 91 wherein each of said light-emitting diodes is a bi-color light-emitting diode having a first light-emitting diode portion for emitting a first different and distinct characteristic color light and a second light-emitting diode portion for emitting a second different and distinct characteristic color light; and said means for electrically connecting said trunk line portions to said source of electrical power including control circuit means for alternately illuminating one and then the other of said first and second light-emitting diode portions for sequentially presenting said first and second colors of light therefrom.

106. The Christmas tree light system of claim 105 wherein said control circuit means includes transformer means for stepping down a conventional 110 volt AC signal into a substantially reduced AC signal having a positive and negative waveform portion, the positive waveform portion being operable to electrically drive one of said light-emitting diode portions while the negative portion of the waveform is operatively adapted to drive the other of said light-emitting diode portions.

107. The Christmas tree light system of claim 105 wherein said control circuit means further includes:
   timing means for establishing at least first, second and third timing state signals each having a predetermined time duration;
   means for alternately switching between a first and second polarity signal; and
   drive means for providing drive current to whichever of said first and second light-emitting diode portions are supplied by said first and second switching signals.

108. The Christmas tree light system of claim 107 wherein said circuit means further includes a variable duty cycle controller means for selectively controlling the pulse duration during each of said first and second switching signals.

109. The Christmas tree light system of claim 91 wherein said light-emitting diodes are bi-colored and each includes a first light-emitting diode portion having a first characteristic color and a second light-emitting diode portion having a second different and distinct characteristic color, means for connecting said first and second light-emitting diode portions in parallel with one another and with one having the opposite polarity to the other, said first and second light-emitting diode portions being energizable by an oscillating signal for producing a third different and distinct characteristic color resulting from the combination of said first and second different and distinct characteristic colors;
   said means for electrically connecting the tree limb portions to said source of electrical power including electrical control circuitry for controlling the sequencing and generation of said first, second and third characteristic colors;
   said control circuit means including timing and counter means for establishing a sequence of first, second and third timing states each having a time duration;
   means for producing first and second reverse polarity signals;
   circuit driver means responsive to said first and second polarity reversal signals for illuminating said first and second light-emitting diode portions to generate said first and second characteristic colors sequentially, said means for generating a reverse polarity signal including means responsive to the third timing state for producing an oscillating signal, said driver means being responsive to said oscillating signal for rapidly changing the polarity of said first and second light-emitting diode portions for rapidly illuminating said first and second characteristic colors to produce said third different and distinct characteristic color and sequence therewith.

110. The Christmas tree light system of claim 109 wherein said control circuit means further includes variable duty cycle controller means for establishing reverse polarity pulse signals having substantially reduced first and second time durations, respectively.

111. The Christmas light system of claim 110 wherein said means for electrically connecting said master trunk limb portions to said source of electrical power includes:
   said timing and counting means including a timer for generating a sequence of clock-like pulses and counter means responsive to said timer pulses for generating first, second and third count state signals having first, second and third time durations, respectively;
   means responsive to said first and second count state signals for generating first and second opposite polarity DC switching signals;
   means responsive to said third count state signal for generating a rapidly oscillating pulse signal including third and fourth opposite polarity pulses;
   first and second control circuit output leads for selectively removably connecting and unconnecting said control circuit means to said master trunk line for supplying drive current thereto for sequentially illuminating alternate ones of said first LED portion, said second LED portion, and the alternate combination of said rapidly pulsed first and second light-emitting diode portions.

112. The Christmas tree light system of claim 111 wherein said means for generating pulse signal includes a gated oscillator means responsive to said third timing signal for generating a gated DC signal and latch means responsive to the generation of said gated oscillator signal for generating a series of positive and negative opposite polarity pulses;
   first and second control circuit output leads for selectively removably connecting the unconnecting said control circuit means to said master trunk line for supplying drive curent thereto for sequentially illuminating alternate ones of said LED of said light-emitting diode portions;
   said pulse generating means including first and second pulse generator output leads adapted to be electrically connected to said first and second control circuit output leads;
   said means for generating opposite polarity DC switching signals including first and second switching signal output leads adapted to be electrically connected to said first and second control circuit output leads, respectively; and
   said control circuit output leads supplying said first and second switching signals and said pulse signals to said master trunk line for sequentially alternately illuminating said first light-emitting diode portion, said second light-emitting diode portion, and for alternatively illuminating both said first and second light-emitting diode portions for said first, second and third time periods, respectively, for generating said first, second and third different and distinctive characteristic colors.

113. The Christmas tree light system of claim 111 wherein said means for generating pulse signals further includes latch means responsive to a gated oscillator signal for generating a series of positive and negative pulses and gated oscillator means responsive to said third count state signal for generating said gated DC signal.

114. The Christmas tree light system of claim 113 wherein said control circit means further includes variable duty cycle control means for selectively controlling the duty cycle of said positive and negative polarity pulses.

115. The Christmas tree light system of claim 110 wherein said driver means includes a comparator means, a switching input to the comparator for receiving timing signals supplied thereto, the output of said comparator being supplied to a double-ended supply overload protection output driver circuit means for generating a first polarity DC signal, a second polarity DC signal, and an oscillating AC signal for rapidly driving both the first and second light-emitting diode portions alternately on and off for generating said third different and distinctive characteristic color.

116. The Christmas tree light system of claim 110 wherein said variable duty cycle controller includes means for generating a plurality of clock signals for indicating the rate of change of the output signal, a duty cycle driver operatively responsive to the rate of change timing signals for supplying positive and negative pulse to said light-emitting diodes, the positive and negative pulses each having its own duty cycle with the duty cycle selectively variable to permit the light-emitting diodes to be driven at greater than maximum current for short durations of time for obtaining greatly increased intensity without risk of failure and the like.

117. The Christmas tree light system of claim 91 wherein each of said plurality of light-emitting diodes includes a first light-emitting diode portion having a first characteristic color and a second light-emitting diode portion having a second different and distinct characteristic color, said first light-emitting diode portion being connected in opposite polarity to said second light-emitting diode portion for illuminating said first light-emitting diode to produce said first characteristic color in response to a first polarity signal, for illuminating said second light-emitting diode to generate said second different and distinct color in response to the opposite polarity and for rapidly illuminating alternate first and second light-emitting diode portions to generate a third different and distinct color resulting from the combination thereof.

118. The Christmas tree light system of claim 117 wherein said control circuit means includes timing means for generating first, second and third timing signals, switching means for generating a first polarity switching signal, a second opposite polarity switching signal, and a third series of rapidly oscillating positive and negative polarity pulses; and drive means for amplifying said switching pulses to illuminate said light-emitting diode portions.

119. The Christmas tree light system of claim 118 wherein said timing means includes means for generating clock signals and counter means for counting sequential ones of said clock pulses for generating said first, second and third timing signal each having first, second and third time durations, respectively.

120. The Christmas tree light system of claim 119 wherein said switching means includes a solid state integrated circuit switch including a first normally-opened switch for operatively coupling a source of positive DC potential to said first light-emitting diode porton for producing said first characteristic color, a second normally-opened switch for operatively coupling a negative source of DC potential to said second light-emitting diode portion for producing said second different and distinctive characteristic color, and a third normally-opened switch operatively coupling an AC signal to said power driver means for rapidly driving said first and second light-emitting diode portions by the positive and negative polarity portions of the AC waveform to generate said third different and distinctive color, said first, second and third normally-opened switching means being responsive to said first, second and third count signal, respectively, for sequentially operating said switches.

121. The Christmas tree light system of claim 119 wherein said switching means includes a solid state bilateral switch for generating first and second polarity switching signals;
a first and second silicon-controlled rectifier connected in parallel with one another and with reverse polarity between a source of AC signal and one of said control circuit outputs, the gate electrode of each of said silicon-controlled rectifier being operatively coupled to said first and second switching signals through first and second oppositely poled diodes, respectively for enabling said bilateral switching means to controllably gate said silicon-controlled rectifiers for sequentially and alternatively supplying the positive portion and negative portion of said AC waveform to said control circuit output for selectively illuminating said first light-emitting diode portion and said second light-emitting diode portion to produce said first and second characteristic different and distinct colors; and further including means operatively coupling the second control circuit output to a source of AC waveform for cyclically switching said first and second light-emitting diode portions back and forth to produce said third different and distinct color thereby enabling said control circuit means to sequentially generate alternate first, second and third different and distinct colors from each bi-color light-emitting diode.

122. The Christmas tree light system of claim 121 wherein said control circuit output includes a light-emitting diode operatively coupled between said first and second control circuit outputs for indicating which of the first, second and third colors are being generated at a given point in time.

123. The Christmas tree light system of claim 118 wherein said switching means for generating polarity reversal signals includes a darlington amplifier configuration including first, second, third and fourth npn power transistors said first and second transistors having their collectors operatively coupled to a source of potential, their emittors operatively coupled to said first and second control circuit output, respectively, and their base electrodes operatively coupled to receive said first and second timing signal, respectively, the base of said first and second transistors being operatively coupled to the base of said fourth and third transistors, respectively the collector of said third and fourth transistor being operatively coupled to said first and second control circuit output, respectively, and said emittor electrode of said third and fourth transistor being operatively coupled to the ground, said darlington circuit being responsive to the presence of said first timing signal for switching said first and fourth transistor to a conductive state and generating a positive polarity switching signal and being responsive to said second timing signal for switching said second and third transistors on for supplying said negative polarity signal to said first control circuit output for driving it low and producing said second switching signal.

124. The Christmas tree light system of claim 118 wherein said polarity reversing switching means includes a power MOSFET polarity switching circuit including first, second, third and fourth power MOSFET semi-conductor devices, each of said semi-conductor devices having a source electrode, a drain electrode, and a ground electrode, said source electrode of said first and third power MOSFETS being operatively coupled to a positive source of potential and a source electrode of said second and fourth MOSFET device being operatively coupled to a negative source of potential, the gate electrode of said first and fourth MOSFET device being operatively coupled to receive said second switching signal and the gate electrode of said first and third MOSFET device being operatively connected to receive said first switching signal, the drain electrodes of said first and second MOSFET device being operatively coupled to first input of said drive means and the drain electrodes of said third and fourth MOSFET devices being operatively coupled to the second input of said drive means for providing polarity reversed highly efficient low leakage drive current useable with a high switching rate, high current for output drive purposes.

125. The Christmas tree light system of claim 118 wherein said polarity reversing switching circuit includes a double-pull, double-throw relay having a relay coil, a first positive polarity input, a second negative polarity input, a first positive polarity output, a second negative polarity output, first and second normally closed switch contacts for operatively coupling said positive and negative potentials to the said positive and negative switch outputs, respectively, and normally open switch contacts responsive to the energization of said relay coil for closing to operatively couple said negative and positive potential to said positive and negative outputs, respectively.

126. The Christmas tree light system of claim 118 wherein said polarity reversing switching means includes first, second, third, and fourth silicon-controlled rectifiers, the anode of said first and second silicon-controlled rectifiers being operatively coupled to a source of AC signal and the cathodes of said second and third silicon-controlled rectifiers being operatively coupled to a source of AC signal, the cathodes of said first and second silicon-controlled rectifiers being operatively coupled to the anodes of said third and fourth silicon-controlled rectifiers and the intersection of said second and fourth silicon-controlled rectifiers serving as the positive circuit output while the intersection of the first and third silicon-controlled rectifier serves as the negative circuit output, the gate electrode of said first and fourth silicon-controlled rectifiers being operatively coupled to a switched source of DC potential while the gate electrode of said second and third silicon-controlled rectifiers is operatively coupled to a positive source of switched DC signal, the positive and negative switch DC signal triggering said second, third, and first, fourth silicon-controlled rectifiers, respectively for conducting a positive waveform on said positive output and a negative waveform on said negative output and responsive to the opposite signal for triggering the first and third silicon-controlled rectifier and outputting positive waveform on said negative output and a negative waveform on said positive output for sequential polarity reversing purposes.

127. The Christmas tree light system of claim 118 wherein said switching means includes a solid state semi-conductor switching device having a first, second, third and fourth normally opened switch contact, means for operatively coupling said first, second, third and fourth normally opened switch contact to the positive and negative circuit outputs through the anode of a first diode, the cathode of a second diode, and the anode of a third diode and cathode of a fourth diode, respectively, the input of said first normally opened switch being operatively coupled to a positive source of potential and the normally opened contact of said third and fourth switches being operatively coupled to a source of DC potential the circuit input supplying a positive and negative switching pulse to the first input operatively coupled to the first and third switching means and to the second input operatively coupled to said second and fourth switching means for operating said first, second, third, and fourth switches to generate alternately first and second opposite polarity output signals.

128. The Christmas tree light system of claim 118 wwherein said drive means includes first and second operational amplifiers operatively coupled to receive the first, second and third timing signals at the input thereof for generating first and second switch output signals capable of generating a high current to illuminate said light-emitting diodes.

129. The Christmas tree light system of claim 117 wherein said light emitting diodes each have first and second terminals, transformer means for significantly reducing 110 volt 60 cycle AC current to a substantially reduced value of 60 cycle AC current, means responsive to the 60 cycle AC current for selectively generating one of a first DC polarity signal, a second DC polarity signal, and an AC signal having positive and negative waveform portions for driving said LED said light-emitting diodes to generate said first, second and third different and distinctive colors, respectively.

130. The Christmas tree light system of claim 91 wherein each light-emitting diode includes a generally cylindrical, elongated envelope means having a longitudinal axis therethrough and a plurality of light-conducting optical spheres operably disposed within said envelope for dissipating and dispersing said light-emitting diode-generated illumination.

131. The Christmas tree light system of claim 130 wherein said envelope means includes at least one of glass and plastic.

132. The Christmas tree light system of claim 117 wherein said control circuit means includes transformer means for reducing 110 volt AC 60 cycle current to a significantly reduced 60 cycle AC current for operably driving said light-emitting diodes, a means for operatively coupling said reduced AC signal to a first circuit input and means for operatively coupling said reduced AC signal to a second circuit input, a silicon-controlled rectifier having its anode electrically connected to said first circuit input and its cathode connected to a circuit output, an adjustably positionable switch for selecting one of a first path having a diode operatively connected with its cathode connected to said first circuit input and its anode connected to said first second output, a second diode having its anode connectable to said first circuit input and its cathode connected to said first circuit output, and a third electrical lead connectable to said first circuit input and to said first circuit output for supplying said first, second and third switching signals to said light-emitting diodes for producing said first, second and third different and distinctive characteristic colors therefrom.

133. The Christmas tree light system of claim 132 wherein said optical spheres include at least one of glass and plastic.

134. The Christmas tree light system of claim 132 wherein said optical spheres include at least one of hollow and solid spheres.

135. The Christmas tree light system of claim 132 wherein said optical spheres include at least one of uniform sized balls and mixed sized balls.

136. The Christmas tree light system of claim 132 wherein said optical spheres include a plurality of optical spheres having a diameter slightly less than the diameter of said elongated envelope means for being disposed one on top of the other therein.

137. The Christmas tree light system of claim 132 wherein said envelope means further includes at least one of light-conducting epoxy and light-conducting liquid, operatively sealed therein.

138. The Christmas tree light system of claim 132 wherein said light-emitting diodes each include a base and a pair of light-emitting diode leads extending therefrom and substantially normal to said longitudinal axis for enabling the bulb to stand upright in the branches of the tree.

139. The miniature Christmas tree light system comprising:
- a main trunk line having upper and lower trunk line portions serially connected to one another by a selectively removable connector means;
- a plurality of sets of limb lines each having a plurality of limb line twisted wire pair segments therein, said limb line segments being serially connected to one another within each of said sets and said limb line sets being divided into upper and lower groups with the limb lines of said upper group being electrically connected in parallel with one another and the limb lines of said lower group being electrically connected in parallel with one another so that only one limb line set goes out in the event of a burned out bulb or the like;
- means for operatively removeably connecting and unconnecting the main trunk line to an electrical power source;
- light-emitting diodes operatively disposed at predetermined selected positions along said limb segments with each limb segment terminating in a light-emitting diode;
- means for mechanically and electrically connecting each set of limb lines of said upper group to a corresponding connection on said upper trunk line and each set of limb lines of said lower group to said lower trunk line, respectively, alternate ones of said LED's being connected in opposite polarity to the surrounding ones within each limb segment such that application of power to the main trunk line alternately illuminates every other light in said limb light.

140. The miniature Christmas light system of claim 139 wherein each of said light-emitting diodes comprises a single light-emitting diode portion and at least two types of light-emitting diodes are used alternatively along said limb lines with each of said types producing a separate and distinctive characteristic color when illuminated.

141. The miniature Christmas tree light system of claim 140 wherein said source of potential includes a stepped-down alternating current signal.

142. The miniature Christmas tree light system of claim 139 wherein said source of potential includes a DC source.

143. The miniature Christmas tree light system of claim 142 wherein said source of DC potential includes battery means for rendering the miniature Christmas tree light system readily portable and the like.

144. The miniature Christmas tree light system of claim 139 wherein each of said light-emitting diodes includes generally cylindrical envelope having a longitudinal axis and a plurality of light-conducting optical spheres operably disposed within said envelope and sealed therein, each of said envelopes including at least one of glass and plastic material, each of said optical spheres including one of glass and plastic material, each of said glass spheres including at least one of hollow and solid spheres, each of said optical spheres including at least one mixed diameter and uniform diameter spheres, and each of said envelopes including at least one of said light-conducting epoxy and light-conducting liquid operatively sealed therein.

145. The miniature Christmas tree light system of claim 139 wherein said each of said plurality of light-emitting diodes includes a base and a pair of light-emitting diode leads, the leads of said light-emitting diode extending through said base and substantially perpendicular to said longitudinal axis for enabling said envelope to remain upright when the limb segments are positioned along the branch of the tree.

146. The miniature Christmas tree light system of claim 139 further including control circuit means for sequentially illuminating alternate ones of said light-emitting diodes for generating at least first and second different and distinct colors, respectively.

147. The miniature Christmas tree light system of claim 146 wherein said control circuit means includes a battery.

148. The miniature Christmas tree light system of claim 139 wherein each light-emitting diode is a bi-color LED and includes a first light-emitting diode portion for generating a first characteristic color and a second light-emitting diode portion for generating a second different and distinct characteristic color, said first and second light-emitting diode portions being cyclically switchable to generate an alternating first and second color signal for producing a third different and distinct characteristic color.

149. The miniature Christmas tree light system of claim 148 further including control circuit means for sequentially illuminating the first and second light-emitting diode portion to generate said first, second and third characteristic colors, said control circuit means for generating drive signals for illuminating said light-emitting diodes.

150. The miniature Christmas tree light system of claim 139 wherein each of said plurality of light-emitting diodes includes a generally cylindrical envelope having a longitudinal axis and a plurality of optical light-conducting balls operatively disposed within said envelope.

151. The miniature Christmas tree light system of claim 150 wherein each of said envelopes includes at least one of glass and plastic, each of said balls includes at least one of glass and plastic, each of said balls includes at least one of hollow and solid balls, each of said balls include at least one of balls having a single uniform diameter and balls having various diameters, and each of said envelope means including at least one of light-conducting epoxy, light-conducting liquid, and light-conducting gas operatively sealed therein.

152. The miniature Christmas tree light system of claim 151 wherein each of said light-emitting diodes includes a base and a pair of diode leads extending approximate said base and generally perpendicular to said longitudinal axis for stabilizing the envelope and enabling the bulb to stand upright when positioned on the Christmas tree limbs.

153. A light string system comprising:
a first and second electrical connector;
a plurality of light-emitting diodes electrically connected between said first and second electrical conductors, said plurality of diodes being operable for extremely long periods of time without burning out, requiring extremely low electrical power for operation, and generating substantially no heat for substantially eliminating fire hazards and the like; and
said light-emitting diodes includes a hollow envelope surrounding at least one illuminated portion of said light-emitting diode and a plurality of light-conducting spheres contained within the envelope for increasing the optical characteristics of the ball.

154. The light string system of claim 153 wherein alternate ones of said light-emitting diodes are connected in reverse polarity to the others of said plurality of light-emitting diodes on either side thereof for illuminating odd and even light-emitting diodes sequentially from one polarity to the reverse polarity.

155. The light string system of claim 153 wherein said envelope includes at least one of glass and plastic materials.

156. The light string system of claim 153 wherein said optical spheres include at least one of glass, plastic, and a mixture of glass and plastic spheres.

157. The light string system of claim 156 wherein said optical spheres include at least one of hollow, solid, or a mixture of hollow and solid spheres.

158. The light string system of claim 157 wherein said optical spheres include at least one of spheres having a substantially uniform diameter and spheres having mixed diameters, and a mixture thereof.

159. The light string system of claim 158 further including at least one of light-conducting epoxy means and light-conducting liquid operatively disposed within said envelope and sealed therein for enhancing the light-conducting and dispersion characteristics thereof.

160. The light string system of claim 157 wherein said optical spheres relatively large diameter balls having a substantially uniform size, the diameter of the balls being slightly less than the diameter of the envelope for substantially filling the envelope one sphere over the other.

161. The light string system of claim 153 wherein each of said light-emitting diodes includes a pair of electrical leads and a base operatively mounting said envelope, said pair of electrical leads being operatively disposed at least one of through said base and approximate to said base substantially perpendicular to the axis of the envelope for stabilizing the bulb and enabling it to stand upright when the light string is supported in a suspended manner or the like.

162. The light string system of claim 153 wherein said plurality of light-emitting diodes includes a first set of light-emitting diodes having a first different and distinct characteristic color, a second set of light-emitting diodes having a second different and distinct characteristic color, one of said first and second sets of light-emitting diodes alternating in position and polarity to the other as said light-emitting diodes are positioned and polarity reversed along said pair of electrical conductors.

163. The light string system of claim 97 wherein said means for supplying electrical power further includes control circuit means for generating a first and second switching signal for reversing the polarity of the incoming electrical current for sequentially illuminating alternate sets of the light-emitting diodes to produce at least first one characteristic color and then the second characteristic color in sequence.

164. The light string system of claim 154 further including a plurality of at least one of glass and plastic, substantially hollow shells and a plurality of at least one of glass and plastic fragments including at least one of similar crystalline properties and relatively similar geometric shapes.

165. The light string system of claim 154 wherein each of said plurality of light-emitting diodes are bi-color light-emitting diodes having a first light-emitting diode portion for generating a first different and distinct characteristic color and a second light-emitting diode portion for generating a second different and distinct characteristic color, said first and second light-emitting diode portions being operably connected and parallel with one another between said first and second electrical conductors such that each of said second light-emitting diode portions has its polarity reversed from each of said first light-emitting diode portions associated therewith.

166. The light string system of claim 165 wherein each of said light-emitting diodes includes an envelope means for enclosing said light-emitting diode and at least one of a plurality of optical light-conducting beads and fragments disposed within said envelope for enhancing the light-conducting and dispersion characteristics thereof.

167. The light string system of claim 166 wherein said envelope means includes at least one of glass and plastic materials.

168. The light string system of claim 167 wherein each of said at least one of beads and fragments includes at least one of glass, plastic, and a mixture of glass and plastic balls.

169. The light string system of claim 168 wherein each of said at least one of beads and fragments includes at least one of hollow, solid, and a mixture of hollow and solid balls.

170. The light string system of claim 169 wherein said balls include at least one of a plurality of spheres having substantially uniform diameter and a plurality of spheres having different diameters.

171. The light string system of claim 170 further including at least one of light-conducting epoxy means and light-conducting liquid means operably disposed within said envelope means and sealed therein for enhancing the light-conducting characteristics thereof.

172. The light string system of claim 168 wherein each of said optical spheres are relatively large diameter balls having diameters slightly less than the inside diameter of said envelope means for filling said envelope means one upon the other for enhanced light transmission characteristics.

173. The light string system of claim 165 wherein each of said plurality of light-emitting diodes includes a pair of electrical leads and a base means for operably mounting said light-emitting diode and said envelope means with said pair of electrical leads extending at least one of substantially through said base means and substantially adjacent said base means in opposite directions and substantially perpendicular to the axis of said envelope means for stabilizing the bulb and enable it to remain upright when the light string is suspended or the like.

174. The light string system of claim 165 wherein said means for supplying electrical power includes control circuit means for generating at least first and second switching signals for sequentially alternating and reversing the polarity of the incoming electrical current for sequentially illuminating alternate ones of the light-emitting diodes to produce said first, second and third different and distinct characteristic colors.

175. The light string system of claim 174 wherein said control circuit means includes means for providing stepped-down AC current to said pair of electrical conductors and utilizing the positive portion of the AC waveform for illuminating said first light-emitting diode portions and the negative portion of the AC waveform for illuminating the second light-emitting diode portion for producing said first and second different distinct characteristic colors, respectively.

176. The light string system of claim 175 wherein said control circuit means also includes means for generating a third switching signal for supplying alternating current to said light-emitting diodes for rapidly energizing first one and then the other of said light-emitting diode portions so as to sequentially generate said third different and distinct characteristic colors wherein the third characteristic color is produced by the visual effect of cycling the first and second colors more rapidly than the human eye can discern.

177. The light string system of claim 176 wherein said control circuit means includes timing means for generating a plurality of timing pulses for establishing the rate of change of the colors;
  counter means responsive to timing pulses for generating first, second, and third count state signals each having a first, second, and third time duration, respectively;
  polarity reversal means responsive to said count state signals for generating first, second and third switching signals and means responsive to a first switching signal for generating a first DC polarity signal for illuminating said first light-emitting diode portions to produce said first characteristic color, responsive to a second switching signal for energizing said second light-emitting diode portion to generate said second characteristic color, and for producing at least one of a rapidly oscillating and pulsed signal for rapidly and alternatively energizing said first and second light-emitting diode portions to produce the appearance of said third characteristic color; and
  drive means for providing sufficient current to said light-emitting diodes for providing substantially constant and sufficient illumination even in relatively long strings of light-emitting diodes.

178. The light string system of claim 177 wherein said control circuit means further includes variable duty cycle control means for generating first and second polarity signals at individually selectable signal durations to drive said light-emitting diodes with a significantly higher current than that for which the light-emitting diodes are rated for even relatively long periods of time due to reduced duty cycles and the like thereby enabling very long strings of lights to be illuminated using duty cycle control techniques.

179. The control circuit means of claim 174 wherein said light-emitting diodes are connected in relatively short strings and a DC battery is used to supply power thereto and means for applying the DC power to generate said characteristic colors.

180. A miniature light bulb apparatus for strings of Christmas tree lights, Christmas decorations, ornamental light strings, decorative lights and the like comprising:
  a light-emitting diode;
  a glass envelope means operably disposed about at least a portion of said light-emitting diode; and
  light-conducting glass particle means operably disposed within said envelope means for transmitting and diffusing the light emitted from said light-emitting diode.

181. The apparatus of claim 180 wherein said glass particles have a relatively uniform crystalline structure.

182. The apparatus of claim 180 wherein said glass particles have relatively uniform geometric shapes.

183. The apparatus of claim 180 further including a light-transmitting epoxy means operably disposed within said envelope means.

184. An improved miniature light bulb apparatus including a generally elongated envelope having a hollow interior with a longitudinal axis therethrough, at least one partially opened end, and a closed end, the improvement comprising:
  a plurality of light-conducting glass particles operably disposed within the hollow interior of said envelope for improving the light diffusion characteristics thereof and the visibility of the bulb to an external observer;
  an LED means operably disposed through the said least partially opened end of the envelope and into the hollow interior thereof;
  light-transmitting epoxy means operably disposed within said envelope means; and
  means for sealing the at least partially opened end of the envelope for retaining the glass particles and said LED means therein.

185. The apparatus of claim 184 wherein said glass particles are relatively small and disposed within said envelope means for coating the interior surface thereof.

186. The apparatus of claim 184 wherein said glass particles have a diameter greater than $1/50,000^{th}$ of an inch.

187. The apparatus of claim 184 wherein said glass particles have a relatively uniform geometric shape.

188. The apparatus of claim 184 wherein the glass particles include glass sand-blasting beads.

* * * * *